United States Patent
Jeon et al.

(10) Patent No.: US 10,158,047 B2
(45) Date of Patent: Dec. 18, 2018

(54) SEMICONDUCTOR LIGHT EMITTING DEVICE

(71) Applicant: SEMICON LIGHT CO., LTD., Gyeonggi-do (KR)

(72) Inventors: Soo Kun Jeon, Gyeonggi-do (KR); Jun Chun Park, Gyeonggi-do (KR); Il Gyun Choi, Gyeonggi-do (KR); Sung Gi Lee, Gyeonggi-do (KR); Dae Soo Soul, Gyeonggi-do (KR); Tea Jin Kim, Gyeonggi-do (KR); Yeon Ho Jeong, Gyeonggi-do (KR); Geun Mo Jin, Gyeonggi-do (KR); Sung Chan Lee, Gyeonggi-do (KR)

(73) Assignee: SEMICON LIGHT CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/563,273

(22) PCT Filed: Apr. 4, 2016

(86) PCT No.: PCT/KR2016/003475
§ 371 (c)(1),
(2) Date: Sep. 29, 2017

(87) PCT Pub. No.: WO2016/159744
PCT Pub. Date: Oct. 6, 2016

(65) Prior Publication Data
US 2018/0076362 A1 Mar. 15, 2018

(30) Foreign Application Priority Data

Apr. 3, 2015 (KR) .................. 10-2015-0047437
Apr. 8, 2015 (KR) .................. 10-2015-0049718
(Continued)

(51) Int. Cl.
*H01L 51/52* (2006.01)
*H01L 33/46* (2010.01)
(Continued)

(52) U.S. Cl.
CPC .............. *H01L 33/46* (2013.01); *H01L 33/10* (2013.01); *H01L 33/24* (2013.01); *H01L 33/325* (2013.01);
(Continued)

(58) Field of Classification Search
CPC ......... H01L 33/46; H01L 33/42; H01L 33/24; H01L 33/62; H01L 33/382; H01L 33/385;
(Continued)

(56) References Cited

U.S. PATENT DOCUMENTS 3,853,386 A * 12/1974 Ritter .................. C03C 17/3417
359/588
2011/0008918 A1 1/2011 Shum et al. .................... 438/22
(Continued)

FOREIGN PATENT DOCUMENTS

JP 2005-045038 2/2005
JP 2008-078432 4/2008
(Continued)

OTHER PUBLICATIONS

Encyclopedia Britannica, Brewster's Law, 1996, 1 page.*
(Continued)

*Primary Examiner* — Galina Yushina
(74) *Attorney, Agent, or Firm* — Harness, Dickey & Pierce, P.L.C.

(57) ABSTRACT

Disclosed is a semiconductor light emitting device including: a plurality of semiconductor layers; a first non-conductive reflective film formed on the plurality of semiconductor layer to reflect light from the active layer, wherein the first non-conductive reflective film includes multiple layers and
(Continued)

has a first incident angle as the Brewster angle; a second non-conductive reflective film formed on the first non-conductive reflective film to reflect light transmitted through the first non-conductive reflective film, wherein the second non-conductive reflective film includes multiple layers, with part of which being made of a different material from the first non-conductive reflective film, and has a second incident angle as the Brewster angle, different from the first incident angle; and an electrode electrically connected to one of the plurality of semiconductor layers.

5 Claims, 75 Drawing Sheets

(30) Foreign Application Priority Data

| | | | |
|---|---|---|---|
| Apr. 20, 2015 | (KR) | ......................... | 10-2015-0055423 |
| Apr. 23, 2015 | (KR) | ......................... | 10-2015-0057293 |
| Jun. 18, 2015 | (KR) | ......................... | 10-2015-0086786 |

(51) Int. Cl.

| | |
|---|---|
| *H01L 33/10* | (2010.01) |
| *H01L 33/36* | (2010.01) |
| *H01L 33/24* | (2010.01) |
| *H01L 33/32* | (2010.01) |
| *H01L 33/38* | (2010.01) |
| *H01L 33/42* | (2010.01) |
| *H01L 33/62* | (2010.01) |

(52) U.S. Cl.
CPC ............ *H01L 33/36* (2013.01); *H01L 33/382* (2013.01); *H01L 33/385* (2013.01); *H01L 33/387* (2013.01); *H01L 33/42* (2013.01); *H01L 33/62* (2013.01); *H01L 51/5262* (2013.01)

(58) Field of Classification Search
CPC ................. H01L 33/387; H01L 33/324; H01L 27/14629; H01L 51/5262; H01L 51/5285
See application file for complete search history.

(56) References Cited

U.S. PATENT DOCUMENTS

| | | | |
|---|---|---|---|
| 2011/0024782 A1 | 2/2011 | Shum et al. ..................... | 257/98 |
| 2011/0114969 A1 | 5/2011 | Lee et al. ......................... | 257/88 |
| 2011/0227110 A1 | 9/2011 | Kim et al. ...................... | 257/98 |
| 2012/0241724 A1* | 9/2012 | Tsang .................... | H01L 33/025 |
| | | | 257/28 |
| 2013/0161585 A1 | 6/2013 | Na et al. .......................... | 257/13 |
| 2014/0217439 A1* | 8/2014 | Jeon ......................... | H01L 33/46 |
| | | | 257/98 |
| 2015/0155426 A1 | 6/2015 | Jeon et al. .............. | H01L 33/00 |
| 2015/0236215 A1 | 8/2015 | Park et al. .............. | H01L 33/46 |
| 2016/0233384 A1 | 8/2016 | Na et al. ................ | H01L 33/382 |

FOREIGN PATENT DOCUMENTS

| | | | |
|---|---|---|---|
| KR | 10-2013-0074471 | 7/2013 | |
| KR | 10-2014-0031661 | 3/2014 | ............ H01L 33/36 |
| KR | 10-2014-0135005 | 11/2014 | ............ H01L 33/36 |
| KR | 10-2015-0062352 | 6/2015 | |

OTHER PUBLICATIONS

Wood, Refractive Index of cucic zirconia stabilized with yttria, Applied Optics, vol. 21, No. 16, 1982, pp. 2978-2981.*
International Search Report from corresponding International Application No. PCT/KR2016/003475 dated Jul. 13, 2016 and its English translation.

* cited by examiner

Prior Art

(a)

(b)

(a)

(b)

(a)

(b)

(a)

(b)

(a)

(b)

(a)

(b)

(a)

(b)

(a)

(b)

(a)

(b)

SEMICONDUCTOR LIGHT EMITTING DEVICE

CROSS-REFERENCE TO RELATED APPLICATIONS

This application is a National Phase application of PCT Application No. PCT/KR2016/003475 filed on Apr. 14, 2016 which claims priority to Korean Patent Application Nos. 10-2015-0047437 filed on Apr. 3, 2015, 10-2015-0049718 filed on Apr. 8, 2015, 10-2015-0055423 filed on Apr. 20, 2015, 10-2015-0057293 filed on Apr. 23, 2015 and 10-2015-0086786 filed on Jun. 18, 2015. The entire disclosures of the applications identified in this paragraph are incorporated herein by reference.

TECHNICAL FIELD

The present disclosure relates generally to a semiconductor light emitting device, and more particularly to a semiconductor light emitting device having reduced light loss and improved brightness.

In the context herein, the term "semiconductor light emitting device" is intended to indicate a semiconductor optoelectronic device which generates light by electron-hole recombination. One example thereof is Group III-nitride semiconductor light emitting devices, in which the Group III-nitride semiconductor is made of a compound containing $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

BACKGROUND ART

This section provides background information related to the present disclosure which is not necessarily prior art.

FIG. 1 illustrates one exemplary embodiment of the semiconductor light emitting device disclosed in U.S. Pat. No. 7,262,436. The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, with the electrodes serving as reflective films, and an n-side bonding pad 800 formed on the n-type semiconductor layer 300 which had been etched and exposed.

A chip having the above structure, i.e. a chip where all of the electrodes 901, 902 and 903, and the electrode 800 are formed on one side of the substrate 100, with the electrodes 901, 902 and 903 serving as reflective films, is called a flip chip. The electrodes 901, 902 and 903 are made up of an electrode 901 (e.g. Ag) having a high reflectance, an electrode 903 (e.g. Au) for bonding, and an electrode 902 (e.g. Ni) for preventing diffusion between the material of the electrode 901 and the material of the electrode 903. While the benefits of such a metal reflective film structure are a high reflectance and effectiveness for current spreading, a possible drawback thereof is light absorption by the metal.

FIG. 2 illustrates an exemplary embodiment of the semiconductor light emitting device disclosed in JP Laid-Open Pub. No. 2006-20913. The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, a p-side bonding pad 700 formed on the light transmitting conductive film 600, and an n-side bonding pad 800 formed on the n-type semiconductor layer 300 which had been etched and exposed. Further, a DBR (Distributed Bragg Reflector) 900 and a metal reflective film 904 are provided on the light transmitting conductive film 600. While this structure shows reduced light absorption by the metal reflective film 904, a possible drawback thereof is that current spreading is not smooth, as compared with the structure with the electrodes 901, 902 and 903.

FIG. 11 illustrates an exemplary embodiment of a conventional Group III-nitride semiconductor light emitting device. The Group III-nitride semiconductor light emitting device includes a substrate 10, a buffer layer 20 grown on the substrate 10, an n-type Group III-nitride semiconductor layer 30 grown on the buffer layer 20, an active layer 40 grown on the n-type Group III-nitride semiconductor layer 30, a p-type Group III-nitride semiconductor layer 50 grown on the active layer 40, a p-side electrode 60 formed on the p-type Group III-nitride semiconductor layer 50, a p-side electrode pad 70 formed on the p-side electrode 60, an n-side electrode 80 formed on an exposed portion of the n-type Group III-nitride semiconductor layer 30 created by mesa etching the p-type Group III-nitride semiconductor layer 50 and the active layer 40, and a protective film 90.

The substrate 10 may be a homogeneous substrate, such as a GaN-based substrate, or a heterogeneous substrate, such as a sapphire substrate, a SiC substrate or a Si substrate, but any type of the substrate is acceptable as long as a Group III nitride semiconductor layer can be grown thereon. When a SiC substrate is use, the n-side electrode 80 may be formed on the SiC substrate.

FIG. 12 illustrates an exemplary conventional method for mounting a semiconductor light emitting device on a frame 5, in which an adhesive 9 such as the Ag paste is used to bond the semiconductor light emitting device onto the frame 5. A part of the light generated by the active layer 40 is emitted directly through the light-transmitting p-side electrode 60, and another part of the light that had entered the substrate 10 is reflected from an Al layer 92 to be emitted through the lateral face of the light emitting device or the p-side electrode 60. Despite the high reflectance of the Al layer 92, a portion of the light is still absorbed by the Al layer. When the adhesive 9 used is a clear paste in the absence of the Al layer 92, the light transmits through the adhesive and is reflected from the frame 5. Again, the frame 92 can also absorb the light, resulting in a light loss, and the clear paste having a low thermal conductivity is not suitable for high-current operations. As the semiconductor light emitting device is usually a very thin compound semiconductor light emitting device and it slightly sticks out along the side of the substrate 10 while the light emitting device is being bonded to the frame 5 by means of an adhesive provided on the frame, a part of the light entering the substrate can be absorbed by the adhesive 9. Even when the adhesive 9 used is a clear paste, it still absorbs varying levels of light. Hence, an amount of the light emitting from the light emitting device is reduced, thereby lowering light extraction efficiency of the light emitting device.

FIG. 13 illustrates an exemplary conventional Group III-nitride semiconductor light emitting device 201, which includes lead frames 210, 220, a mold 230, an encapsulant 240, a Group III-nitride semiconductor light emitting device chip 250, and a Zener diode 260 for ESD protection. The Group III-nitride semiconductor light emitting device chip 250 is placed on the lead frame 210 and electrically connected to the lead frame 210 and the lead frame 280 by means of a wire 270 and a wire 280, respectively. The Zener diode 260 for ESD protection is placed on the lead frame 220, with it being electrically conductive therewith, and is also electrically connected to the lead frame 210 by means of a wire 290.

FIG. 14 illustrates an exemplary vertical light emitting device. Similar to one shown in FIG. 11, this vertical light emitting device includes an n-type Group-III nitride semiconductor layer 300, an active layer 400, a p-type Group-III nitride semiconductor layer 500, a p-side electrode 600 and a p-side bonding pad 700, in the order mentioned. A substrate 100 is removed once those three layers 300, 400 and 500 are grown, and an n-side electrode 800 is then formed on the other side of the n-side Group III-nitride semiconductor layer 300. The vertical light emitting device is configured to facilitate smoother current spreading, as compared with the light emitting device shown in FIG. 11.

FIG. 26 illustrates an exemplary process of manufacturing a semiconductor light emitting device. In a packaging process, semiconductor light emitting chips 101 are die-bonded onto a lead frame with a die bonder. Subsequently, processes including wire-bonding, phosphor encapsulation, property testing, trimming, taping and the like are carried out to obtain a semiconductor light emitting device package. In this process, a sorter 501 is used, as shown in FIG. 26a, to hold and carry a semiconductor light emitting chip 101 onto a tape 13 by electrical suction or vacuum suction. At this time, an ejection needle 802 strikes the semiconductor light emitting chip 101 to facilitate the release of the semiconductor light emitting chip 101 from the tape 13. The ejection needle 802 as shown in FIG. 26b has a diameter of 50 μm to 80 μm, but it may vary depending on a desired form or area of the semiconductor light emitting chip. The ejection needle 802 sometimes collides with a microscale structure like a finger electrode for current spreading, which may be present in the semiconductor light emitting chip 101, and causes possible defects such as a crack or short in the finger electrode.

FIG. 38 illustrates an exemplary conventional Group III-nitride semiconductor light emitting device. The Group III-nitride semiconductor light emitting device includes a substrate 10 (e.g. sapphire substrate), a buffer layer 20 grown on the substrate 10, an n-type Group III-nitride semiconductor layer 30 grown on the buffer layer 20, an active layer 40 grown on the n-type Group III-nitride semiconductor layer 30, a p-type Group III-nitride semiconductor layer 50 grown on the active layer, a current spreading conductive film 60 formed on the p-type Group III-nitride semiconductor layer 50, a p-side bonding pad 70 formed on the current spreading conductive film 60, an n-side bonding pad 80 formed on an exposed portion of the n-type Group III-nitride semiconductor layer 30 created by mesa etching the p-type Group III-nitride semiconductor layer 50 and the active layer 40, and a protective film 90.

DISCLOSURE

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a semiconductor light emitting device including: a plurality of semiconductor layers, which includes a first semiconductor layer having a first conductivity type, a second semiconductor layer having a second conductivity type different from the first conductivity type, and an active layer interpositioned between the first and second semiconductor layers and adapted to generate light by electron-hole recombination; a first non-conductive reflective film provided on the plurality of semiconductor layer to reflect light from the active layer, wherein the first non-conductive reflective film includes multiple layers and has a first incident angle as the Brewster angle; a second non-conductive reflective film formed on the first non-conductive reflective film to reflect light transmitted through the first non-conductive reflective film, wherein the second non-conductive reflective film includes multiple layers, with part of which being made of a different material from the first non-conductive reflective film, and has a second incident angle as the Brewster angle, different from the first incident angle; and an electrode electrically connected to one of the plurality of semiconductor layers.

According to another aspect of the present disclosure, there is provided a semiconductor light emitting device including: a base; a plurality of semiconductor layers arranged on the base, wherein the plurality of semiconductor layers includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; an electrode electrically connected to one of the plurality of semiconductor layers for supplying electrons or holes to the semiconductor layers; a first non-conductive reflective film provided between the base and the plurality of semiconductor layers and adapted to reflect light from the active layer, wherein the first non-conductive reflective film has multiple layers; and a second non-conductive reflective film provided between the base and the first non-conductive reflective film and adapted to reflect light having passed through the first non-conductive reflective film, wherein the second non-conductive reflective film has multiple layers, with part of which being made of a different material from the first non-conductive reflective film.

According to another aspect of the present disclosure, there is provided a semiconductor light emitting device subjected to a strike from an ejection needle during handling, characterized by comprising: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; a first electrode, which is electrically connected to the first semiconductor layer and supplies electrons or holes to the first semiconductor layer; a second electrode, which is electrically connected to the second semiconductor layer and supplies, to the second semiconductor layer, holes if the first electrode supplied electrons, or electrons if the first electrode supplied holes; and an extendable electrode being stretched above the plurality of semiconductor layers and electrically connected to the second electrode, wherein the extendable electrode is designed to bypass to avoid an impact area subjected to a strike from the ejection needle.

According to another aspect of the present disclosure, there is provided a semiconductor light emitting device including: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; an external electrode, which is adapted to be in electrical communication with one of the first and second semiconductor layers and has an opening through which the plurality of semiconductor layers is exposed, thereby forming a closed loop; an internal electrode, which is formed inside the opening and adapted to be in electrical communication with the other of the first and second semiconductor layers; an insulating layer adapted to cover the external electrode and the internal electrode; a first electrode, which is provided on the insulating layer and supplies electrons to the first semiconductor layer through one of the external and internal electrodes; and a second electrode, which is provided on the insulating layer and supplies holes to the second semiconductor layer through the other of the external and internal electrodes, wherein at least one of the external and internal electrodes is a reflective electrode to reflect light from the active layer.

According to another aspect of the present disclosure, there is provided a semiconductor light emitting device adapted to be bonded to an external electrode and inspected by a probe, the semiconductor light emitting device including: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; and an electrode adapted to supply electrons or holes to the plurality of semiconductor layers, wherein the electrode includes a bonding layer to be bonded to the external electrode, and a probe inspection layer with at least a portion thereof being exposed from the bonding layer as seen in a top view.

Advantageous Effects

The advantageous effects of the present disclosure will be described in the latter part of the best mode for carrying out the invention.

MODE FOR CARRYING OUT INVENTION

Hereinafter, the present disclosure will now be described in detail with reference to the accompanying drawings. The following description is presented for purposes of illustration only and not of limitation as the scope of the invention is defined by the appended claims. For example, the steps mentioned in any of the method or process may be executed in any order and are not necessarily limited to the order provided. Also, any reference to singular includes plural embodiments, and vice versa.

Figure 1:
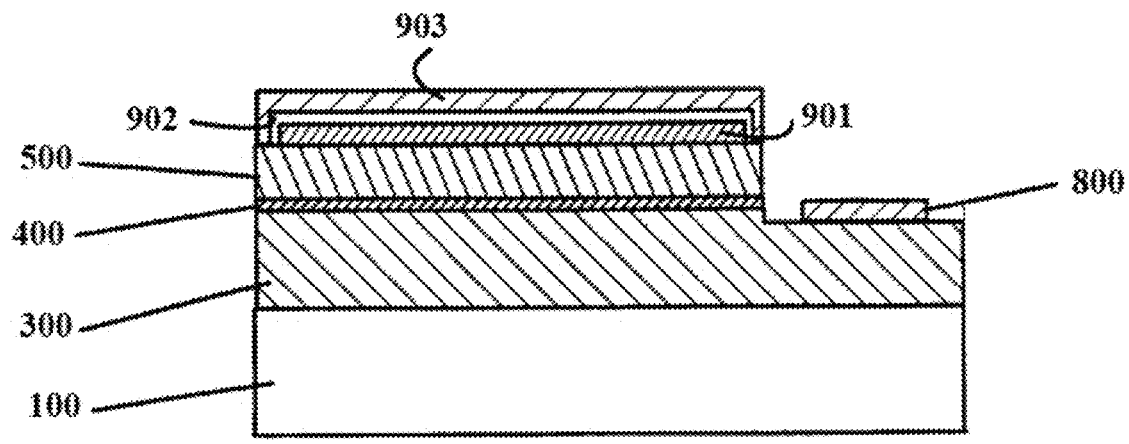
FIG. 1 illustrates an exemplary embodiment of the semiconductor light emitting device disclosed in U.S. Pat. No. 7,262,436.
Figure 2:
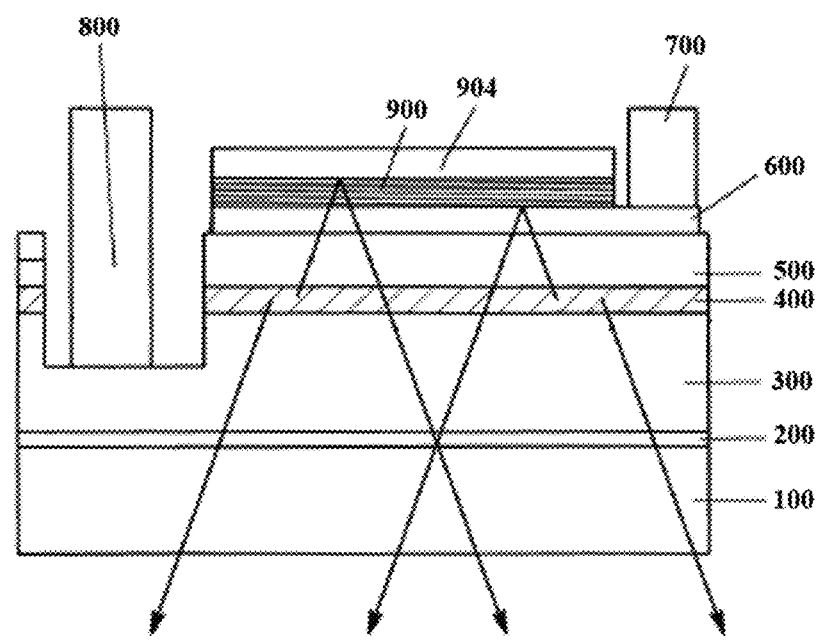
FIG. 2 illustrates an exemplary embodiment of the semiconductor light emitting device proposed in JP Laid-Open Pub. No. 2006-20913.
Figure 3:
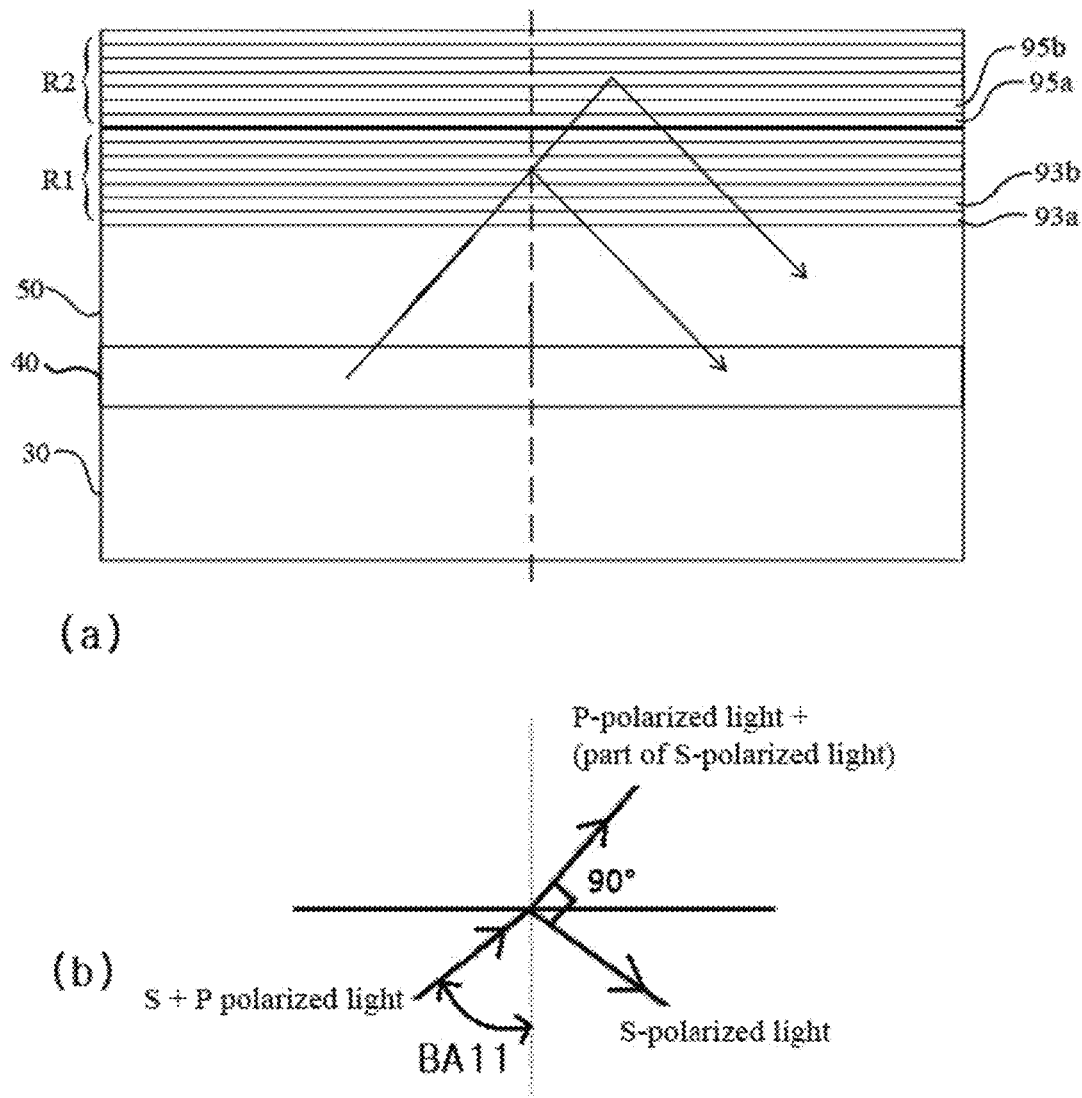
FIG. 3 is a schematic view for describing an exemplary embodiment of a semiconductor light emitting device according to the present disclosure.

FIG. 3 is a schematic view for describing an exemplary embodiment of a semiconductor light emitting device according to the present disclosure. Referring to FIG. 3a, the semiconductor light emitting device includes a plurality of semiconductor layers 30, 40, 50, a first non-conductive reflective film R1, a second non-conductive reflective film R2, and at least one electrode (not shown). The plurality of semiconductor layers 30, 40, 50 includes a first semiconductor layer 30 having a first conductivity type, a second semiconductor layer 50 having a second conductivity type different from the first conductivity type, and an active layer 40 interpositioned between the first and second semiconductor layers 30, 50 and adapted to generate light by electron-hole recombination. The first non-conductive reflective film R1 is formed on the plurality of semiconductor layers 30, 40, 50 and reflects light from the active layer 40. The first non-conductive reflective film R1 has multiple layers 93a, 93b, and a first incident angle A1 (see FIG. 4) on the first non-conductive reflective film R1 corresponds to a Brewster angle. The second non-conductive reflective film R2 formed on the first non-conductive reflective film R1 reflects light that has transmitted through the first non-conductive reflective film R1. The second non-conductive reflective film R2 has multiple layers 95a, 95b, with part of the layers being made of a different material from the first non-conductive reflective film R1, and a second incident angle A2 (see FIG. 5) on the second non-conductive reflective film R2 corresponds to a Brewster angle. An electrode is electrically connected to one of the plurality of semiconductor layers 30, 40, 50 to supply current thereto. The Brewster angle will be described later.

Reflectance of the first non-conductive reflective film R1 is lower at the first incident angle A1 (Brewster angle of the first non-conductive reflective film). Hence, the second non-conductive reflective film R2 is designed such that it shows a higher reflectance towards the light that had been incident on the first non-conductive reflective film R1 at the first incident angle A1 and transmitted therethrough. In this way, light leakage is reduced and brightness of the semiconductor light emitting device is thus improved.

The semiconductor light emitting device in this exemplary embodiment is a flip chip configured to reduce an amount of light loss by employing those non-conductive reflective films R1, R2 in place of a metallic reflective film that absorbs light. The non-conductive reflective films R1, R2 each have a multilayered structure (93a, 93b, 95a, 95b), preferably including a DBR (Distributed Bragg Reflector), an ODR (Omni-Directional Reflector) or the like. The DBR shows a higher reflectance (e.g. approximately 99% or more) towards light incident at angles near the normal direction. Nevertheless, a portion of the light can still transmit through the DBR. Therefore, an amount of light transmitting through the non-conductive reflective film R1, R2 should be reduced to increase light extraction efficiency of the semiconductor light emitting device.

Referring to FIG. 3b, for example, when light is incident at a certain angle on the plane of the interface of two media, only light with a particular polarization component is reflected while light with other polarization components is perfectly transmitted, with no reflection. This specific angle of incidence is called the Brewster angle BA11. Suppose that there are vertically polarized light (S-polarized light) and horizontally polarized light (P-polarized light) as in FIG. 3b. When the vertically polarized light and the horizontally polarized light encounter an interface at the Brewster angle, there is always a special angle where a reflected wave (TE wave; S-polarized light) and a transmitted wave (TM wave; P-polarized light+part of the S-polarized light) are apart 90 degrees, and the vertically polarized light is almost all reflected while the horizontally polarized light is mostly transmitted with nearly no reflection. This angle of incidence where the refractive index of a horizontal polarization component is 0 is called the Brewster angle. The Brewster angle varies by physical properties of media. When unpolarized light (e.g. light from the active layer) encounters the first non-conductive reflective film R1 at the Brewster angle, the vertical polarization component is mostly reflected and the horizontal polarization component is perfectly transmitted.

Figure 4:
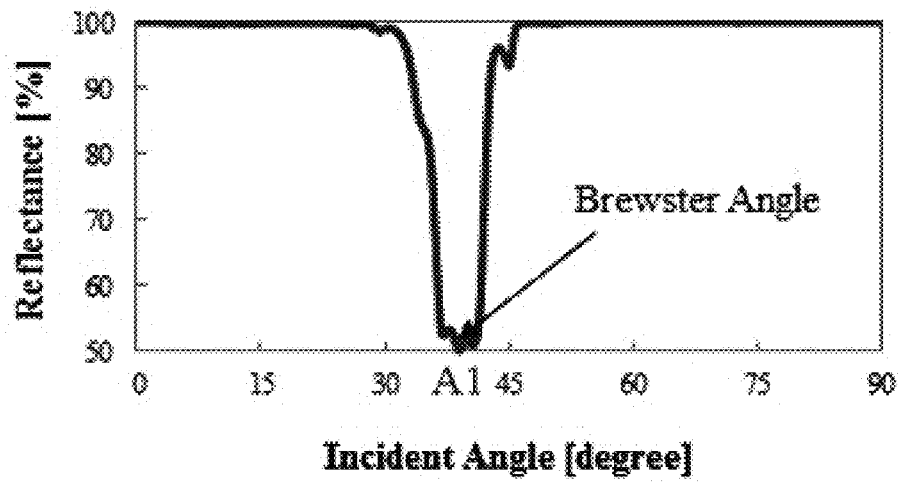
FIG. 4 is a schematic view for describing an exemplary first non-conductive reflective film.
Figure 4:
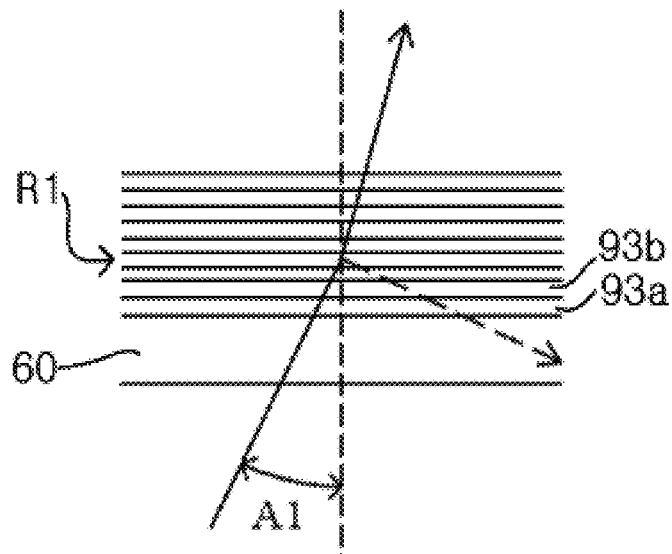

FIG. 4 is a schematic view for describing an exemplary, first non-conductive reflective film, in which the first non-conductive reflective film R1 is a DBR having multiple layers 93a, 93b. For example, as shown in FIG. 4b, the multiple layers 93a, 93b of the first non-conductive reflective film R1 are composed of a stack of first material layer 93a/second material layer 93b pairs. The first material layer 93a and the second material layer 93b may be made of different materials selected from $SiO_x$, $TiO_x$, $Ta_2O_5$, and $MgF_2$, respectively. Alternately, the first and second material layers may be made of other materials, and the first non-conductive reflective film R1 may have at least three different kinds of multiple layers. For instance, the first non-conductive reflective film R1 may include a stack of 25 or 26 pairs of first material layer 93a/second material layer 93b, such as $SiO_2/TiO_2$, with each of $SiO_2$ and $TiO_2$ being at a thickness of tens of nanometers. In this case, as shown in FIG. 4b, when light is incident on the first non-conductive reflective film R1 through a light transmitting conductive film 60 (e.g. ITO), the Brewster angle A1 is about 38 degrees, and the first non-conductive reflective film R1 shows a maximum reflectance of 50% at this Brewster angle. FIG. 4a shows incidence angle and reflectance at the stack of the ITO 60 and the first non-conductive reflective film R1. In particular, reflectance in the graph of FIG. 4a represents a mean-pol of reflectances of the vertically and horizontally polarized lights described above.

Figure 5:
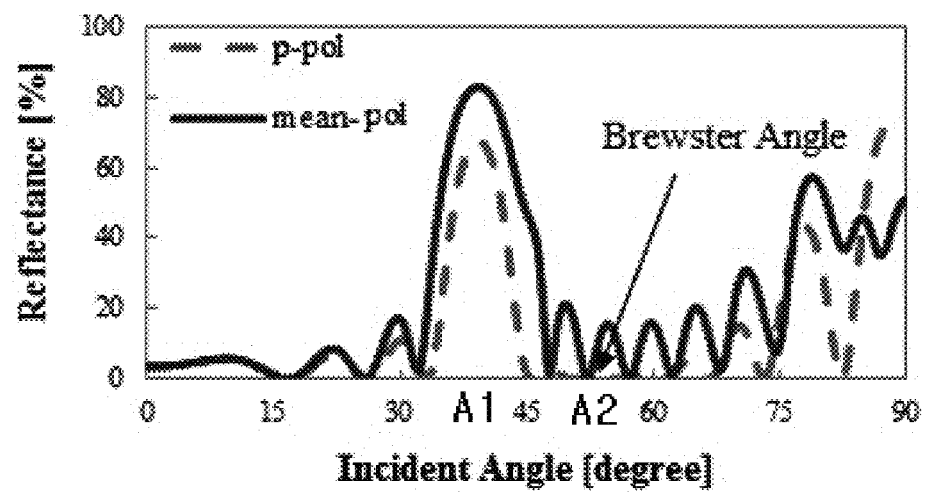
FIG. 5 is a schematic view for describing an exemplary second non-conductive reflective film.
Figure 5:
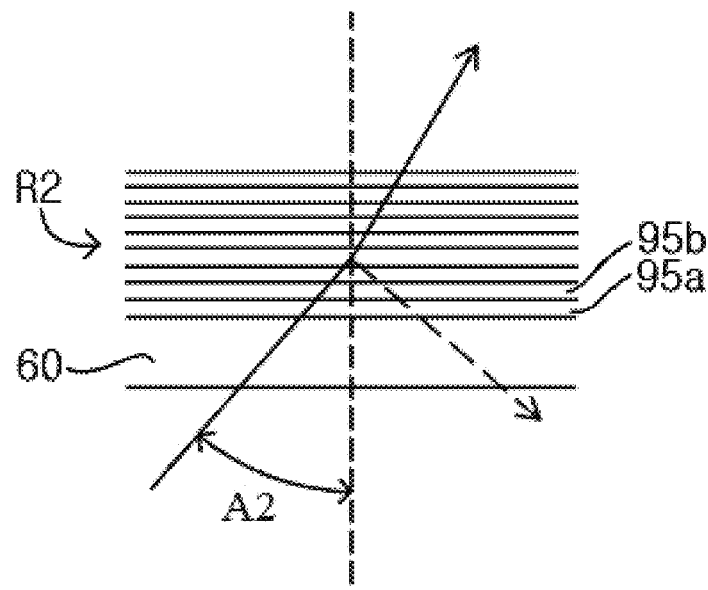

FIG. 5 is a schematic view for describing an exemplary, second non-conductive reflective film R2, in which the second non-conductive reflective film R2 is a DBR having multiple layers 95a, 95b, a part of which is made of a different material from the first non-conductive reflective film R1. Moreover, the second non-conductive reflective film R2 is designed to have a high reflectance at the Brewster angle A1 of the first non-conductive reflective film R1. For example, as shown in FIG. 5b, the multiple layers 95a, 95b of the second non-conductive reflective film R2 include a stack of third material layer 95a/fourth material layer 95b pairs. At least one of the third material layer 95a and fourth material layer 95b is made of a different material from the first material layer 93a and from the second material layer 93b. For example, the third material layer 95a and the fourth material layer 95b may be made of different materials selected from $SiO_x$, $TiO_x$, $Ta_2O_5$, and $MgF_2$, respectively. Alternately, the third and fourth material layers may be made of other materials, and the second non-conductive reflective film R2 may have at least three different kinds of multiple layers. For instance, the second non-conductive reflective film R2 may include a stack of approximately 20 pairs of third material layer 95a/fourth material layer 95b, such as $TiO_2/Ta_2O_5$, with each of $TiO_2$ and $Ta_2O_5$ being at a thickness of tens of nanometers. In this case, as shown in FIG. 5b, when light is incident on the second non-conductive reflective film R2 through a light transmitting conductive film 60 (e.g. ITO), the Brewster angle A1 is about 52 degrees, and reflectance of the second non-conductive reflective film R2 is higher at the Brewster angle (e.g. about 38 degrees) of the first non-conductive reflective film R1. In this exemplary embodiment, the second non-conductive reflective film R2 is designed to have a high reflectance only within a certain range of angles including the Brewster angle of the first non-conductive reflective film R1, and it is not of particularly great significance for the second non-conductive reflective film R2 to have a lower reflectance in other angles. FIG. 5a shows incidence angle and reflectance at the stack of the ITO 60 and the second non-conductive reflective film R2.

Figure 6:
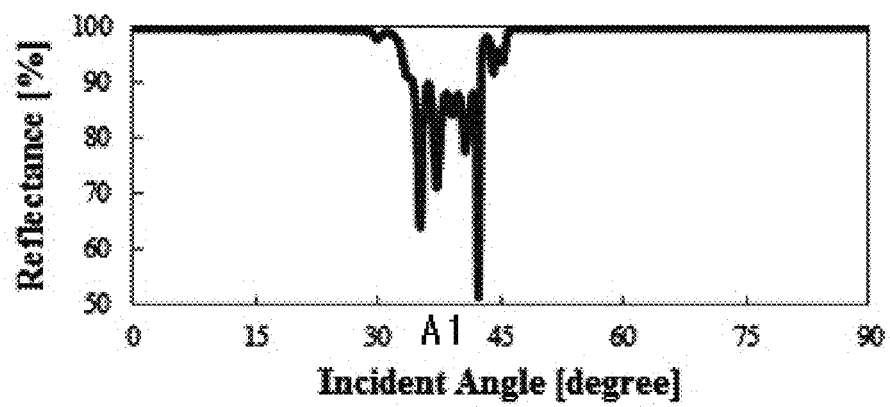
FIG. 6 is a schematic view for describing another exemplary embodiment of a semiconductor light emitting device according to the present disclosure.
Figure 6:
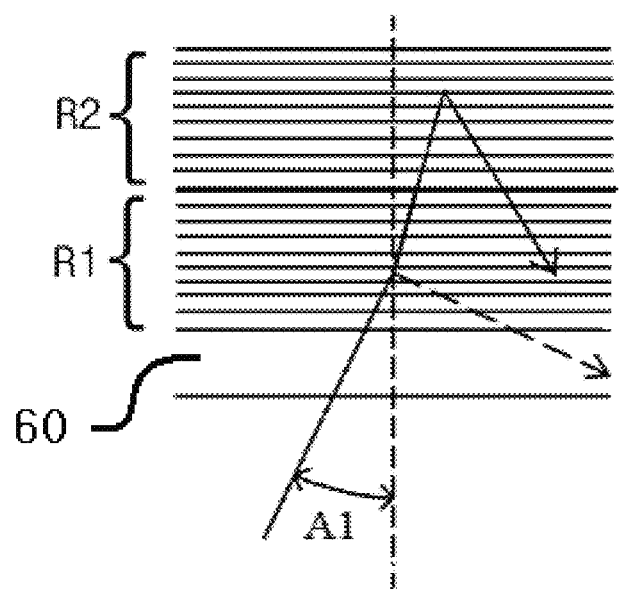

FIG. 6 is a schematic view for describing another exemplary embodiment of a semiconductor light emitting device according to the present disclosure. Referring to FIG. 6b, a light transmitting conductive film 60 is formed on a plurality of semiconductor layers (not shown), a first non-conductive reflective film R1 is formed on the light transmitting conductive film 60, and a second non-conductive reflective film R2 is formed on the first non-conductive reflective film R1. The first non-conductive reflective film R1 may be the same as the one illustrated in FIG. 4, and the second non-conductive reflective film R2 may be the same as the one illustrated in FIG. 5.

Figure 7:
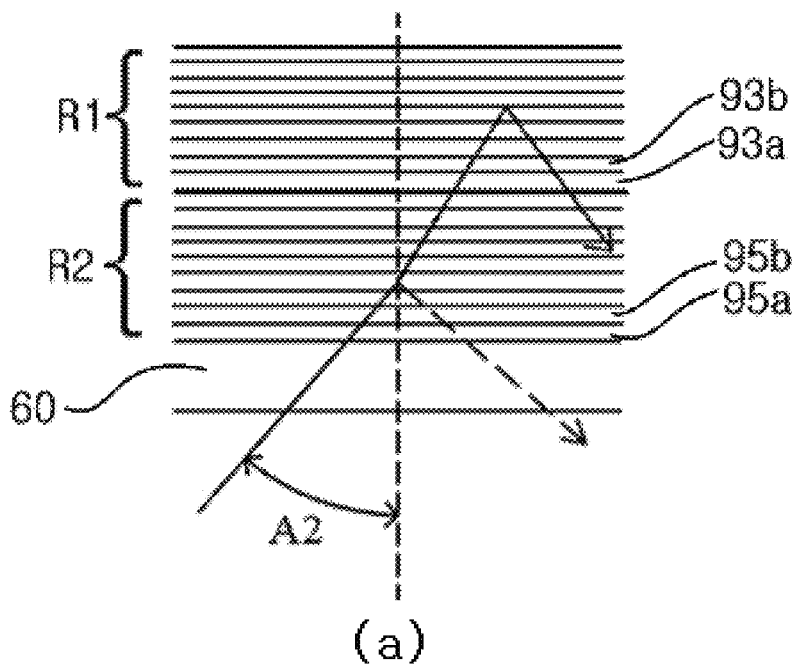
FIG. 7a is a schematic view for describing another exemplary non-conductive reflective film.
Figure 7:
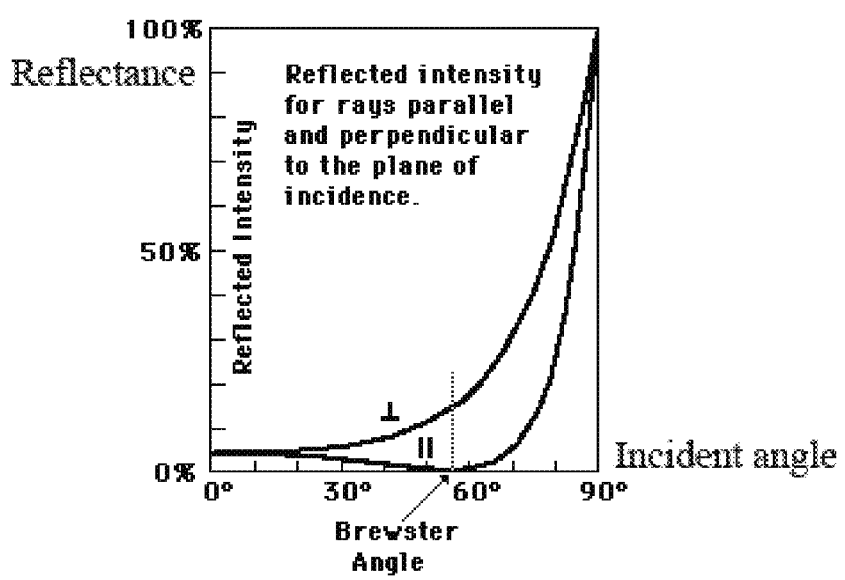

Once light transmits through the first non-conductive reflective film R1, it is reflected by the second non-conductive reflective film R2. Referring to FIG. 7b, vertically polarized light of a greater incident angle is reflected more. Meanwhile, horizontally polarized light is reflected much less at a region of a smaller incident angle, and is not reflected at the Brewster angle, i.e. the reflectance is 0. If an incident angle is equal to or greater than the Brewster angle, significantly more of the horizontally polarized light will be reflected. In this exemplary embodiment, in order to improve an overall reflectance of the non-conductive reflective films of the semiconductor light emitting device, the second non-conductive reflective film R2 is designed to have a high reflectance at the Brewster angle where the first non-conductive reflective film R1 has a lower reflectance.

FIG. 6a illustrates a total reflectance of the first and second non-conductive reflective films R1, R2, in which the first non-conductive reflective film R has a relatively lower reflectance at the first incident angle A1 (Brewster angle of the first non-conductive reflective film). Thus, when light transmits through the ITO 60 and enters the first non-conductive reflective film R1 at the first incident angle A1, the resulting transmitted light is relatively large. This transmitted light then enters the second non-conductive reflective film R2. Since the second non-conductive reflective film R2 has a higher reflectance at the first incident angle A1, it reflects the light transmitted through the first non-conductive reflective film R1 well. In this way, overall light leakage through the non-conductive reflective films R1, R2 is reduced and brightness of the semiconductor light emitting device is thus improved.

FIG. 7a is a schematic view for describing another exemplary non-conductive reflective film. Here, a light transmitting conductive film 60, a second non-conductive reflective film R2 and a first non-conductive reflective film R1 are stacked in the order mentioned. The non-conductive reflective film R1 has a high reflectance at almost all angles, and the second non-conductive reflective film R2 has a higher reflectance at the Brewster angle A1 of the first non-conductive reflective film R1. Accordingly, an overall reflectance is improved as compared with the case where only one of the first and second non-conductive reflective films R1, R2 is used.

Figure 8:
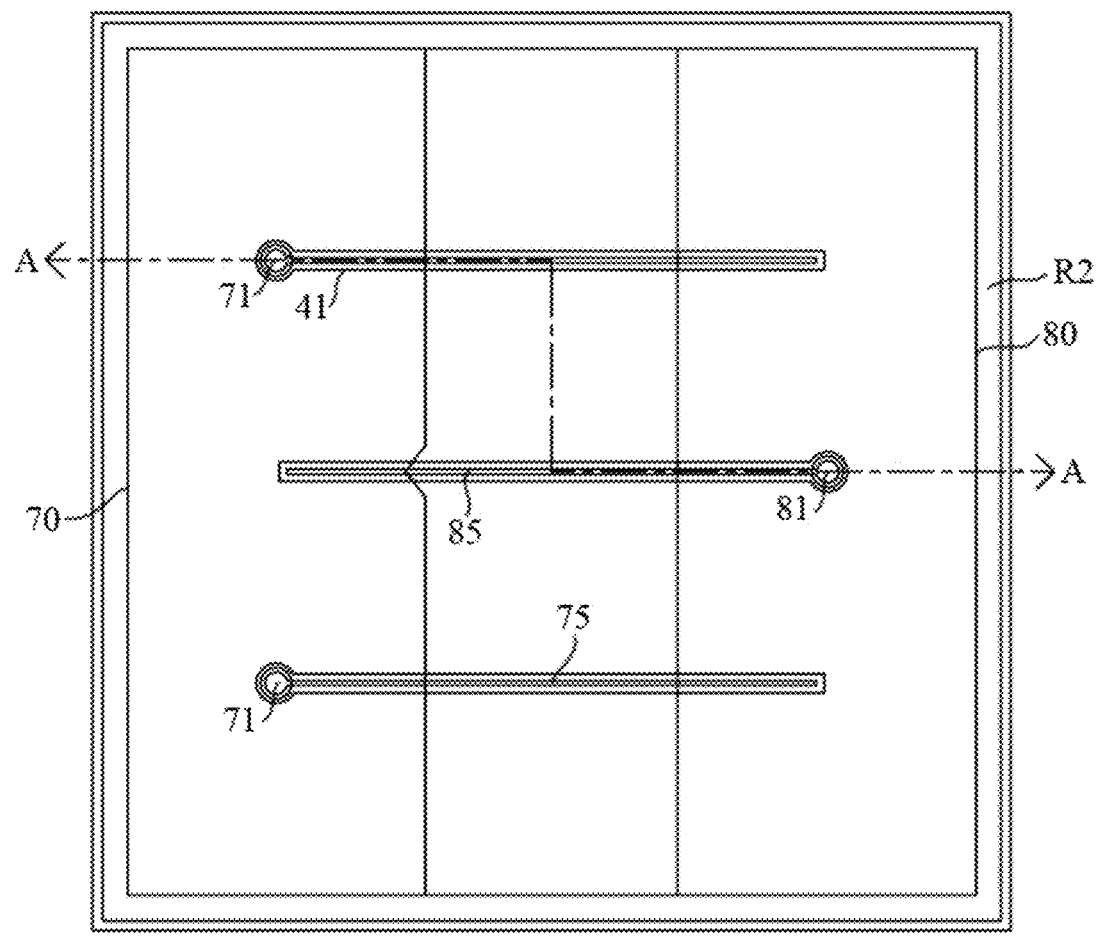
FIG. 8 is a schematic view for describing another exemplary embodiment of a semiconductor light emitting device according to the present disclosure.
Figure 9:
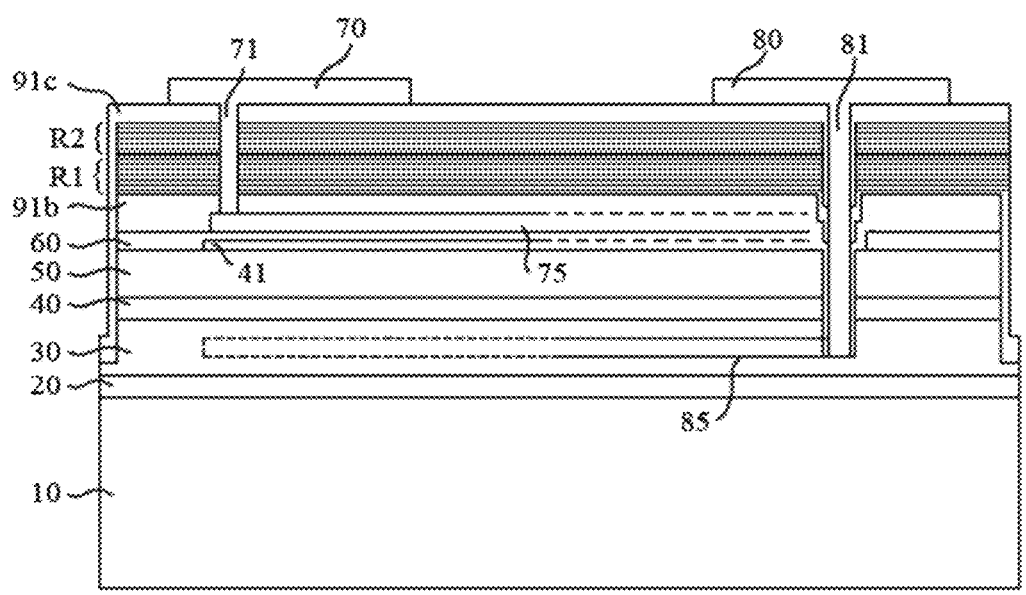
FIG. 9 illustrates a cross-sectional view taken along line A-A in FIG. 8.

FIG. 8 illustrates another exemplary embodiment of a semiconductor light emitting device according to the present disclosure, and FIG. 9 illustrates a cross-sectional view taken along A-A line in FIG. 8. The semiconductor light emitting device includes a substrate 10, a plurality of semiconductor layers 30, 40, 50, a light absorption barrier 41, a light transmitting conductive film 60, a dielectric film 91b, a first non-conductive reflective film R1, a second non-conductive reflective film R2, a clad layer 91c, a first electrode 80, a second electrode 70, a first electrical connection 81, a second electrical connection 71, a first finger electrode 85, and a second finger electrode 75. The dielectric film 91b and the clad layer 91c may be omitted. In addition, the first finger electrode 85 and the second finger electrode 75 may be omitted.

The following will describe a Group III-nitride semiconductor light emitting device as an example.

The substrate 10, which may eventually be removed, is typically made of sapphire, SiC, Si, GaN or the like. The first semiconductor layer 30 and the second semiconductor layer 50 can exchange their positions each other, and these semiconductor layers are typically made of GaN in the case of Group III-nitride semiconductor light emitting devices.

The plurality of semiconductor layers 30, 40, 50 includes a buffer layer 20 a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer 20 may optionally be omitted.

The light absorption barrier 41 is formed on the second semiconductor layer 50, in correspondence to the second finger electrode 75. It may only serve to reflect a portion or all of the light generated from the active layer 40, or to prevent the current from flowing down directly from the second finger electrode 75, or both. The light absorption barrier 41 may be omitted.

It is preferable that the light transmitting conductive film 60 is present. The light transmitting conductive film 60 is formed between the light absorption barrier 41 and the second finger electrode 75 in such a way that it substantially covers the entire or only a part of the second semiconductor layer 50. Particularly, considering that a p-type GaN has a poor current spreading capability, a p-type semiconductor layer 50 made of GaN usually needs to be aided by the light transmitting conductive film 60. For example, a material such as ITO, Ni/Au or the like can be used for the light transmitting conductive film 60.

The first finger electrode 85 is formed on an exposed portion of the first semiconductor layer 30, which is obtained by etching the second semiconductor layer 50 and the active layer 40. The second finger electrode 75 is formed on the light transmitting conductive film 60.

During the fabrication of a semiconductor light emitting device according to this embodiment, step coverage is created due to a structure like the finger electrode 75, 85. In this exemplary embodiment, the first non-conductive reflective film R1 and the second non-conductive reflective film R2 each have a DBR. As the deposition of the DBR needs to be done with high precision, the dielectric film 91b having a uniform thickness may be formed before the deposition such that the DBR can be prepared in a stable manner, and light reflection can also benefit therefrom.

Preferably, the dielectric film 91b is made of a suitable material like $SiO_2$, and has a thickness of 0.2 to 1.0 μm. If the dielectric film 91b is too thin, it may not be able to sufficiently cover the finger electrodes 75, 85 which have a height of 2 to 3 μm; while if the dielectric film 91b is too thick, it may make it difficult to form an opening therein. In addition, the dielectric film 91b needs to be formed with a suitable method for ensuring the reliability of the device. For example, the dielectric film 91b made of $SiO_2$ is preferably formed by CVD (Chemical Vapor Deposition), and more particularly by PECVD (Plasma Enhanced CVD). This is because CVD is more advantageous than PVD (Physical Vapor Deposition) such as E-Beam evaporation, in terms of achieving improved step coverage. More specifically, if the dielectric film 91b is formed by E-Beam evaporation, it is difficult to form the dielectric film 91b in the intended thickness in a region having the step coverage, the reflectance may be lowered, and the electrical insulation may be deteriorated. As such, the dielectric film 91b is preferably formed by CVD for reducing the step coverage and ensuring the insulation effect. In this way, it is possible to secure the reliability of the resulting semiconductor light emitting device and the functions of the dielectric film as a reflective film.

The first non-conductive reflective film R1 and the second non-conductive reflective film R2 reflect the light from the active layer 40 towards the plurality of semiconductor layers 30, 40, 50. In this embodiment, the first non-conductive reflective film R1 and the second non-conductive reflective film R2 are made of a non-conductive material for reducing light absorption by a metallic reflective layer. For example, they can be formed of a dielectric material such as $SiO_x$, $TiO_x$, $Ta_2O_5$, or $MgF_2$.

Figure 10:
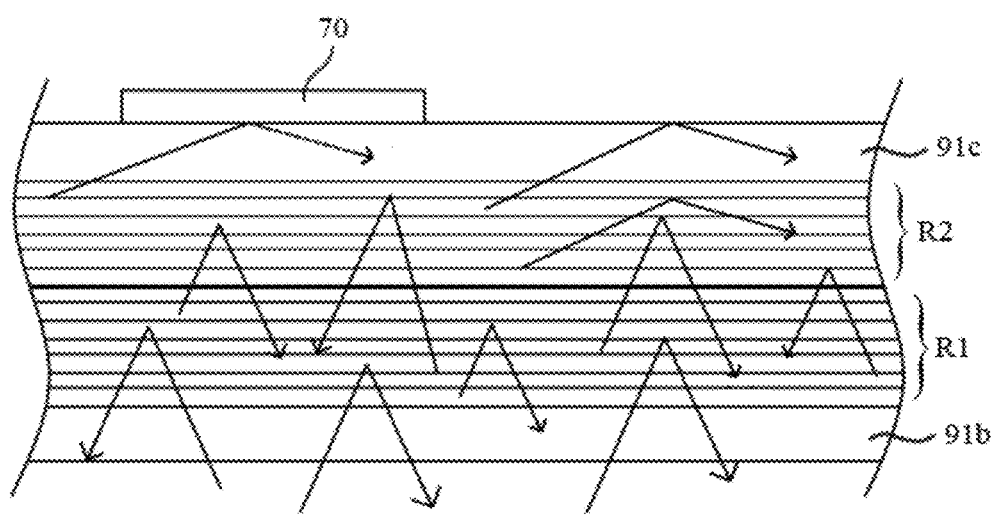
FIG. 10 is a schematic view for describing the non-conductive reflective film in FIG. 9.
Figure 11:
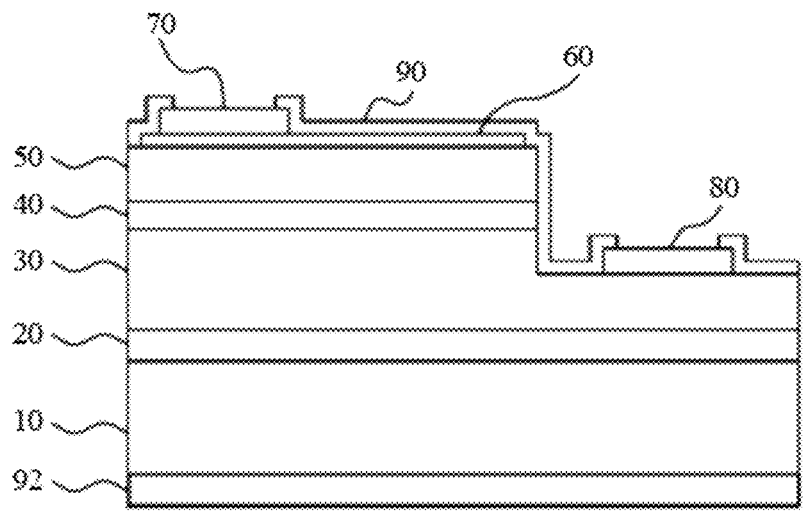
FIG. 11 illustrates an exemplary conventional Group III-nitride semiconductor light emitting device.

FIG. 10 is a schematic view for describing an example of the non-conductive reflective film in FIG. 9, in which the first non-conductive reflective film R1 is formed on the dielectric film 91b. When the first non-conductive reflective layer R1 is made of $SiO_x$, it has a lower refractive index than the p-type semiconductor layer 50 (e.g. GaN) such that the light incident at a greater angle than the critical angle will partly be reflected towards the plurality of semiconductor layers 30, 40, 50. On the other hand, when the first non-conductive reflective film R1 is made up of a DBR (Distributed Bragg Reflector) (e.g. DBR using a combination of $SiO_2$ and $TiO_2$), a greater amount of incident light will be reflected towards the plurality of semiconductor layers 30, 40, 50.

In this exemplary embodiment, the first non-conductive reflective film R1 may be composed of a stack of alternating first material layer 93a/second material layer 93b pairs. For example, it can be made up of a combination of a higher refractive index material (the second material layer 93b) such as $Ta_2O_5$, HfO, ZrO, SiN or the like and a lower refractive index dielectric thin film (the first material layer 93a; typically, $SiO_2$). In one example, the first non-conductive reflective film R1 may be composed of a stack of alternating $SiO_2/TiO_2$, $SiO_2/Ta_2O_2$, or $SiO_2/HfO$ pairs, in which the $SiO_2/TiO_2$ demonstrates a high blue-light reflection efficiency, while $SiO_2/Ta_2O_2$ or $SiO_2/HfO$ demonstrates a high UV-ray reflection efficiency. If the first non-conductive reflective film R1 is composed of $SiO_2/TiO_2$, it should preferably undergo an optimization process in consideration of an angle of incidence as well as wavelength-dependent reflectivity, using a ¼ optical thickness of the wavelength of the light emitted from the active layer 40 as a reference, yet it is not absolutely required that each layer should have a ¼ optical thickness of the wavelength. The number of combination pairs in the stack is suitably between 4 and 40 pairs. If the first on-conductive reflective film R1 is composed of a stack of alternating $SiO_2/TiO_2$ pairs, the first non-conductive reflective film R1 is preferably formed by PVD (Physical Vapor Deposition), and more particularly, E-Beam evaporation, sputtering or thermal evaporation.

The second non-conductive reflective film R2 is formed on the first non-conductive reflective film R1. The second non-conductive reflective film R2 may be composed of a stack of alternating third material layer 95a/fourth material layer 95b pairs. At least one of the third and fourth material layers 95a, 95b is selected from those different from the material of the first non-conductive reflective film R1. For example, the second non-conductive reflective film R2 can be made of a combination of $TiO_2$, $Ta_2O_5$, HfO, ZrO and SiN. When the first non-conductive reflective film R1 is composed of $SiO_2/TiO_2$, for example, the second non-conductive reflective film R2 may be composed of a stack of alternating $TiO_2/Ta_2O_5$ pairs. The first and second non-conductive reflective films R1, R2 described in FIG. 4 and FIG. 5, respectively, may be used for the first and second non-conductive reflective layers R1, R2 in this embodiment. While the first non-conductive reflective film R1 has a relatively lower reflectance at the Brewster angle, the second non-conductive reflective film R2 is designed to have a higher reflectance at the Brewster angle of the first non-conductive reflective film R1. Accordingly, an overall reflectance of the first and second non-conductive reflective films R1, R2 is improved. Alternatively, the light transmitting conductive film 60, the second non-conductive reflective film R2 and the first non-conductive reflective film R1 may be stacked in the order mentioned.

The clad layer 91c is formed on the second non-conductive reflective film R2. The clad layer 91c may be made of a metal oxide such as $Al_2O_3$, a dielectric material such as $SiO_2$ or SiON, or other materials such as MaF or CaF. Preferably, the clad layer 91c has a thickness ranging from λ/4n to 3.0 μm, in which λ denotes a wavelength of the light generated from the active layer 40, and n denotes a refractive index of a material of the clad layer 91c. If λ is 450 nm (4500 Å), the clad layer 91c can be formed in a thickness of 771 Å (4500/4×1.46=771 Å) or more. A maximum thickness of the clad layer 91c preferably falls within the range of 1 to 3 μm, not to impose any burden on the subsequent processes. Depending on the case, however, it is acceptable to make the top layer as thick as 3.0 μm or more.

The first non-conductive reflective film R1 preferably has a higher effective refractive index than the refractive index of the dielectric film 91b for light reflection and guidance. If the second non-conductive reflective film R2 and the electrodes 70, 80 come in direct contact with each other, a portion of the light travelling through the second non-conductive reflective film R2 may be absorbed by the electrodes 70, 80. This light absorption by the electrodes 70, 80 can be substantially reduced by incorporating the clad layer 91c having a lower refractive index than the second non-conductive reflective film R2. With these refractive indices thus selected, the dielectric film 91b—second non-conductive reflective film R2—clad layer 91c can be explained in view of an optical waveguide. The optical waveguide is a structure that encloses a propagation part of light by a material having a lower refractive index than the propagation part of light and directs the light by total reflection. In this regard, if the first non-conductive reflective film R1 and the second non-conductive reflective film R2 can be taken as the propagation part, the dielectric film 91b and the clad layer 91c can be taken as part of the optical waveguide that encloses the propagation part.

For example, if the first non-conductive reflective film R1 is made of a dielectric material (e.g. $SiO_2/TiO_2$), the dielectric film 91b may be made of a dielectric material (e.g. $SiO_2$) having a lower effective refractive index than the first non-conductive reflective film R1. Here, the effective refractive index means an equivalent refractive index of light that can travel in a waveguide made of materials having different refractive indices. The clad layer 91c may also be made of a material having a lower effective refractive index than the second non-conductive reflective film R2 (e.g. $Al_2O_3$, $SiO_2$, SiON, MgF, CaF). If the first non-conductive reflective film R1 is composed of $SiO_2/TiO_2$, with $SiO_2$ having a refractive index of 1.46 and $TiO_2$ having a refractive index of 2.4, an effective refractive index of the first non-conductive reflective film R1 will have a value between 1.46 and 2.4. Accordingly, the dielectric film 91b can be composed of $SiO_2$, and a suitable thickness for it would be between 0.2 and 1.0 μm. Moreover, the clad layer 91c may also be composed of $SiO_2$ having a refractive index of 1.46 which is lower than the effective refractive index of the second non-conductive reflective film R2.

Although not desirable from the perspective of the optical waveguide, the dielectric film 91b may optionally be omitted to go along with the general technical ideas of the present disclosure, yet the configuration including the first non-conductive reflective film R1 and the clad layer 91c does not need to be excluded either. Further, as another alternative, the clad layer 91c may be omitted.

In short, the non-conductive reflective film, including the dielectric film 91b, the first non-conductive reflective film R1, the second non-conductive reflective film R2 and the clad layer 91c can serve as an optical waveguide, in which the second non-conductive reflective film R2 complements the reflectance reduction of the first non-conductive reflective film R1 at the Brewster angle, and their combined thickness can range from 1 to 8 μm.

The first electrode 80 and the second electrode 70 are formed on the clad layer 91c, opposite to each other with a certain distance apart therebetween. In this exemplary embodiment, the first electrode 80 provides electrons, and the second electrode 70 provides holes. Needless to say, they could also function the other way around. The first electrical connection 81 electrically connects the first electrode 80 and the first finger electrode 85, passing through the first and second non-conductive reflective films R1, R2. The second electrical connection 71 electrically connects the second electrode 70 and the second finger electrode 75, passing through the first and second non-conductive reflective films R1, R2.

Figure 12:
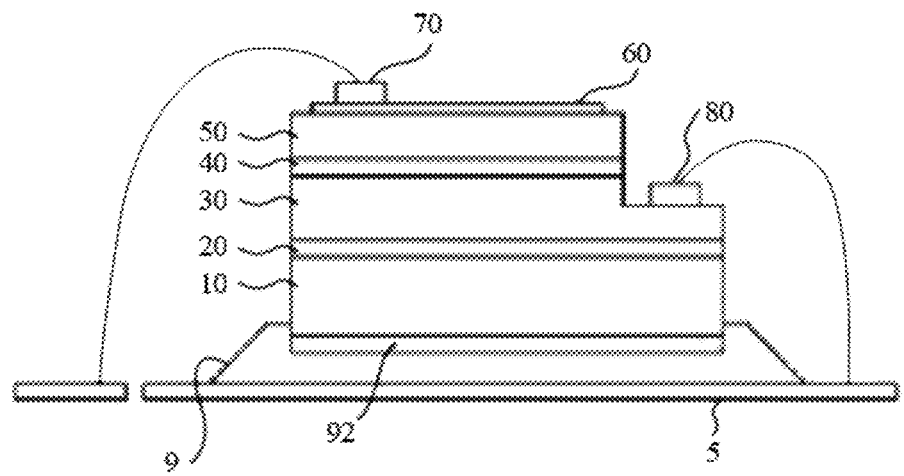
FIG. 12 illustrates an exemplary conventional method for mounting a semiconductor light emitting device on a frame 5.
Figure 13:
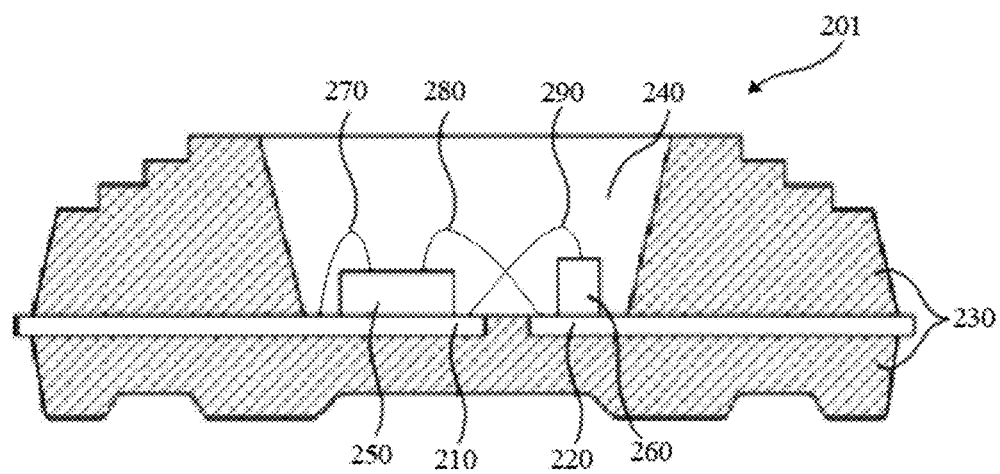
FIG. 13 illustrates an exemplary conventional Group III-nitride semiconductor light emitting device.
Figure 14:
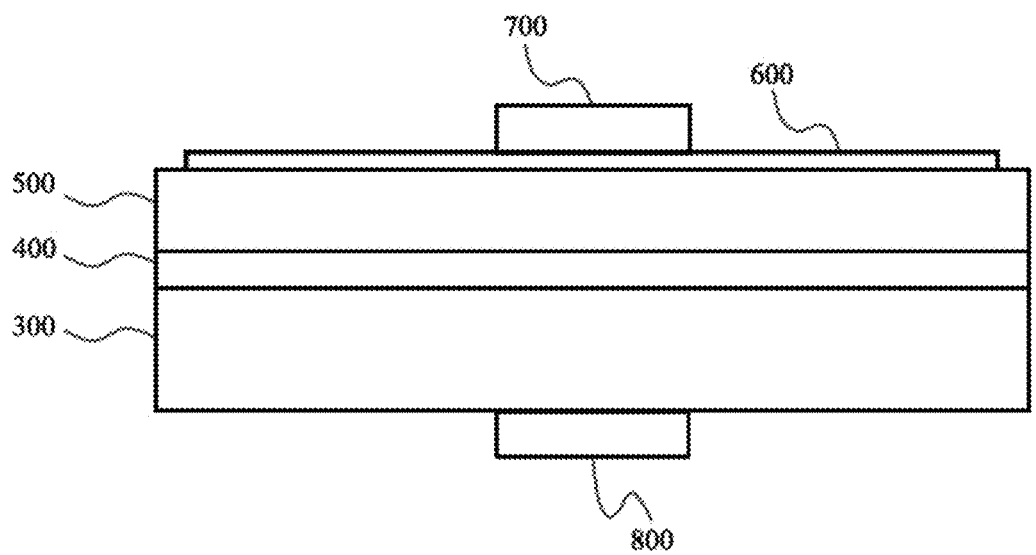
FIG. 14 illustrates an exemplary vertical light emitting device.
Figure 15:
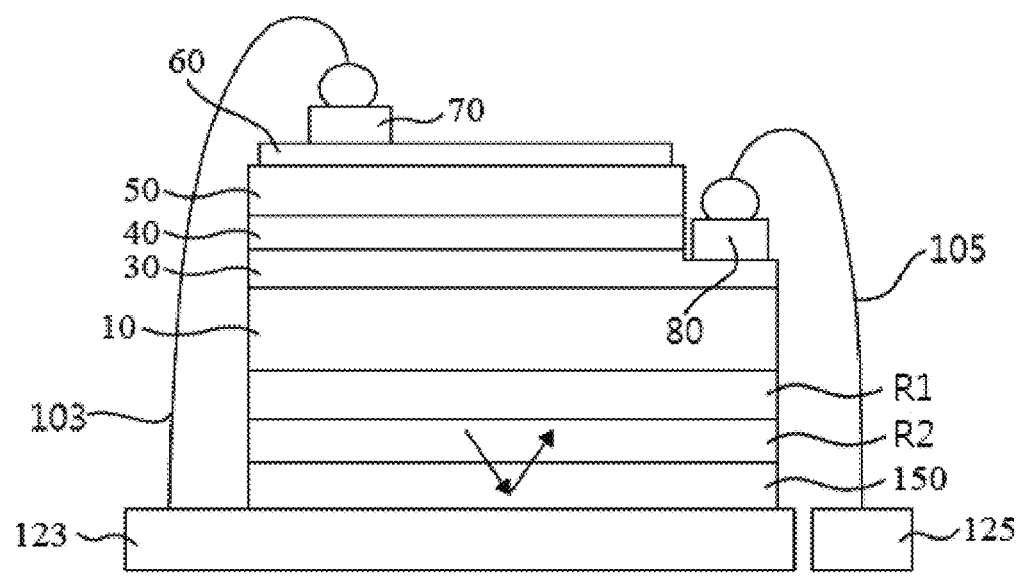
FIG. 15 is a schematic view for describing an exemplary embodiment of a semiconductor light emitting device according to the present disclosure.

Using a non-conductive reflective film in place of a metallic reflective film in the semiconductor light emitting device, an amount of light loss due to absorption by the metallic reflective film is reduced. In addition, light leakage can be reduced further by having the second non-conductive reflective film R2 complement the reflectance reduction of the first non-conductive reflective film R1 at the Brewster angle, FIG. 15 is a schematic view for describing an exemplary embodiment of a semiconductor light emitting device according to the present disclosure. The semiconductor light emitting device includes a first base 123, a second base 125, a substrate 10, a plurality of semiconductor layers 30, 40, 50, a light transmitting conductive film 60, a first electrode 80, a second electrode 70, a first non-conductive reflective film R1, a second non-conductive reflective film R2 and a bonding layer 150. In this exemplary embodiment, the base 123, 125 is a metal frame, or a lead frame as shown in FIG. 12 or FIG. 13. The substrate 10 provided on the first base 123 is a growth substrate on which the plurality of semiconductor layers 30, 40, 50 are grown. The plurality of semiconductor layers 30, 40, 50 is formed on the substrate 10 in the following order: a first semiconductor layer 30 having a first conductivity type, a second semiconductor layer 50 having a second conductivity type different form the first conductivity type, and an active layer 40 interposed between the first semiconductor layer 30 and the second semiconductor layer 50 and adapted to generate light by electron-hole recombination.

The first electrode 80 is formed on an etched exposed portion of the first semiconductor layer 30 and supplies electrons. The light transmitting conductive film 60 is formed on the second semiconductor layer 50. The second electrode 70 is formed on the light transmitting conductive film 60 and supplies holes. The first non-conductive reflective film R1, which is interposed between the first base 123 and the substrate 1, forms an integrated body with the substrate 10, and serves to reflect light that goes through the substrate 10 from the active layer. The first non-conductive reflective film R1 has multiple layers, and a first incident angle thereof corresponds to the Brewster angle. The second non-conductive reflective film R2, which is interposed between the first base 123 and the first non-conductive reflective film R1, forms an integrated body with the first non-conductive reflective film R1, and serves to reflect light that has passed through the first non-conductive reflective film R1. The second non-conductive reflective film R2 has multiple layers, and part of the layers is made of a different material from the first non-conductive reflective film R1. It has a second incident angle different from the first incident angle as the Brewster angle. The bonding layer 150 is interposed between the first base 123 and the second non-conductive reflective film R2. In this exemplary embodiment, the bonding layer 150 is made of a metal and serves to bond the first base 123 and the second non-conductive reflective film R2 together.

The semiconductor light emitting device in this embodiment is built in such a way that the metallic bonding layer 150 bonds the semiconductor light emitting device to the base 123 (e.g. a lead frame), thereby contributing to an increased heat emission efficiency, yet light absorption by the metallic bonding layer 150 is reduced by a reflection structure including the first non-conductive reflective film R1 and the second non-conductive reflective film R2.

The following will describe a Group III-nitride semiconductor light emitting device as an example. The substrate 10, which may eventually be removed, is typically made of sapphire, SiC, Si, GaN or the like. When the substrate 10 is removed, the first and second non-conductive reflective films R1, R2 will be placed under the first semiconductor layer 30. The first semiconductor layer 30 and the second semiconductor layer 50 can exchange their positions each other, and these semiconductor layers are typically made of GaN in the case of Group III-nitride semiconductor light emitting devices.

The plurality of semiconductor layers 30, 40, 50 includes a buffer layer, a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer may optionally be omitted.

It is preferable that the light transmitting conductive film 60 is present on the second semiconductor layer 50. The light transmitting conductive film 60 serves to transmit light and is formed such that it substantially covers the entire or only a part of the second semiconductor layer 50. Particularly, considering that a p-type GaN has a poor current spreading capability, a p-type semiconductor layer 50 made of GaN usually needs to be aided by the light transmitting conductive film 60. For example, a material such as ITO, Ni/Au or the like can be used for the light transmitting conductive film 60.

Figure 16:
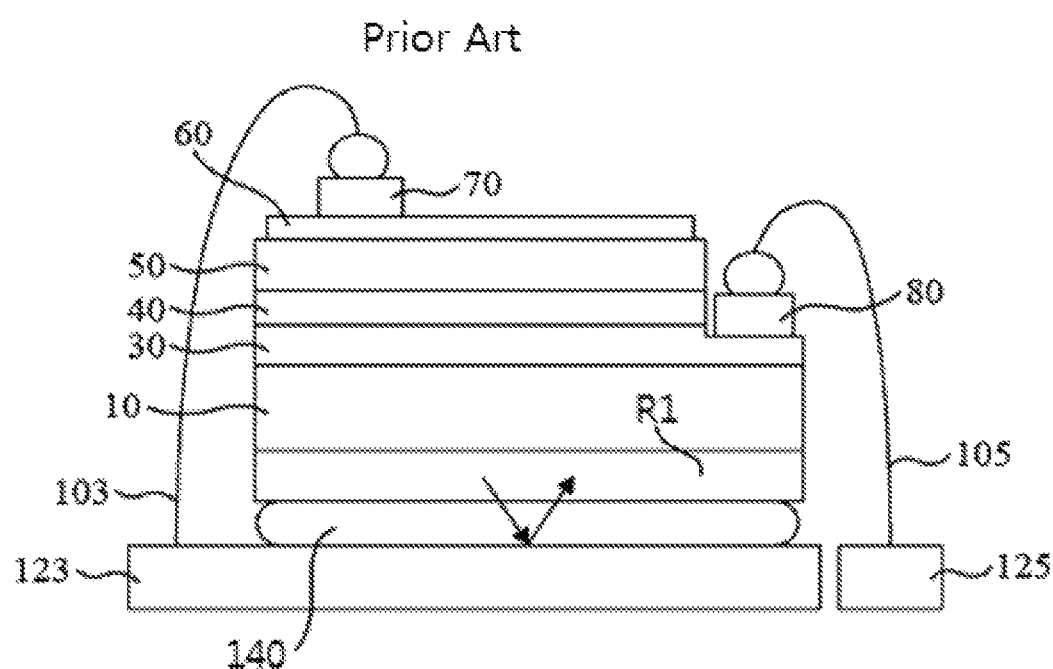
FIG. 16 is a schematic view for describing a comparative embodiment of a semiconductor light emitting device.

FIG. 16 is a schematic view for describing a comparative embodiment of a semiconductor light emitting device. The semiconductor light emitting device has a stack composed of a substrate 10, a first non-conductive reflective film R1 and a first base 123. In this comparative embodiment, a non-metallic paste is used as a bonding layer 140. A great amount of light transmitted through the substrate 10 is reflected by the first non-conductive reflective film R1. The bonding layer 140 may be a clear paste. In this case, light absorption is lower, and part of the light having leaked towards the first non-conductive reflective film R1 transmits through the bonding layer 140 and is reflected by the first base 123 (e.g. Ag or Al). However, as the clear paste has a poor heat conductivity, a high-current type semiconductor light emitting device can face heat emission challenges. Hence, as in FIG. 15, this embodiment employs a highly heat-conductive metallic bonding layer 150 to improve the heat emission efficiency and further to allow high-current operations. Meanwhile, the metallic bonding layer 150 may suffer a greater light loss due to the absorption, as compared with the light transmitting non-metallic bonding layer 140. For example, referring back to the embodiment shown in FIG. 15, the second non-conductive reflective film R2 is interposed between the first non-conductive reflective film R1 and the bonding layer 150. Hence, light transmitted through the first non-conductive reflective film R1 is partly reflected by the second non-conductive reflective film R2. In particular, the second non-conductive reflective film R2 is designed to have a relatively higher reflectance than the first non-conductive reflective film R1 for light that is incident at the Brewster angle of the first non-conductive reflective film R1. In this way, a light loss due to the absorption by the metallic bonding layer 150 can be reduced, which in turn improves the heat emission efficiency of the metallic bonding layer 150 to allow high-current operations.

In this embodiment, the first non-conductive reflective film R1 has a multilayered structure composed of a stack of alternating first material layer/second material layer pairs. The second non-conductive reflective film R2 also has a multilayered structure composed of a stack of alternating third material layer/fourth material layer pairs, in which at least one of the third and fourth material layers is made of a different material from the first and second material layers. As the first non-conductive reflective film R1 and the second non-conductive reflective film R2 are made of different materials, they should be regarded as different from a non-conductive reflective layer structure that is simply formed of two or more identical layers.

In this embodiment, the second non-conductive reflective film R2 is designed to have a higher reflectance at the Brewster angle of the first non-conductive reflective film R1, not at other angles. For instance, when light enters the first non-conductive reflective film R1 through the substrate 10 at a first incident angle (Brewster angle) with a relatively lower reflectance of the first non-conductive reflective film R1, a portion of the incident light is not reflected but transmits through the first non-conductive reflective film R1. This transmitted light portion is then reflected by the second non-conductive reflective film R2. The first non-conductive reflective film R1 and the second non-conductive reflective film R2 each have a DBR or an ODR (Omni-Directional Reflector). In general, the DBR has multiple layers, and each layer is precisely designed to have a thickness for maintaining a high reflectance. In this embodiment, the first non-conductive reflective film R1 is intended to reflect most of incident light, and allows a portion of the light to transmit therethrough. This transmission mostly occurs at an incident angle (Brewster angle) with a relatively lower reflectance of the first non-conductive reflective film R1. Therefore, the second non-conductive reflective film R2 may have a reflectance high enough to reflect light that had been incident at certain angles including the incident angle with a relatively low reflectance of the first non-conductive reflective film R1, and does not need to be unnecessarily high at other angles.

Figure 17:
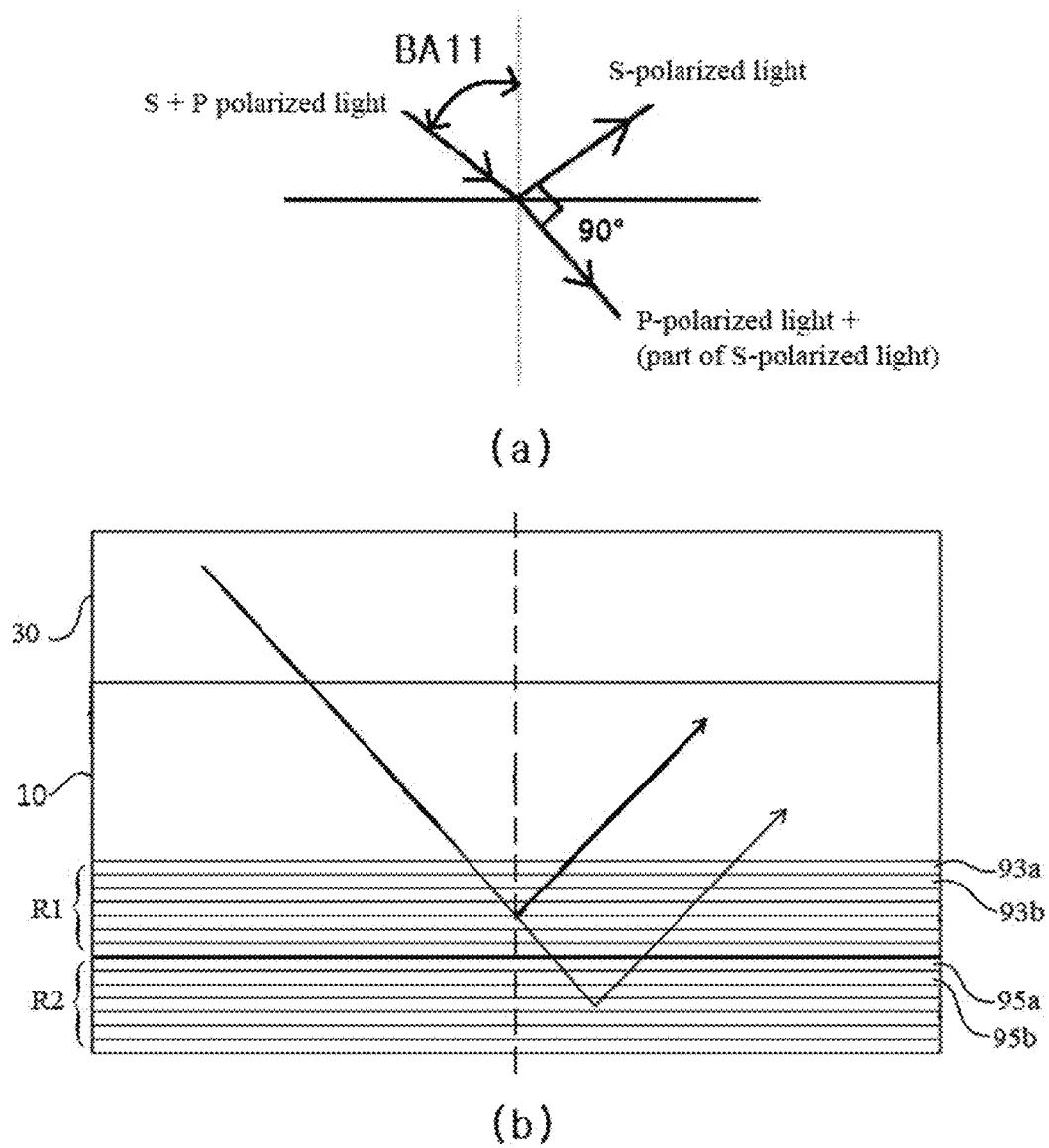
FIG. 17 is a schematic view for describing the characteristics of a non-conductive reflective film according to the present disclosure.

FIG. 17 is a schematic view for describing the characteristics of a non-conductive reflective film according to the present disclosure. Referring to FIG. 17a, for example, when light is incident at a certain angle on the plane of the interface of two media, only light with a particular polarization component is reflected while light with other polarization components is perfectly transmitted, with no reflection. This specific angle of incidence is called the Brewster angle BA11. Suppose that there are vertically polarized light (S-polarized light) and horizontally polarized light (P-polarized light) as in FIG. 17a. When the vertically polarized light and the horizontally polarized light encounter an interface at the Brewster angle, there is always a special angle where a reflected wave (TE wave; S-polarized light) and a transmitted wave (TM wave; P-polarized light+part of the S-polarized light) are apart 90 degrees, and the vertically polarized light is almost all reflected while the horizontally polarized light is mostly transmitted with nearly no reflection. This angle of incidence where the refractive index of a horizontal polarization component is 0 is called the Brewster angle. The Brewster angle varies by physical properties of media. When unpolarized light (e.g. light from the active layer) encounters the first non-conductive reflective film R1 at the Brewster angle, the vertical polarization component is mostly reflected and the horizontal polarization component is perfectly transmitted. Reflectance varies according to an incident angle and is relatively lower at the Brewster angle (see FIG. 21b).

Referring next to FIG. 17b, light that was transmitted through the first semiconductor layer 30 and the substrate 10 after it had been generated by the active layer is reflected by the first non-conductive reflective film R1. The first non-conductive reflective film R1 has multiple layers 93a, 93b, and a first incident angle thereof A1 (see FIG. 18) corresponds to the Brewster angle. Any transmitted light through the first non-conductive reflective film R1 is then reflected by the second non-conductive reflective film R2. The second non-conductive reflective film R2 also has multiple layers 95a, 95b, and part of the layers is made of a different material from the first non-conductive reflective film R1. A second incident angle A1 (see FIG. 19) thereof corresponds to the Brewster angle.

Figure 21:
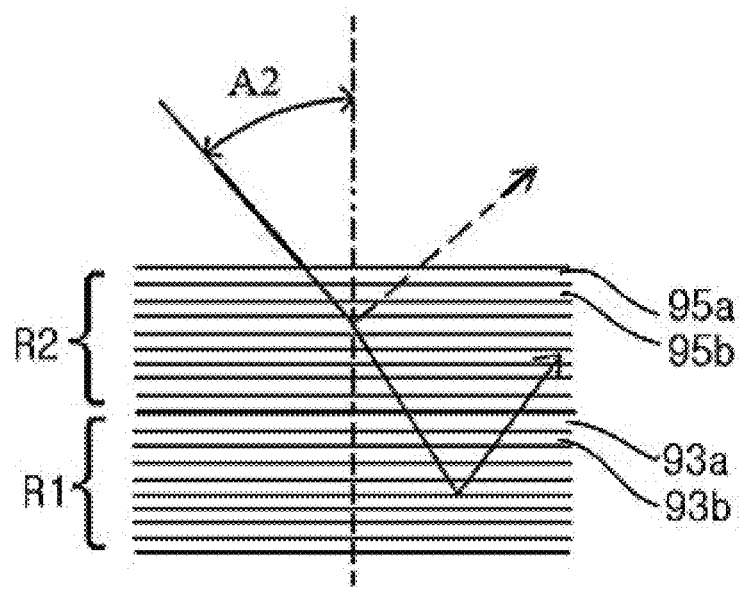
FIG. 21a is a schematic view for describing another exemplary non-conductive reflective film.
Figure 21:
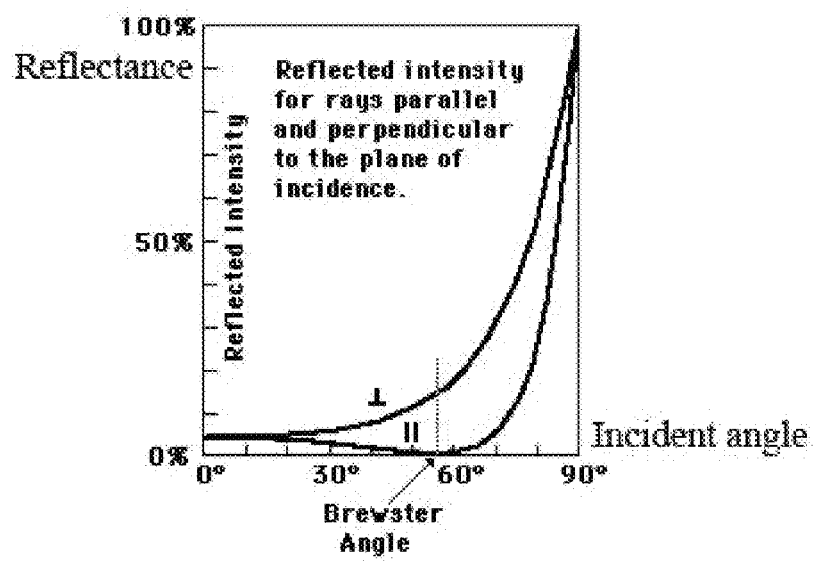

Reflectance of the first non-conductive reflective film R1 is lower at the first incident angle A1 (Brewster angle of the first non-conductive reflective film R1) (see FIG. 21b). Hence, the second non-conductive reflective film R2 is designed such that it shows a higher reflectance towards the light that had been incident on the first non-conductive reflective film R1 at the first incident angle A1 and transmitted therethrough. In this way, light leakage is reduced and brightness of the semiconductor light emitting device is thus improved.

Using the non-conductive reflective films R1, R2 in place of a metallic reflective film, an amount of light loss due to absorption by the metallic reflective film is reduced. The non-conductive reflective films R1, R2 each have a multilayered structure (93a, 93b, 95a, 95b), preferably including a DBR (Distributed Bragg Reflector), an ODR (Omni-Directional Reflector) or the like. The DBR shows a higher reflectance (e.g. approximately 99% or more) towards light incident at angles near the normal direction. Nevertheless, a portion of the light can still transmit through the DBR. Therefore, an amount of light transmitting through the non-conductive reflective film R1, R2 should be reduced to increase light extraction efficiency of the semiconductor light emitting device.

Figure 18:
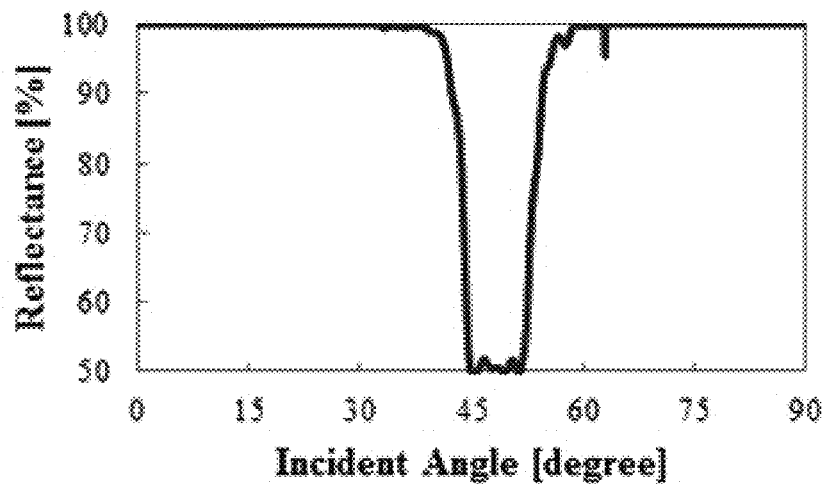
FIG. 18 is a schematic view for describing another exemplary, first non-conductive reflective film.
Figure 18:
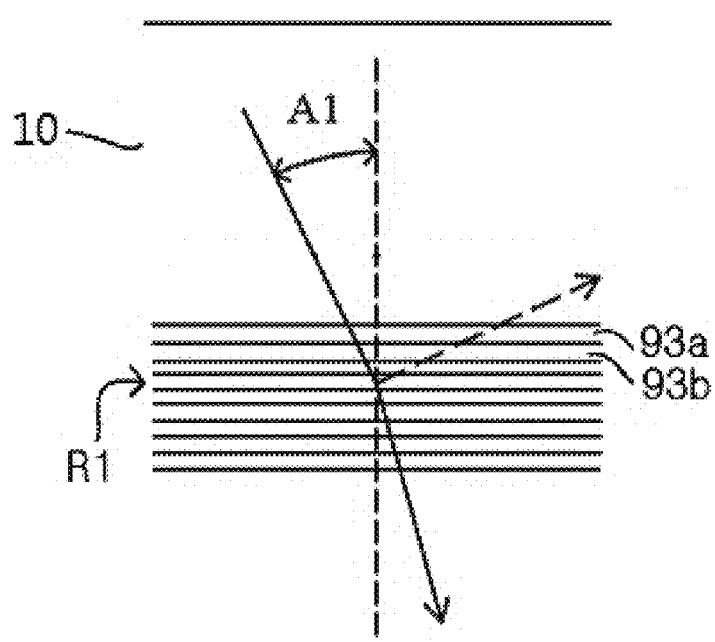

FIG. 18 is a schematic view for describing another exemplary first non-conductive reflective film R1, in which the first non-conductive reflective film R1 is a DBR having multiple layers 93a, 93b. For example, as shown in FIG. 18b, the multiple layers 93a, 93b of the first non-conductive reflective film R1 are composed of a stack of first material layer 93a/second material layer 93b pairs. The first material layer 93a and the second material layer 93b may be made of different materials selected from $SiO_x$, $TiO_x$, $Ta_2O_5$, and $MgF_2$, respectively. Alternately, the first and second material layers may be made of other materials, and the first non-conductive reflective film R1 may have at least three different kinds of multiple layers. For instance, the first non-conductive reflective film R1 may include a stack of 25 or 26 pairs of first material layer 93a/second material layer 93b, such as $SiO_2/TiO_2$, with each of $SiO_2$ and $TiO_2$ being at a thickness of tens of nanometers. In this case, as shown in FIG. 18b, when light is incident on the first non-conductive reflective film R1 through a substrate 10 (e.g. sapphire), the Brewster angle A1 is about 48 degrees, and the first non-conductive reflective film R1 shows a maximum reflectance of 50% at this Brewster angle. FIG. 18a shows incidence angle and reflectance at the stack of the substrate 10 and the first non-conductive reflective film R1. In particular, reflectance in the graph of FIG. 18a represents a mean-pol of reflectances of the vertically and horizontally polarized lights described above.

Figure 19:
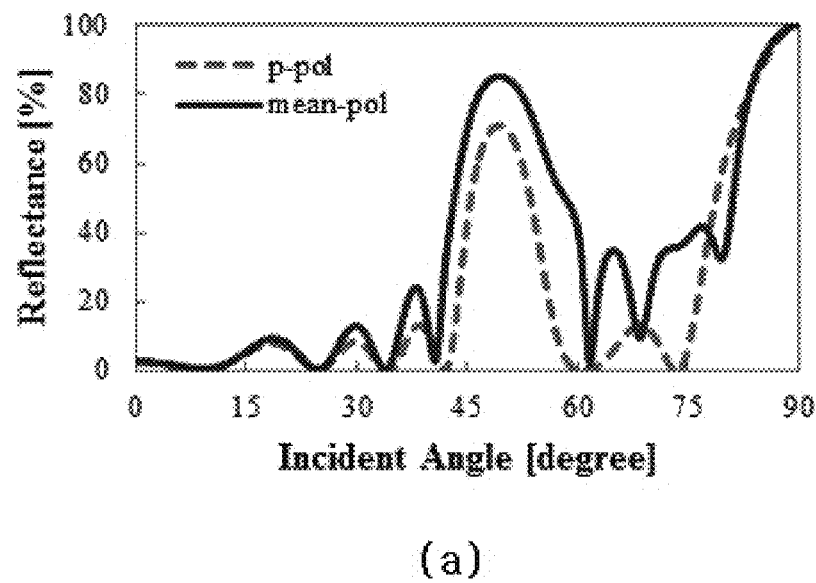
FIG. 19 is a schematic view for describing another exemplary second non-conductive reflective film.
Figure 19:
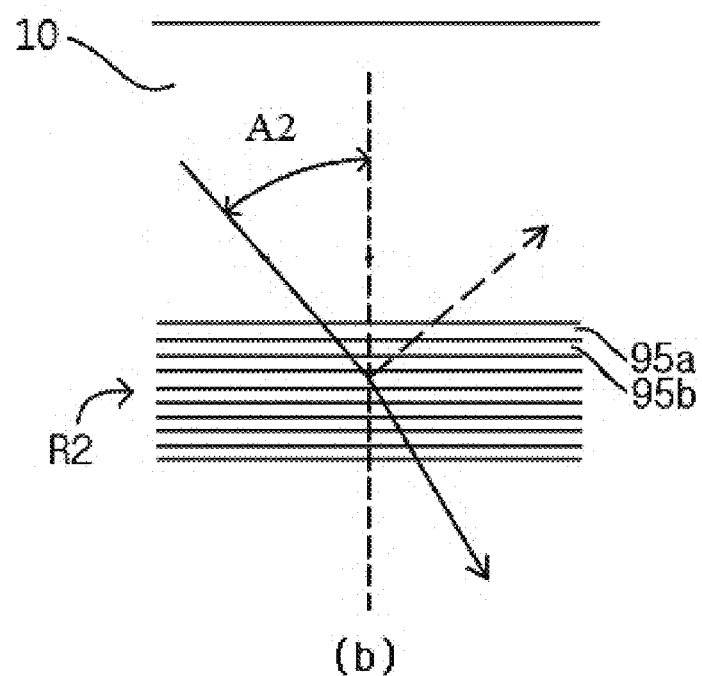

FIG. 19 is a schematic view for describing an exemplary, second non-conductive reflective film R2, in which the second non-conductive reflective film R2 is a DBR having multiple layers 95a, 95b, a part of which is made of a different material from the first non-conductive reflective film R1. Moreover, the second non-conductive reflective film R2 is designed to have a high reflectance at the Brewster angle A1 of the first non-conductive reflective film R1. For example, as shown in FIG. 19b, the multiple layers 95a, 95b of the second non-conductive reflective film R2 include a stack of third material layer 95a/fourth material layer 95b pairs. At least one of the third material layer 95a and fourth material layer 95b is made of a different material from the first material layer 93a and from the second material layer 93b. For example, the third material layer 95a and the fourth material layer 95b may be made of different materials selected from $SiO_x$, $TiO_x$, $Ta_2O_5$, and $MgF_2$, respectively. Alternately, the third and fourth material layers may be made of other materials, and the second non-conductive reflective film R2 may have at least three different kinds of multiple layers. For instance, the second non-conductive reflective film R2 may include a stack of approximately 20 pairs of third material layer 95a/fourth material layer 95b, such as $TiO_2/Ta_2O_5$, with each of $TiO_2$ and $Ta_2O_5$ being at a thickness of tens of nanometers. In this case, as shown in FIG. 19b, when light is incident on the second non-conductive reflective film R2 through a sapphire substrate 10, the Brewster angle A1 is about 48 degrees, and reflectance of the second non-conductive reflective film R2 is higher at the Brewster angle (e.g. about 48 degrees) of the first non-conductive reflective film R1. In this exemplary embodiment, the second non-conductive reflective film R2 is designed to have a high reflectance only within a certain range of angles including the Brewster angle of the first non-conductive reflective film R1, and it is not of particularly great significance for the second non-conductive reflective film R2 to have a lower reflectance in other angles. FIG. 19a shows incidence angle and reflectance at the stack of the sapphire substrate 10 and the second non-conductive reflective film R2.

These non-conductive reflective films are preferably formed by CVD (Chemical Vapor Deposition), and more particularly by PECVD (Plasma Enhanced CVD). Alternately, PVD (Physical Vapor Deposition) such as E-Beam evaporation can also be used.

Figure 20:
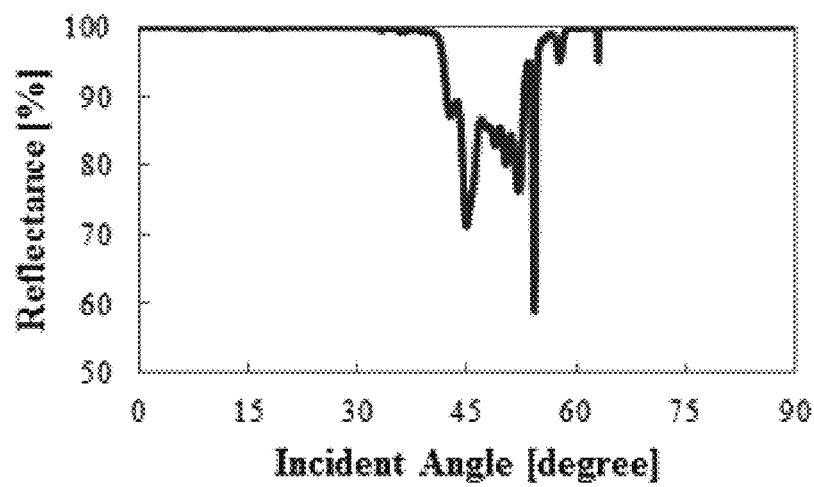
FIG. 20 is a schematic view for describing an example of the reflectance of a combined reflection structure of the first and second non-conductive reflective films.
Figure 20:
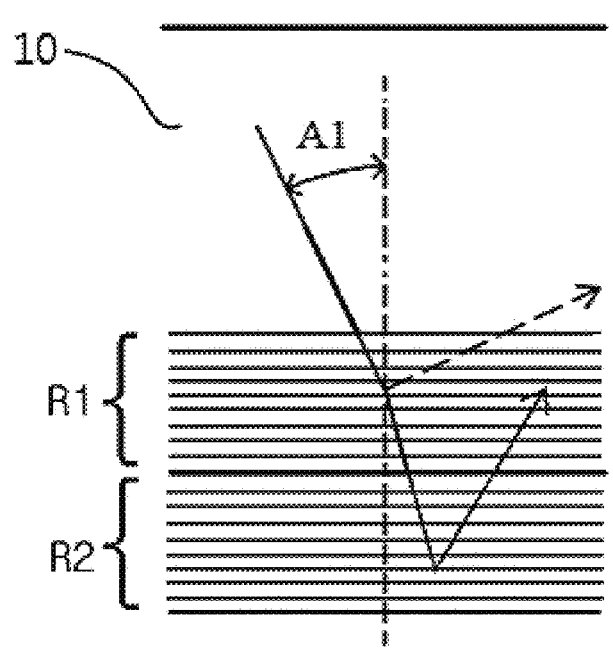

FIG. 20 is a schematic view for describing an example of the reflectance of a combined reflection structure of the first and second non-conductive reflective films R1, R2. In the embodiment shown in FIG. 20b, the first non-conductive reflective film R1 may be the same as the one illustrated in FIG. 18, and the second non-conductive reflective film R2 may be the same as the one illustrated in FIG. 19.

Once light transmits through the substrate 10 and then the first non-conductive reflective film R1, it is reflected by the second non-conductive reflective film R2. Referring to FIG. 21b, vertically polarized light of a greater incident angle is reflected more. Meanwhile, horizontally polarized light is reflected much less at a region of a smaller incident angle and is not reflected at the Brewster angle, i.e. the reflectance is 0. If an incident angle is equal to or greater than the Brewster angle, significantly more of the horizontally polarized light will be reflected. In this exemplary embodiment, in order to improve an overall reflectance of the non-conductive reflective films of the semiconductor light emitting device, the second non-conductive reflective film R2 is designed to have a high reflectance at the Brewster angle where the first non-conductive reflective film R1 has a lower reflectance.

FIG. 20a illustrates a total reflectance of the first and second non-conductive reflective films R1, R2, in which the first non-conductive reflective film R has a relatively lower reflectance at the first incident angle A1 (Brewster angle of the first non-conductive reflective film R1). Thus, when light transmits through the substrate 10 and enters the first non-conductive reflective film R1 at the first incident angle A1, the resulting transmitted light is relatively large. This transmitted light then enters the second non-conductive reflective film R2. Since the second non-conductive reflective film R2 has a higher reflectance at the first incident angle A1, it reflects the light transmitted through the first non-conductive reflective film R1 well. As a result, light absorption by the metallic bonding layer 150 is relatively low, overall light leakage through the non-conductive reflective films R1, R2 is reduced, and brightness of the semiconductor light emitting device is thus improved. In addition, the presence of the metallic bonding layer 150 presents a high heat emission efficiency.

FIG. 21a is a schematic view for describing another exemplary non-conductive reflective film. Here, a substrate 10, a second non-conductive reflective film R2 and a first non-conductive reflective film R1 are stacked in the order mentioned. The non-conductive reflective film R1 has a high reflectance at almost all angles, and the second non-conductive reflective film R2 has a higher reflectance at the Brewster angle A1 of the first non-conductive reflective film R1. Accordingly, an overall reflectance is improved as compared with the case where only one of the first and second non-conductive reflective films R1, R2 is used.

Figure 22:
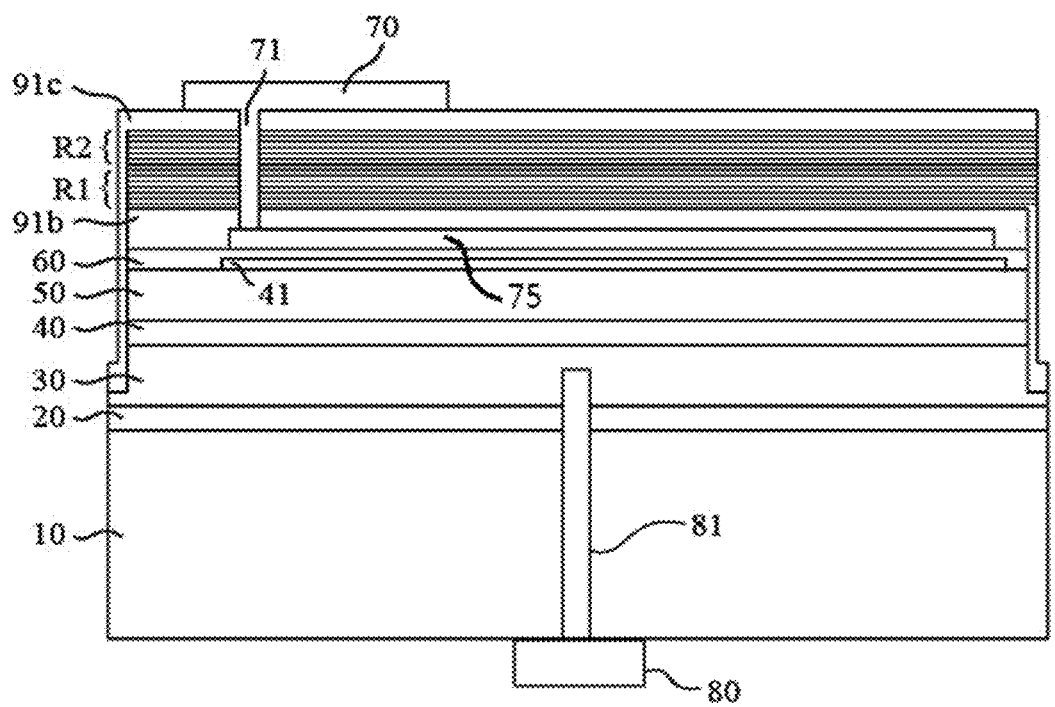
FIG. 22 and FIG. 23 each illustrate another exemplary embodiment of a semiconductor light emitting device according to the present disclosure.
Figure 23:
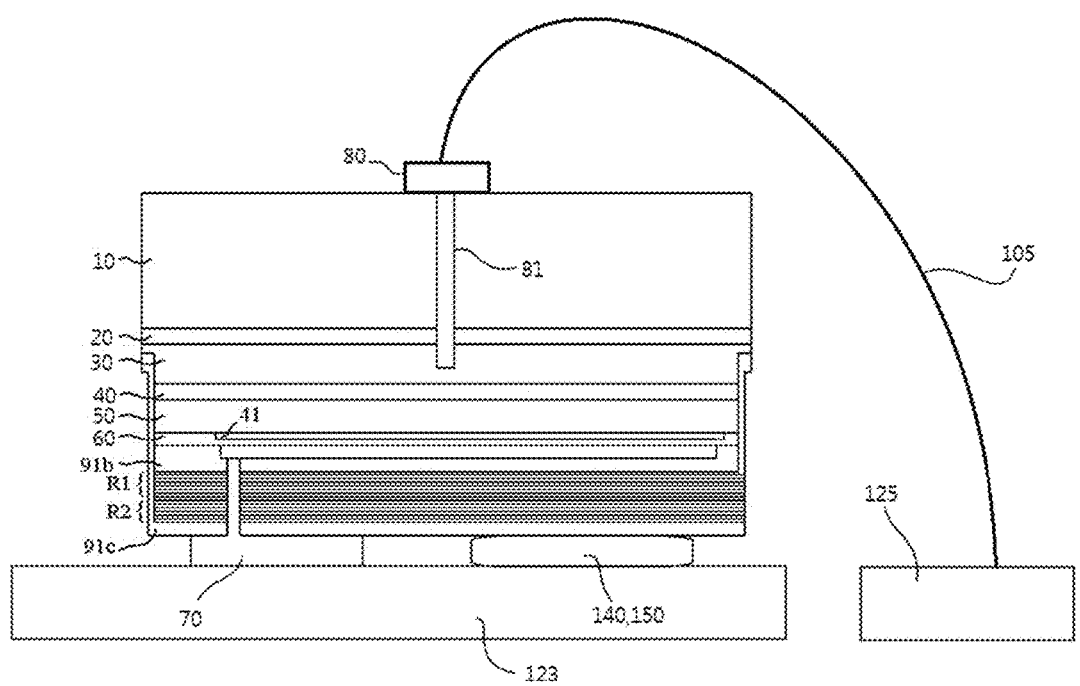

FIG. 22 and FIG. 23 are schematic views for describing other exemplary embodiments of a semiconductor light emitting device according to the present disclosure, in which a light absorption barrier 41 is formed on a second semiconductor layer 50, a light transmitting conductive film 60 is formed on the light absorption barrier 41, a finger electrode 75 is formed on the light transmitting conductive film 60, a dielectric layer 91b is formed on the finger electrode 75, first and second non-conductive reflective films R1, R2 are formed on the dielectric layer 91b, a clad layer 91c is formed on the second non-conductive reflective film R2, and a second electrode 70 is formed on the clad layer 91c. The second electrode 70 and the finger electrode 75 are connected by means of an electrical connection 71.

In this embodiment, a first electrode 80 is provided on the lower side of the substrate 10. A groove is created in the substrate 10 with a laser beam, for example, such that a portion of the first semiconductor layer 30 is exposed through the groove. The first electrode 80 is either plated or deposited in the groove. The first electrode 80 extends through the groove and becomes electrically connective with the first semiconductor layer 30. A part of the first electrode 80 is formed on the lower side of the substrate 10. Alternatively, when the substrate 10 is removed, the first electrode 80 can be formed on an exposed portion of the first semiconductor layer 30 after the substrate 10 had been removed. Moreover, the groove can be elongated to receive a finger electrode in addition to the first semiconductor layer 30. The dielectric film 91b and the clad layer 91c may be omitted. In addition, the finger electrode 75 may be omitted.

The light absorption barrier 41 may only serve to reflect a portion or all of the light generated from the active layer 40, or to prevent the current from flowing down directly from the finger electrode 75, or both. The light absorption barrier 41 may be omitted.

During the fabrication of a semiconductor light emitting device according to this embodiment, step coverage is created due to a structure like the finger electrode 75 and by mesa-etching. In this exemplary embodiment, the first non-conductive reflective film R1 and the second non-conductive reflective film R2 each have a DBR. As the deposition of the DBR needs to be done with high precision, the dielectric film 91b having a uniform thickness may be formed before the deposition such that the DBR can be prepared in a stable manner, and light reflection can also benefit therefrom. Preferably, the dielectric film 91b is made of a suitable material like $SiO_2$, and has a thickness of 0.2 to 1.0 μm.

The first non-conductive reflective film R1 and the second non-conductive reflective film R2 reflect light from the active layer 40 towards the plurality of semiconductor layers 30, 40, 50. The first non-conductive reflective film R1 and the second non-conductive reflective film R2 used in this exemplary embodiment can be the same as the ones described above.

While the first non-conductive reflective film R1 has a lower reflectance at the Brewster angle, and the second non-conductive reflective film R2 is designed to show a relatively higher reflectance at the Brewster angle of the first non-conductive reflective film R1. As such, an overall reflectance is improved as compared with one in the case where only one of the first and second non-conductive reflective films R1, R2 is used. In an alternative, the light transmitting conductive film 60, the second non-conductive reflective film R2 and the first non-conductive reflective film R1 may be stacked in the order mentioned.

The clad layer 91c may be made of a metal oxide such as $Al_2O_3$, a dielectric material such as $SiO_2$ or SiON, or other materials such as MaF or CaF.

Using the non-conductive reflective films R1, R2 in place of a metallic reflective film in the semiconductor light emitting device, light loss due to absorption by the metallic reflective film can be reduced. In addition, light leakage can be reduced further by having the second non-conductive reflective film R2 complement the reflectance reduction of the first non-conductive reflective film R1 at the Brewster angle, Referring now to FIG. 23, the semiconductor light emitting device described above is bonded to a first base 123. The second electrode 70 can be bonded (e.g. eutectic bonding) to the first base 123. It is not desirable that a metal layer (e.g. the second electrode 70) covering the second non-conductive reflective film R2 should be very large as it is led to an increased light absorption by the metal. Therefore, as shown in FIG. 23, it is perfectly acceptable that the second non-conductive reflective film R2 only covers a part of the second electrode 70. In addition to the second electrode 70, a bonding layer 140, 150 may also be provided between the first base 123 and the second non-conductive reflective film R2. The bonding layer 140, 150 may or may not contain a metal. In this embodiment, a metallic bonding layer 150 is eutectically bonded to the first base 123. The presence of the metallic bonding layer 150 contributes to an increased heat emission efficiency, thereby allowing high-current operations. Meanwhile, the first electrode 80 is electrically connected to the second base 125 by wire 105 bonding.

Figure 24:
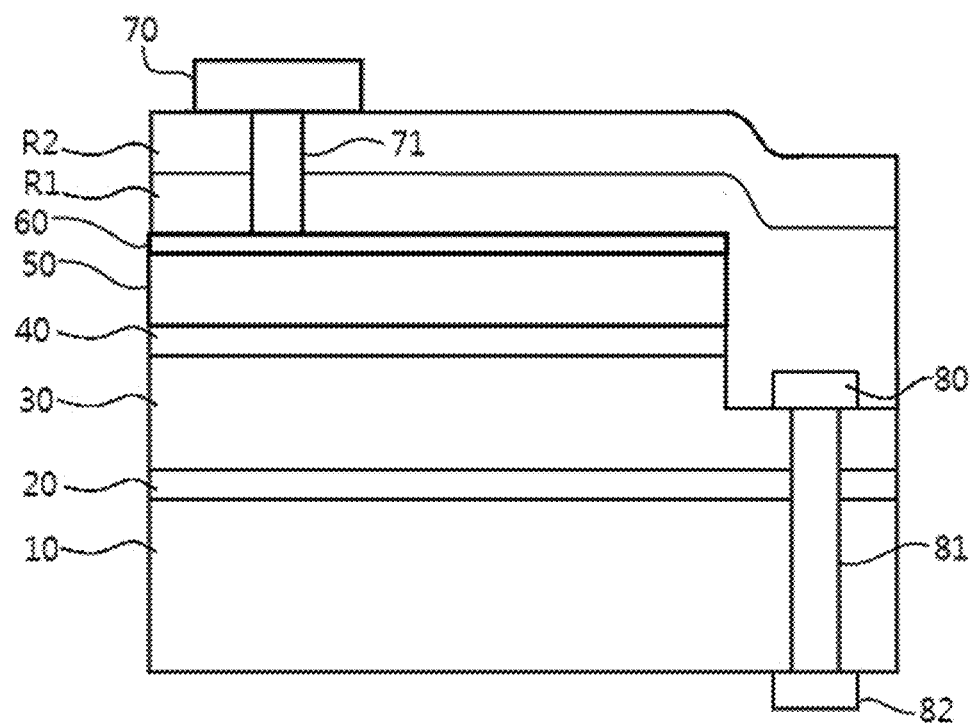
FIG. 24 and FIG. 25 each illustrate another exemplary embodiment of a semiconductor light emitting device according to the present disclosure.
Figure 25:
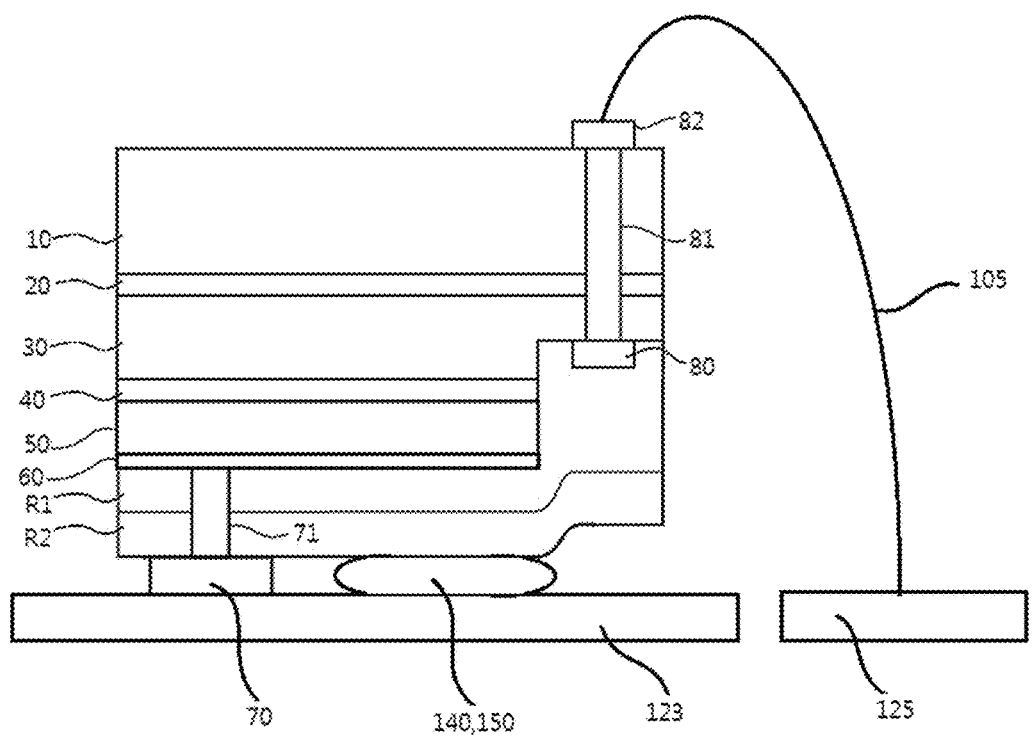

FIG. 24 and FIG. 25 are schematic views for describing other exemplary embodiments of a semiconductor light emitting device according to the present disclosure. As shown in FIG. 24, a first semiconductor layer 30 is partly exposed by mesa-etching a second semiconductor layer 50 formed thereover. A hole is formed by a laser beam in this exposed portion of the first semiconductor layer 30. A first electrode 80 is then formed in the exposed, first semiconductor layer 30. The first electrode 80 extends (see 82 in FIG. 24) through the hole to the lower side of the substrate 10. Next, a light transmitting conductive film 60 is formed on the second semiconductor layer 50, followed by a first non-conductive reflective film R1 and a second non-conductive reflective film R2. An opening is formed in the first and second non-conductive reflective film R1, R2 to form an electrical connection 71 therein. In addition to or independently of the electrical connection, a second electrode 70 is formed on the second non-conductive reflective film R2.

Referring next to FIG. 25, the second electrode 70 is bonded to the first base 123, and a bonding layer 140, 150 may be interposed between the first base 123 and the second non-conductive reflective film R2. The bonding layer 140, 150 contains either a metal suitable for eutectic bonding, or a material having a low light absorption capability (e.g. a clear paste). The first electrode 80 is electrically connected to the second base 125 by means of wire 105 bonding.

As a very small amount of light arrives at the bonding layer 150 in the presence of the reflection structure including the first and second non-conductive reflective films R1, R2, the bonding layer 150 can be used for bonding without worrying about an increase in the light loss, and the heat emission efficiency can be improved as compared with that of the non-metal bonding layer 140. This makes the metallic bonding layer 150, together with the second electrode 70, suitable for eutectic bonding.

Figure 26:
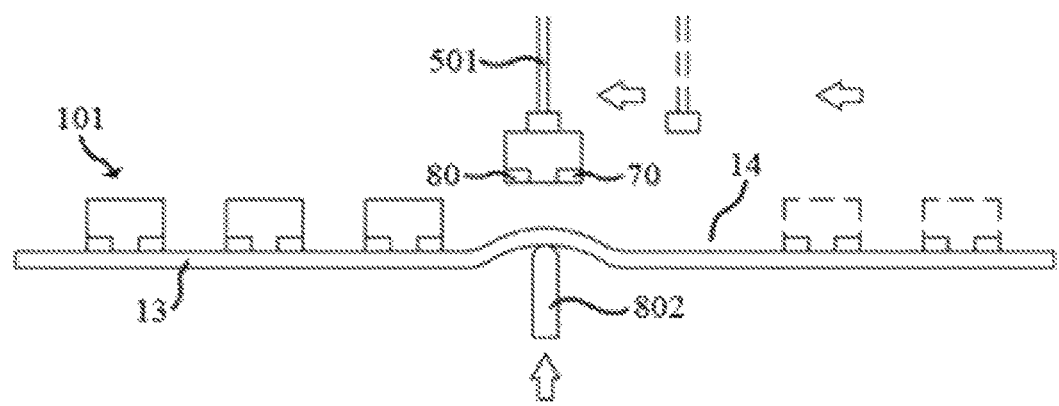
FIG. 26 is a schematic view for describing an exemplary method for manufacturing a semiconductor light emitting device.
Figure 26:
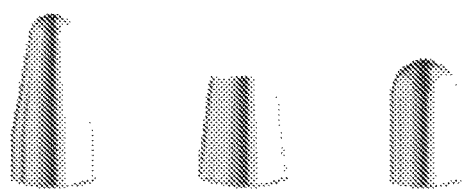
Figure 27:
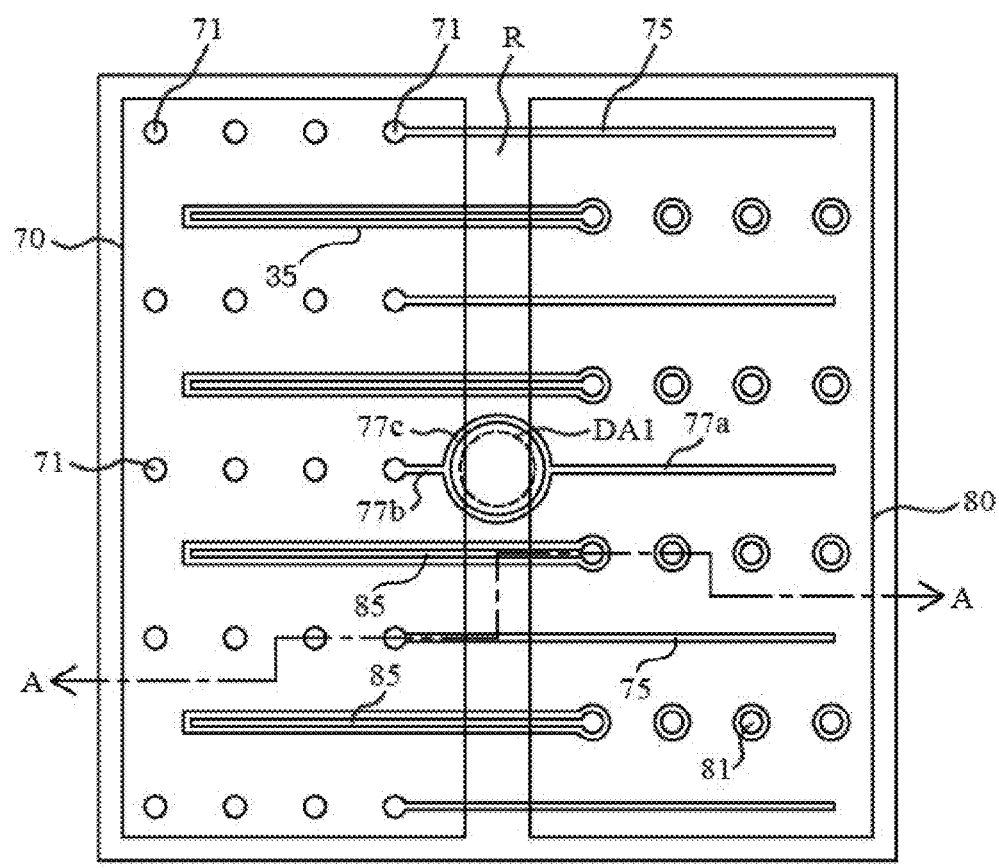
FIG. 27 is a schematic view for describing another exemplary embodiment of a semiconductor light emitting device according to the present disclosure.
Figure 28:
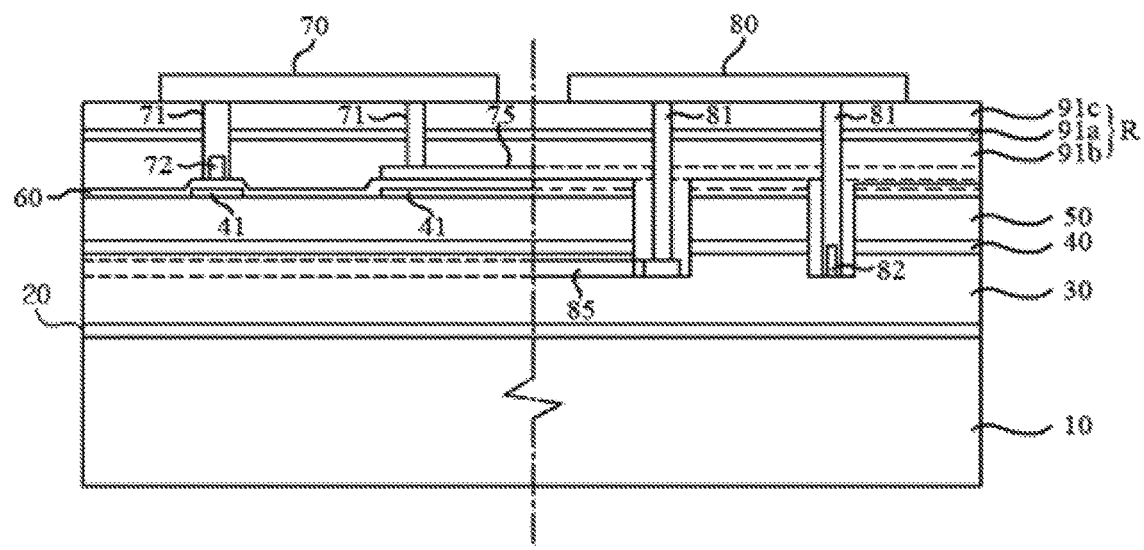
FIG. 28 illustrates a cross-sectional view taken along A-A line in FIG. 27.

FIG. 27 is a schematic view for describing another exemplary embodiment of a semiconductor light emitting device according to the present disclosure, and FIG. 28 illustrates a cross-sectional view taken along A-A line in FIG. 27. During handling of the semiconductor light emitting device, an ejection needle 802 (see FIG. 26) sometimes collides against the semiconductor light emitting device. Therefore, the semiconductor light emitting device according to this embodiment has an electrode structure for preventing mechanical impact-induced damages. The semiconductor light emitting device includes a plurality of semiconductor layers 30, 40, 50, extendable electrodes 77a, 77b, 77c, an insulating reflective film R, a first electrode 80 and a second electrode 70. The plurality of semiconductor layers 30, 40, 50 includes a first semiconductor layer 30 having a first conductivity type, a second semiconductor layer 50 having a second conductivity type different from the first conductivity type, and an active layer 40 interpositioned between the first and second semiconductor layers 30, 50 and adapted to generate light by electron-hole recombination. The extendable electrodes 77a, 77b, 77c are stretched above the plurality of semiconductor layers 30, 40, 50 (See FIG. 28), and have a bypass configuration to avoid an impact area DA1 where the ejection needle 802 collides into. The insulating reflective film R is formed over the plurality of semiconductor layers 30, 40, 50 in such a way that the expendable electrodes 77a, 77b, 77c are covered, and it serves to reflect light from the active layer 40. The first electrode 80 is formed on the insulating reflective film R, and electrically connected to the first semiconductor layer 30 to supply either electrons or holes thereto. The second electrode 70 is also formed on the insulating reflective film R, and electrically connected to the second semiconductor layer 50 to supply holes or electrons thereto, depending on which are supplied to the first semiconductor layer. There are also provided a first electrical connection 81 passing through the insulating reflective film R to electrically communicate the first semiconductor layer 30 and the first electrode 80, and a second electrical connection 71 passing through the insulating reflective film R to electrically communicate the second semiconductor layer 50 and the second electrode 70.

As an alternative, a metallic reflective film may be provided on the second semiconductor layer 50, the second electrode 70 may be provided on the metallic reflective film, and a mesa-etched, exposed portion of the first semiconductor layer 30 and the first electrode 80 may be in electrical communication with each other. While flip-chip type semiconductor light emitting devices are illustrated in FIG. 27 and FIG. 28, it should be noted that the present disclosure is not limited thereto. For example, a finger electrode that stretches out for current spreading, or an extendable electrode can equally be applied to a lateral type or other types of semiconductor light emitting devices.

In general, the center of the semiconductor light emitting device is struck by the ejection needle 802. As seen in the top view, the impact area DA1 where the ejection needle 802 collides into is located at the center of the semiconductor light emitting device. As such, the impact area DA1 preferably has a larger area or a greater diameter than the longitudinal cross section of the ejection needle 802, in order for the extendable electrodes 77a, 77b, 77c to avoid an impact from the ejection needle 802. Nevertheless, such an elongated microscale structure like a finger electrode, or extendable electrodes 77a, 77b, 77c may still be subjected to possible defects such as a crack or short caused by the impact from the ejection needle 802. In this exemplary embodiment, therefore, the extendable electrodes 77a, 77b, 77c are configured to avoid the impact area DA1 from the ejection needle 802 such that they are protected from the damage. It is one option to simply place the extendable electrodes 77a, 77b, 77c in other locations than the impact area DA1. It is another option to make the extendable electrodes 77a, 77b, 77c partly bypass (e.g. bend or curve) to avoid the impact area DA1 and then reach back to a target location or area to carry out their intended function, namely, current spreading.

The following will describe a Group III-nitride semiconductor light emitting device as an example.

The substrate 10, which may eventually be removed, is typically made of sapphire, SiC, Si, GaN or the like. The first semiconductor layer 30 and the second semiconductor layer 50 can exchange their positions each other, and these semiconductor layers are typically made of GaN in the case of Group III-nitride semiconductor light emitting devices.

The plurality of semiconductor layers 30, 40, 50 includes a buffer layer 20 a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer 20 may optionally be omitted.

The plurality of semiconductor layers 30, 40, 50 has a substantially quadrangular shape as seen from the top (top view), and the impact area DA1 is located at the point of intersection of two diagonal lines of the quadrangle. The second semiconductor layer 50 and the active layer 40 undergo an etching process to form an n-contact area 35, which is an exposed portion, in the first semiconductor layer 30. A plurality of first finger electrodes 85 (additional extendable electrodes) is formed in the n-contact area 35, and stretches from below the first electrode 80 to below the second electrode 70. Likewise, a plurality of second finger electrodes 75 on the second semiconductor layer 50 stretches from below the second electrode 70 to below the first electrode 80. In this exemplary embodiment, the plurality of second finger electrodes 75 includes extendable electrodes 77a, 77b, 77c, as well as other, second finger electrode 75. These extendable electrodes 77a, 77b, 77c are extended approximately at the center, and there is a bypass portion (e.g. bent or curved) to avoid the impact area DA1. This will be described further.

The current spreading electrode 60 (e.g. ITO or Ni/Au) is preferably formed between the second semiconductor layer 50 and the insulating reflective film R. After the first semiconductor layer 30, the active layer 40, the second semiconductor layer 50 and the current spreading electrode 60 are formed on the substrate 10, they undergo a mesa-etching process to form an n-contact area 35 as described above. The mesa-etching process may be carried out before or after the current spreading electrode 60 is formed. Optionally, the current spreading electrode 60 may be omitted.

As described above, the plurality of second finger electrodes 75 is formed on the current spreading electrode 60. The plurality of first finger electrodes 85 and the plurality of second finger electrodes 75 are stacked alternately one after the other. The first finger electrodes 85 and the second electrodes 75 each can include multiple metal layers. Additionally, there can be provided a reflective layer having a high reflectance and a contact layer demonstrating a high-performance electrical contact with the first semiconductor layer 30 or with the current spreading electrode 60.

The insulating reflective film R is formed such that it covers the current spreading electrode 60, the plurality of first finger electrodes 85 and the plurality of second finger electrodes 75, and serves to reflect light from the active layer 40 towards the substrate 10. In this exemplary embodiment, the insulating reflective film R is made of an insulating material to reduce light absorption by a metallic reflective film, and it is preferably a multilayered structure including a DBR (Distributed Bragg Reflector), an ODR (Omni-Directional Reflector) or the like.

In this exemplary embodiment, the extendable electrodes 77a, 77b, 77c includes a first finger 77a, a second finger 77b and a third finger 77c. The first finger 77a stretches from below the first electrodes 80, and the second finger 77b stretches from below the second electrode 70. The first finger 77a and the second finger 77b can be arranged approximately collinearly, crossing the center of the semiconductor light emitting device.

On the other hand, the third finger 77c has a curved shape with respect to the first finger 77a or the second finger 77b, instead of being in parallel with the first and second fingers 77a, 77b, to avoid the impact area DA1. In this exemplary embodiment, the third finger 77c has an annular shape and is connected to the first and second fingers 77a, 77b. The impact area DA1 is located inside the annular third finger 77c between the first electrode 80 and the second electrode 70.

The ejection needle 802 can have a rounded or planar end, and a diameter ranging from 50 to 80 μm. The diameter of the ejection needle 802 may vary depending on the shape or area of a semiconductor light emitting device to be fabricated (see FIG. 26b). The annular shape of the third finger 77c preferably has a diameter greater than the diameter of the ejection needle. In this exemplary embodiment, the first finger 77a and the second finger 77b have a linear form, each sticking out or extended from the annular third finger 77c. Alternatively, the first finger 77a and the second finger 77b may have a bent or curved form.

Figure 29:
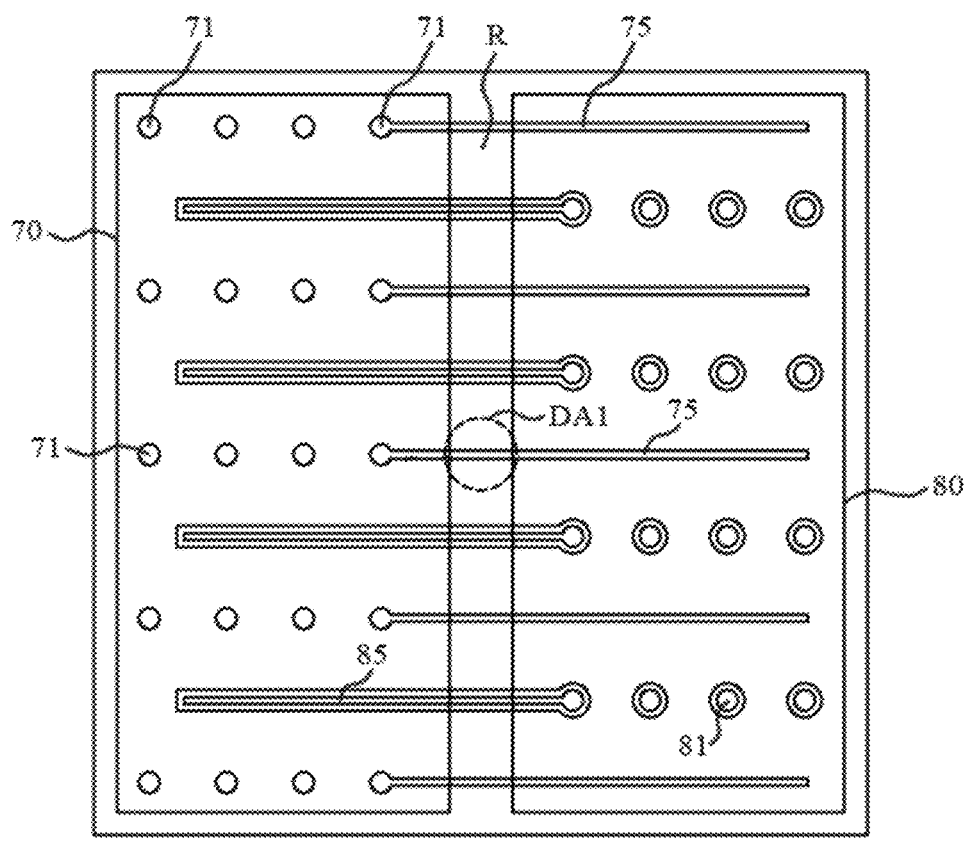
FIG. 29 is a schematic view for describing a comparative embodiment of a semiconductor light emitting device.

FIG. 29 is a schematic view for describing a comparative embodiment of a semiconductor light emitting device. Here, the semiconductor light emitting device has an impact area DA1 to traverse the second electrode 75. Because of that, the second finger electrode 75 may be cracked or even shorted in a worse situation when the semiconductor light emitting device is struck by the ejection needle 802. In order to avoid these issues, the second finger electrode 75 may not be present to simply avoid the impact area DA1 or the plurality of second finger electrodes 75 can be arranged at greater spacing therebetween, but this may lead to less uniform current spreading. Hence, this exemplary embodiment introduced extendable electrodes 77a, 77b, 77c adapted to stretch out towards suitable positions for current spreading. As a result, more uniform current spreading as well as the prevention of impact-induced damages can be achieved at the same time.

Figure 30:
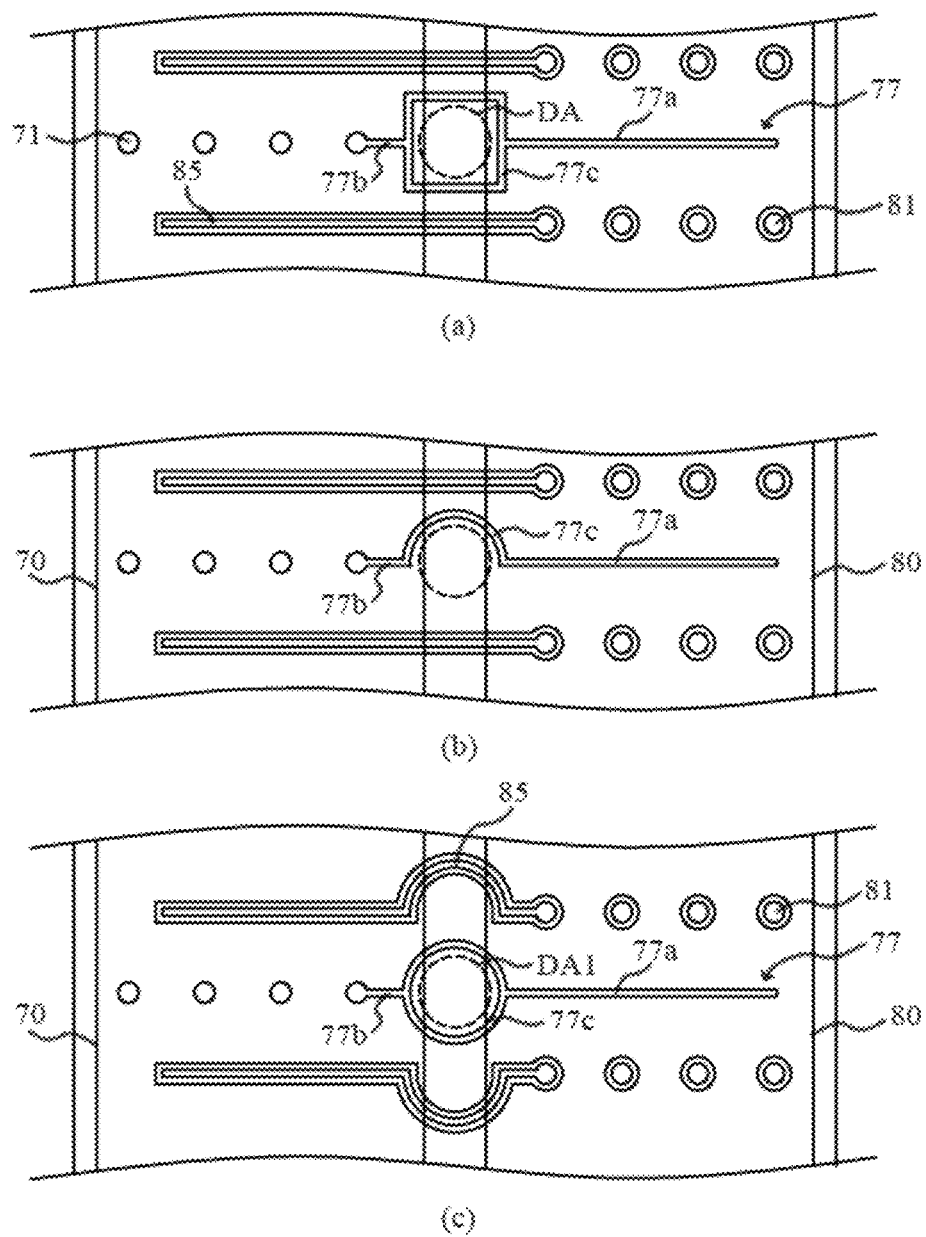
FIG. 30 is a schematic view for describing other exemplary embodiments of a semiconductor light emitting device according to the present disclosure.

FIG. 30 is a schematic view for describing other exemplary embodiments of a semiconductor light emitting device according to the present disclosure. Referring to FIG. 30a, extendable electrodes 77a, 77b, 77c include a first finger 77a, a second finger 77b and an annular third finger 77c. The annular third finger 77c may have a variety of shapes including a quadrangular shape. Alternatively, the third finger 77c may have a semicircular shape as shown in FIG. 30b. Moreover, there may be provided an additional extendable electrode 85 (a first finger electrode as part of a plurality of first finger electrodes), which has a shape for bypassing in accordance with the shape of the annular third finger 77c.

Figure 31:
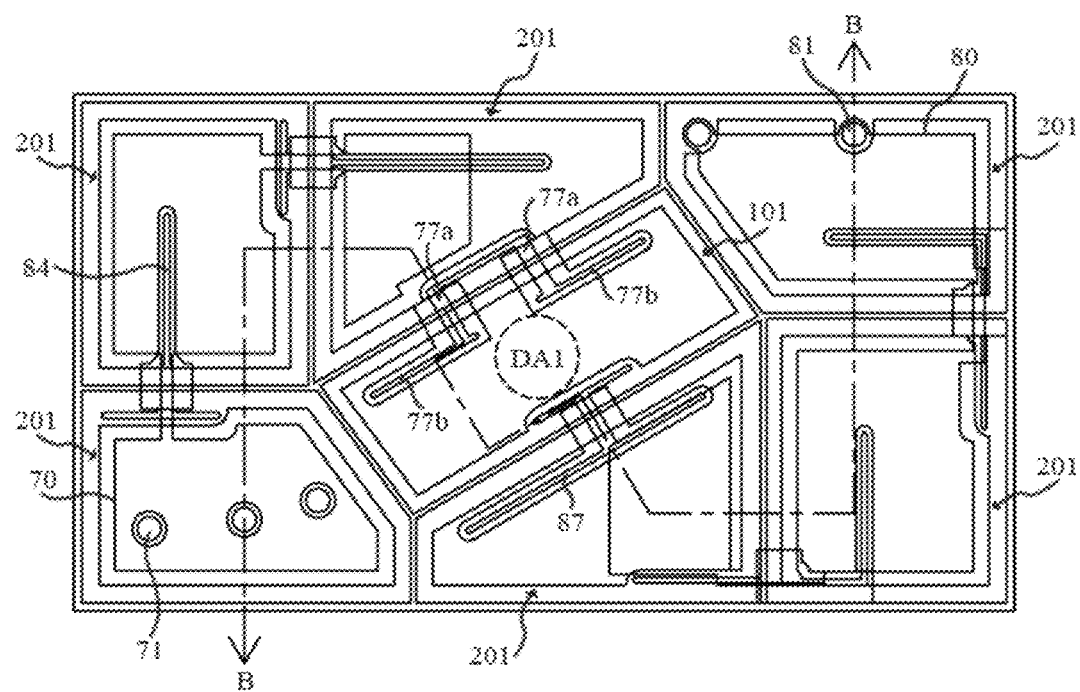
FIG. 31 is a schematic view for describing another exemplary embodiment of a semiconductor light emitting device according to the present disclosure.
Figure 32:
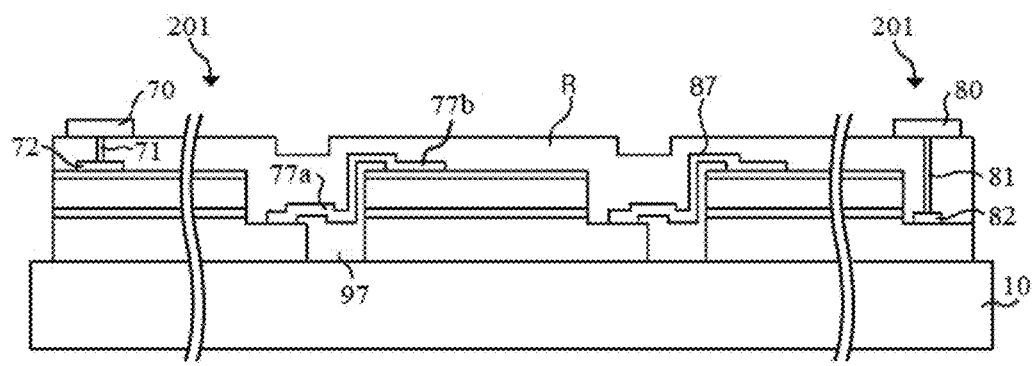
FIG. 32 illustrates a cross-sectional view taken along B-B line in FIG. 31.

FIG. 31 is a schematic view for describing another exemplary embodiment of a semiconductor light emitting device according to the present disclosure, and FIG. 32 illustrates a cross-sectional view taken along B-B line in FIG. 31. IN this exemplary embodiment, the semiconductor light emitting device includes a plurality of light-emitting cells 101, 201. Each light-emitting cell has a plurality of semiconductor layers 30, 40, 50. These semiconductor layers 30, 40, 50 are formed on a substrate 10, and etched to form a plurality of light-emitting cells 101, 201 to obtain individual, separated light-emitting cells 101, 201. The plurality of light-emitting cells 101, 201 includes a central light-emitting cell 101 arranged in an impact area DA1, and a plurality of peripheral light-emitting cells 201 arranged about the central light-emitting cell 101. In this exemplary embodiment, the semiconductor light emitting device has a quadrangular shape as seen in the top view, and the impact area DA1 is located at the point of intersection of two diagonal lines of the quadrangle. As mentioned above, the plurality of peripheral light-emitting cells 201 are arranged about the central light-emitting cell 101 to surround it. Each peripheral light-emitting cell 201 opposite to the central light-emitting cell 101 has a lateral face formed correspondingly to the outline of a lateral face of the central light-emitting cell 101. An insulating reflective film R is provided to cover the plurality of light-emitting cells 101, 201 and spacing therebetween, and serves to reflect light from the active layer 40. A first electrode 80 is formed on an insulating reflective film R covering one of the plurality of peripheral light-emitting cells 201, and a second electrode 70 is formed on an insulating reflective film covering another one of the plurality of peripheral light-emitting cell 201. In addition, there are provided a first electrical connection 81 that passes through the insulating reflective film R to electrically communicate the first semiconductor layer 30 and the first electrode 80, and a second electrical connection 71 that passes through the insulating reflective film R to electrically communicate the second semiconductor layer 50 and the second electrode 70.

In this exemplary embodiment, extendable electrodes 77a, 77b include a first finger 77a and a second finger 77b. The first finger 77a climbs up from the lateral faces onto the edges of the plurality of semiconductor layers 30, 40, 50 of the central light-emitting cell 101. The second finger 77b is stretched in a bent form from the first finger 77a to avoid the impact area DA1. The first finger 77a is electrically connected to the first semiconductor layer 30 of the peripheral light-emitting cell 201 on the side of the first finger 77a, and the second finger 77b is electrically connected to the second semiconductor layer 50 of the central light-emitting cell 101. The second semiconductor layer 50 of the peripheral light-emitting cell 201 opposite to the first finger 77a is electrically connected to the first semiconductor layer 30 of the central light-emitting cell 101 by means of a center connecting electrode 87. Neighboring peripheral light-emitting cells are connected in series by means of a peripheral connecting electrode 84. In this way, the plurality of light-emitting cells 101, 201 are connected in series. The second finger 77b of the extendable electrodes 77a, 77b does not stretch straightly or directly from one side edge to the other side edge of the central light-emitting cell 101, but is bent or curved to avoid the impact area DA1. These two extendable electrodes 77a, 77b are arranged on either side of the impact area DA1, respectively, and configured to avoid the impact area DA1 while ensuring sufficient current spreading.

Figure 33:
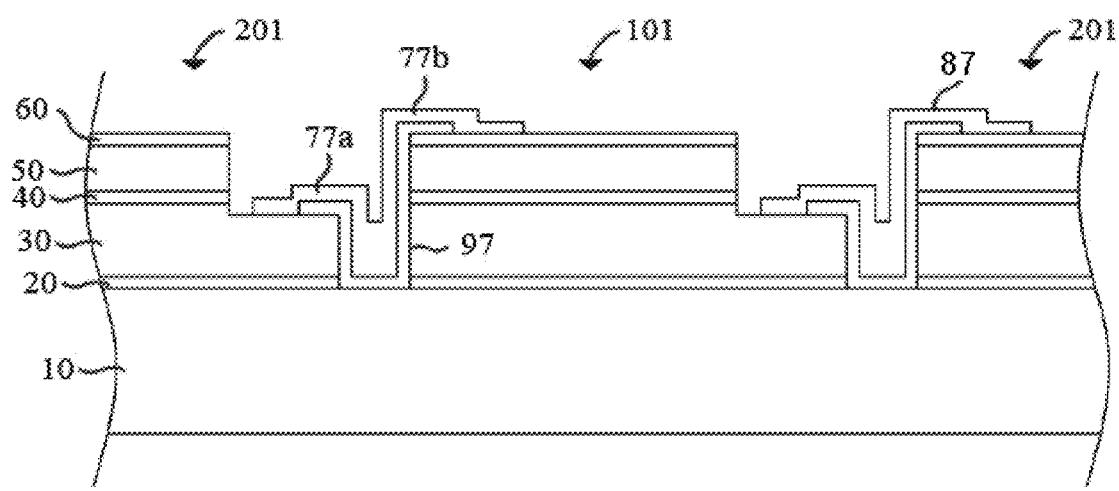
FIG. 33 illustrates another cross-sectional view taken along B-B line in FIG. 31.

FIG. 33 illustrates another cross-sectional view taken along B-B line in FIG. 31. The semiconductor light emitting device having a plurality of light-emitting cells 101, 201 may be a lateral type, instead of a flip-chip type. An insulator 97 is provided between the light-emitting cells 101, 201. The extendable electrodes 77a, 77b are formed on the first semiconductor layer 30 of the peripheral light-emitting cell 201, the insulator 97, the lateral face of the central light-emitting cell 101, and the light transmitting conductive film 60 of the central light-emitting cell 101, as shown in FIG. 33. This shows that the present disclosure is applicable to different types of devices from the flip-chip type of devices.

Figure 34:
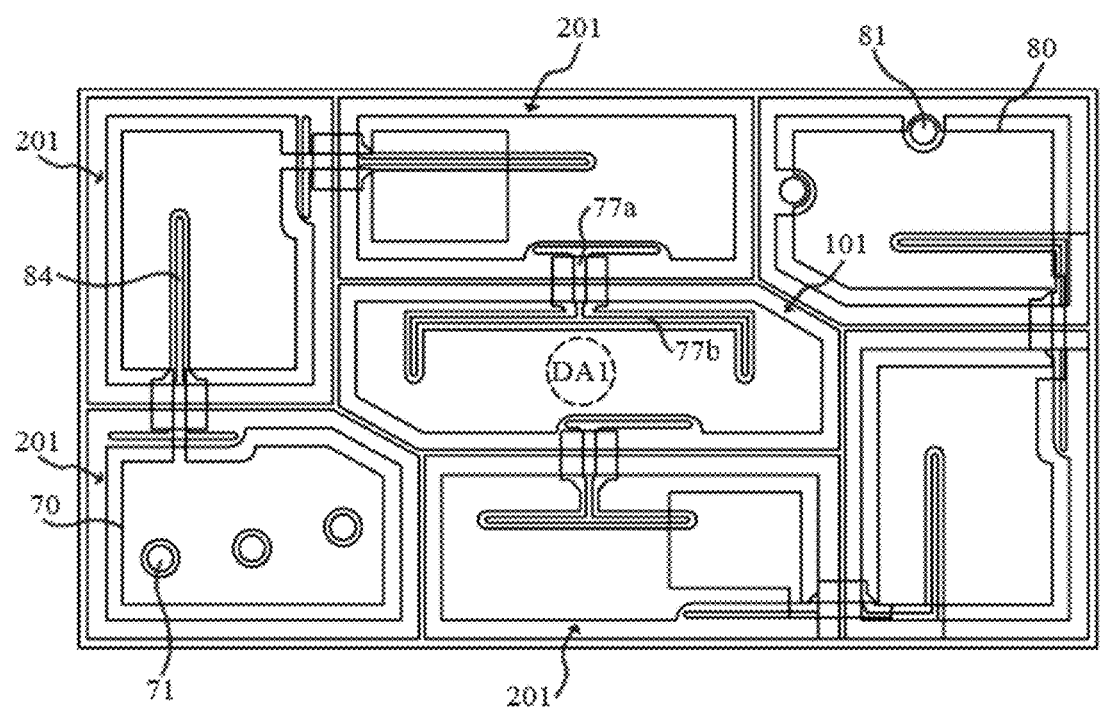
FIG. 34 is a schematic view for describing another exemplary embodiment of a semiconductor light emitting device according to the present disclosure.

FIG. 34 is a schematic view for describing another exemplary embodiment of a semiconductor light emitting device according to the present disclosure, in which the semiconductor light emitting device includes a plurality of light-emitting cells 101, 201, and extendable electrodes 77a, 77b are either bent or curved to avoid an impact area DA1. A second finger 77b of the extendable electrodes 77a, 77b is stretched in a bent form from a first finger 77a to avoid the impact area DA1.

Figure 35:
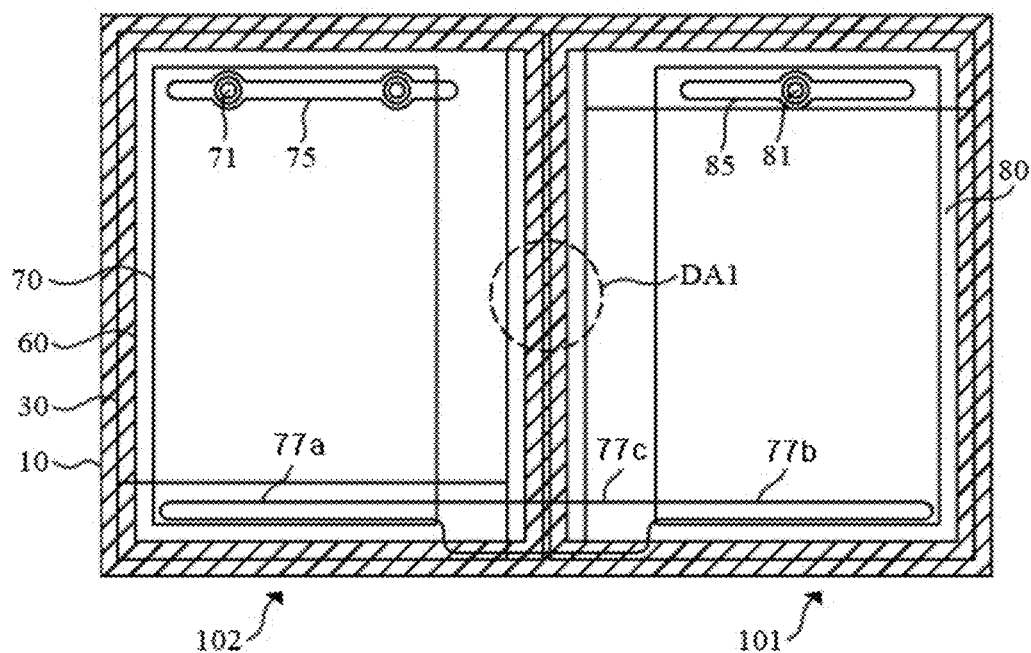
FIG. 35 is a schematic view for describing another exemplary embodiment of a semiconductor light emitting device according to the present disclosure.

FIG. 35 is a schematic view for describing another exemplary embodiment of a semiconductor light emitting device according to the present disclosure, in which the semiconductor light emitting device includes a first light-emitting cell 101 and a second light-emitting cell 102. In this exemplary embodiment, an ejection needle impacts on the spacing between the first light-emitting cell 101 and the second light-emitting cell 102. When the spacing between the first light-emitting cell 101 and the second light-emitting cell 102 is tens of micrometers (e.g. 40 μm), the impact area DA1 may be defined across the first and second light-emitting cells 101, 102. Hence, in this exemplary embodiment, extendable electrodes 77a, 77b, 77c electrically connecting the first light-emitting cell 101 and the second light-emitting cell 102 are not arranged in the middle of opposite edges of the first and second light-emitting cells 101, 102, but are arranged along other edges connected to the opposite edges of the first and second light-emitting cells 101, 102 to avoid the impact area DA1. The extendable electrodes 77a, 77b, 77c include a first finger 77a, a second finger 77b and a third finger 77c. The first finger 77a is provided along the edge of the first light-emitting cell 101, and the second finger 77b is provided along the edge of the second light-emitting cell 102. The third finger 77c which is distant from the impact area DA1 is positioned between the first light-emitting cell 101 and the second light-emitting cell 102, and configured to connect the first finger 77a and the second finger 77b.

Figure 36:
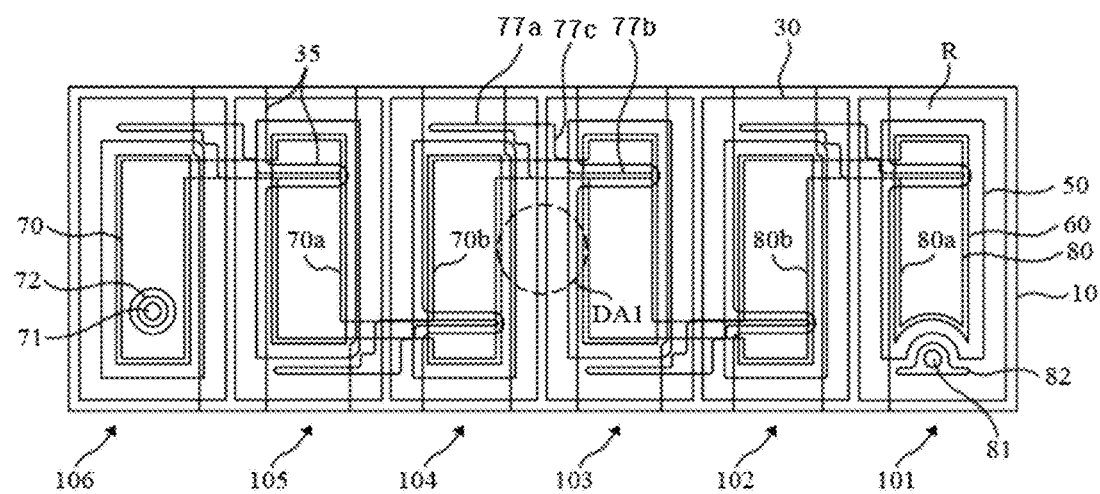
FIG. 36 is a schematic view for describing another exemplary embodiment of a semiconductor light emitting device according to the present disclosure.

FIG. 36 is a schematic view for describing another exemplary embodiment of a semiconductor light emitting device according to the present disclosure, in which the semiconductor light emitting device includes a plurality of light-emitting cells arranged on a substrate at a distance from each other, extendable electrodes 77a, 77b, 77c for electrically connecting the plurality of light-emitting cells, an insulating reflective layer R, a first electrical connection 81 and a second electrical connection 71. In this exemplary embodiment, an impact area DA1 is defined across two neighboring light-emitting cells. The extendable electrodes 77a, 77b, 77c include a first finger 77a, a second finger 77b and a third finger 77c, and are configured to avoid the impact area DA1. The first finger 77a is provided along the edge on the first light-emitting cell 101 of one light-emitting cell 101, and the second finger 77b is provided along the edge on the second light-emitting cell 102 of another light-emitting cell 102. The third finger 77c which is distant from the impact area DA1 is positioned between the first light-emitting cell 101 and the second light-emitting cell 102, and configured to connect the first finger 77a and the second finger 77b.

Figure 37:
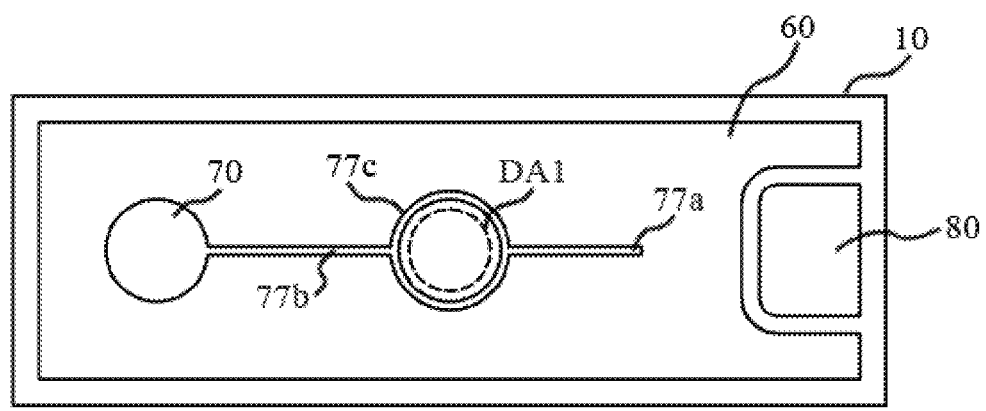
FIG. 37 is a schematic view for describing another exemplary embodiment of a semiconductor light emitting device according to the present disclosure.
Figure 38:
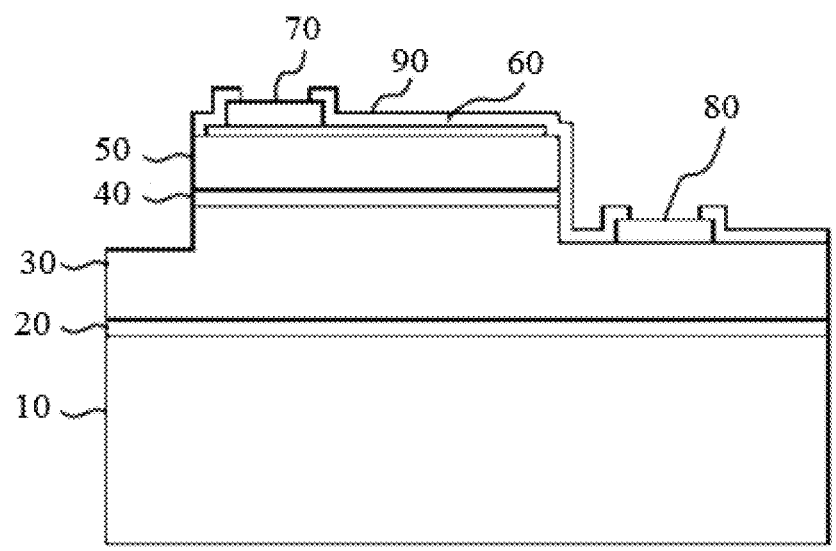
FIG. 38 illustrates another exemplary conventional Group III-nitride semiconductor light emitting device.

FIG. 37 is a schematic view for describing another exemplary embodiment of a semiconductor light emitting device according to the present disclosure, in which the semiconductor light-emitting device is a lateral-type device having a single light-emitting cell. In this exemplary embodiment, extendable electrodes 77a, 77b, 77c stretch from a second electrode 70 towards or near a first electrode 80, an annular finger 77c is provided approximately at the center of the extendable electrodes 77a, 77b, 77c, and an impact area DA1 is defined inside the annular finger 77c.

Figure 39:
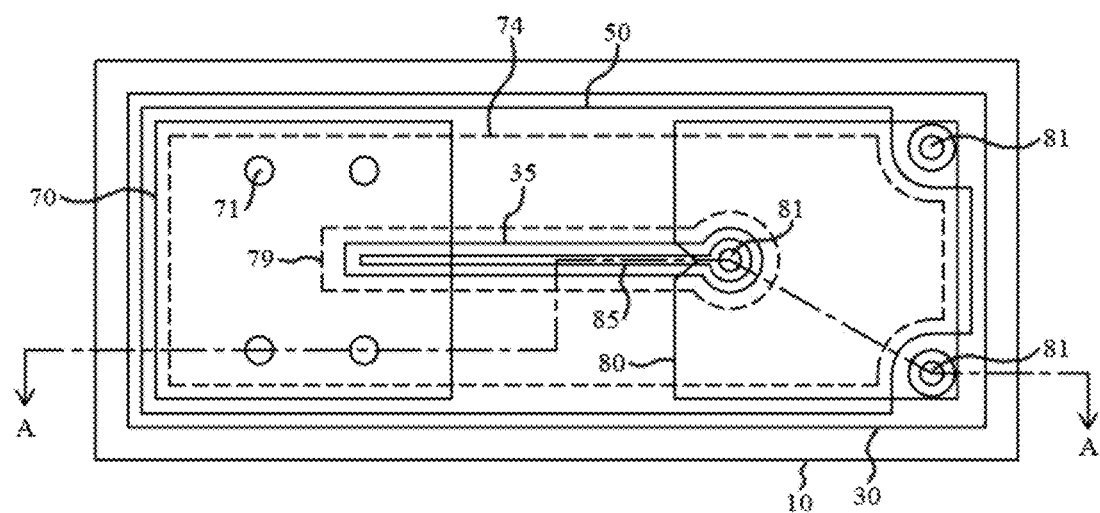
FIG. 39 is a schematic view for describing another exemplary embodiment of a semiconductor light emitting device according to the present disclosure.
Figure 40:
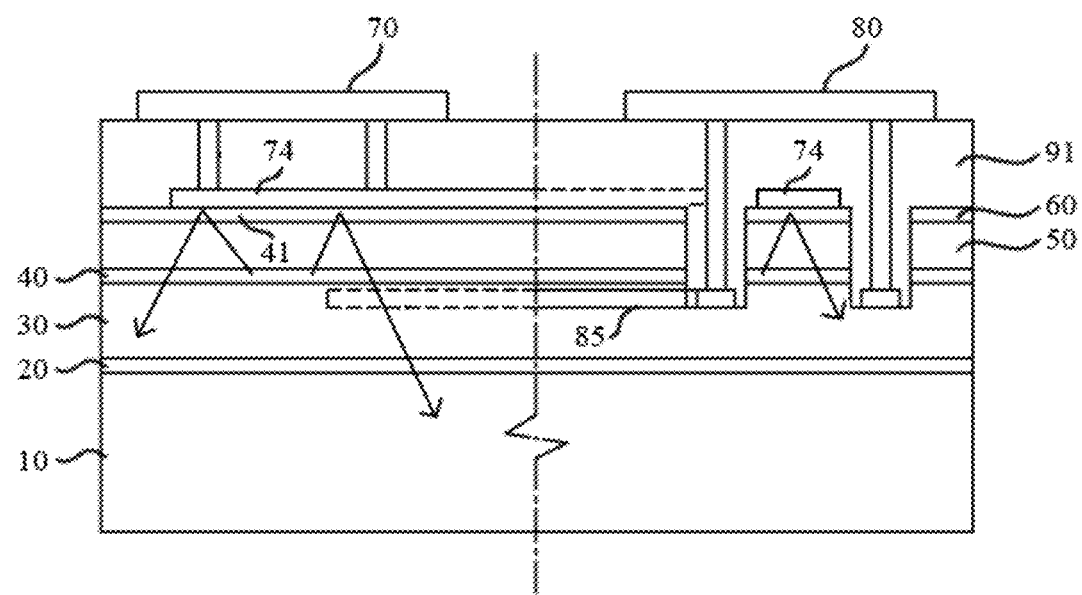
FIG. 40 illustrates a cross-sectional view taken along A-A line in FIG. 39.

FIG. 39 is a schematic view for describing another exemplary embodiment of a semiconductor light emitting device according to the present disclosure, and FIG. 40 illustrates a cross-sectional view taken along A-A line in FIG. 39, in which the semiconductor light emitting device includes a plurality of semiconductor layers 30, 40, 50, an external electrode 74, an internal electrode 85, an insulating layer 91, a first electrode 80, a second electrode 70, a first electrical connection 81 and a second electrical connection 71. The plurality of semiconductor layers 30, 40, 50 includes a first semiconductor layer 30 having a first conductivity type, a second semiconductor layer 50 having a second conductivity type different from the first conductivity type, and an active layer 40 interpositioned between the first and second semiconductor layers 30, 50 and adapted to generate light by electron-hole recombination. The external electrode 74 is in electrical communication with one of the first and second semiconductor layers 30, 50, and has an opening 79 exposing the plurality of semiconductor layers 30, 40, 50, thereby forming a closed loop. The internal electrode 85 is in electrical communication with the other of the first and second semiconductor layers 30, 50, and provided inside the opening 79. The insulating layer 91 is arranged to cover the external electrode 74 and the internal electrode 85. The first electrode 80 is formed on the insulating layer 91 and supplies electrons to the first semiconductor layer 30 through one of the external and internal electrodes 74, 85. The second electrode 70 is formed on the insulating layer 91 and supplies holes to the second semiconductor layer 50 through the other of the external and internal electrodes 74, 85. At least one of the external and internal electrodes 74, 85 is a reflective electrode that reflects light from the active layer 40. The second electrical connection 71 transfers current having the same polarity as the internal electrode 85 to the plurality of semiconductor layers 30, 40, 50 from outside the external electrode 74.

In this exemplary embodiment, the external electrode 74 above the second semiconductor layer 50 is a reflective electrode electrically connected to the second semiconductor layer 50. The internal electrode 85 is formed on a portion (n-contact area) of the first semiconductor layer 35 exposed by etching the second semiconductor layer and the active layer 40, to be in correspondence to the opening 79 in the external electrode 74. The internal electrode 85 has a finger electrode form, stretching from below the first electrode 80 to below the second electrode 70. The first electrical connection 81 (internal, first electrical connection) passes through the insulating layer 91 to electrically connect the first electrode 80 and the internal electrode 85. The second electrical connection 71 passes through the insulating layer 91 to electrically connect the second electrode 70 and the external electrode 74. Additional, first electrical connection 81 (external, first electrical connection) is provided outside the external electrode 74 to electrically connect the first semiconductor layer 30 and the first electrode 80, without going through the internal electrode 85.

In this exemplary embodiment, the first electrode 80 and the second electrode 70 are arranged opposite to each other on the insulating layer 91. As seen in the top view, the semiconductor light emitting device has a quadrangular shape with plural corners. The external, first electrical connection 81 is provided on each of two corners adjacent to the first electrode. The internal electrode 85 may include a finger stretching from below the first electrode 80 to below the second electrode 70 as described above, and a contact provided on one end of the finger, with the contact being connected to the internal, first electrical connection 81. The external electrode 74 covers the opening 79, the external, first electrical connection 81, and the second semiconductor layer 50 except for the margin from the edges of the plurality of semiconductor layers 30, 40, 50, and serves to reflect light from the active layer 40. The insulating layer 91 may be composed simply of an insulator (e.g. SiO$_2$). As an alternative, the insulating layer 91 may be a reflective film having multiple layers (e.g. a DBR). For example, the opening 79 in the external electrode 74 and the edges of the plurality of semiconductor layers 30, 40, 50 may not be covered with the external electrode 74. If this is the case, the insulating layer 91 can be adapted to act as a reflective layer to reflect any leaked light.

Figure 41:
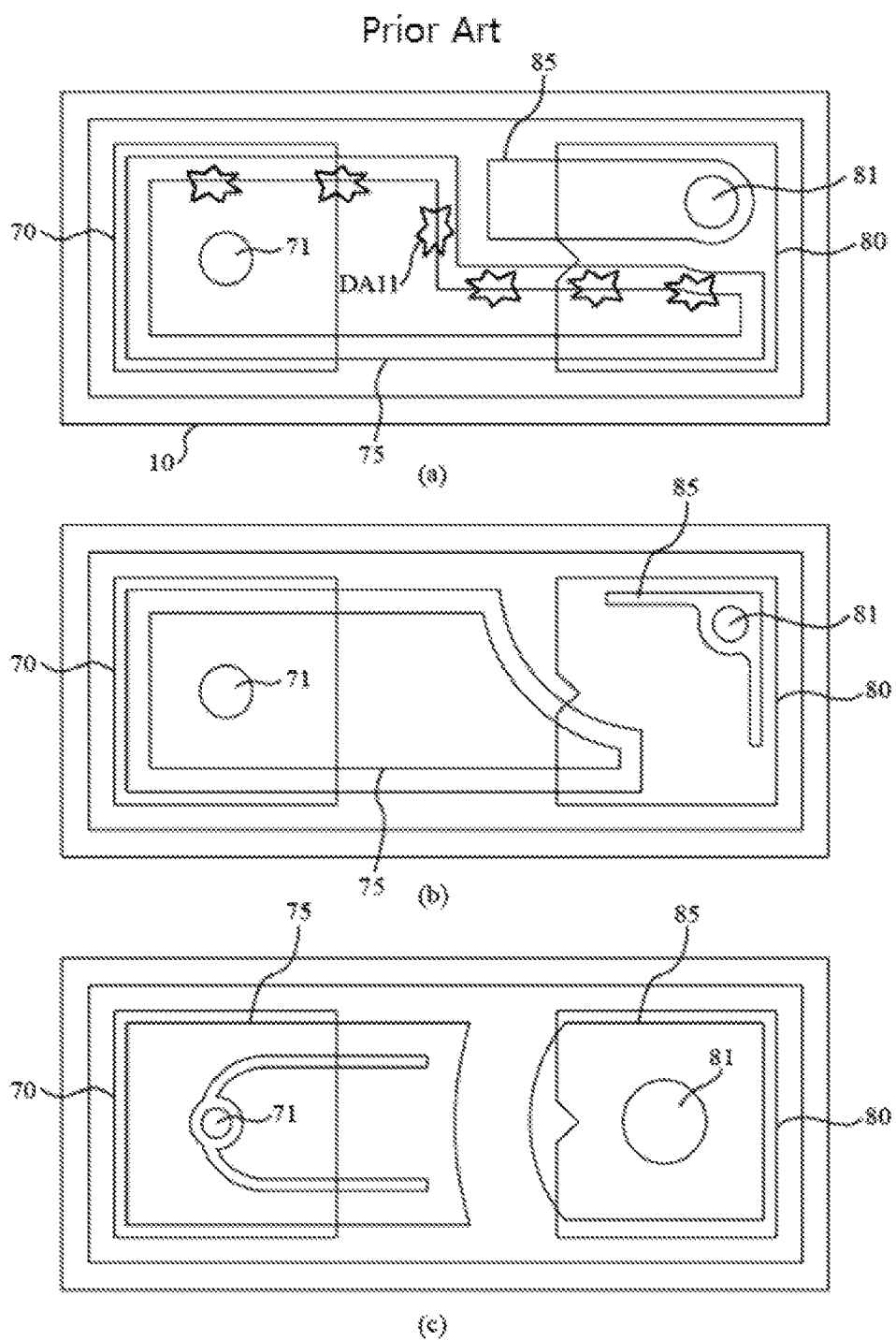
FIG. 41 illustrates a comparative embodiment.

FIG. 41 illustrates a comparative embodiment. In this embodiment, a p-side electrode 75 supplying holes to the second semiconductor layer 50 and an n-side electrode 85 formed on an mesa-etched, exposed portion of the first semiconductor layer 30 are leaned to or unequally distributed on one side, as seen in the top view. If current spreading is heavier on one side, the semiconductor light emitting device will suffer from low durability or damage problems. This phenomenon can be more serious where the edge or outline is sharply bent or the edge angle is very small. In such a design, current crowding easily occurs in a particular location or region, and the semiconductor light emitting device becomes sensitive to damage. On the other hand, in the case of the semiconductor light emitting device shown in FIG. 39, the external electrode 74 covers most of the light emitting surface, and has a closed loop shape without leaning to any location. Moreover, the internal electrode 85 is provided inside the closed loop of the external electrode 74 such that uniform current supply or uniform current spreading is accomplished. In particular, the presence of the external, first electrical connection, which is provided additionally, facilitates the supply of electrons from inside as well as from outside the external electrode 74, and possible damages caused by ESD, or instantaneous current crowing may be reduced.

The following will describe a Group III-nitride semiconductor light emitting device as an example.

The substrate 10, which may eventually be removed, is typically made of sapphire, SiC, Si, GaN or the like. The first semiconductor layer 30 and the second semiconductor layer 50 can exchange their positions each other, and these semiconductor layers are typically made of GaN in the case of Group III-nitride semiconductor light emitting devices.

The plurality of semiconductor layers 30, 40, 50 includes a buffer layer 20 a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer 20 may optionally be omitted.

The current spreading electrode 60 (e.g. ITO or Ni/Au) is preferably formed on the second semiconductor layer 50. After the first semiconductor layer 30, the active layer 40, the second semiconductor layer 50 and the current spreading electrode 60 are formed on the substrate 10, they undergo a mesa-etching process to form an n-contact area 35 as described above. The mesa-etching process may be carried out before or after the current spreading electrode 60 is formed. Optionally, the current spreading electrode 60 may be omitted.

The internal electrode 85 is formed in the n-contact area 35, and the external electrode 74 on the current spreading electrode 60 is formed in a closed shape to surround the n-contact area 35. The external electrode 74 and the internal electrode 85 each can include multiple metal layers, and further a reflective layer having a high reflectance and a contact layer demonstrating a high-performance electrical contact with the first semiconductor layer 30 or with the current spreading electrode 60.

The insulating layer 91 is arranged to cover the internal and external electrodes 85, 74, and made of a dielectric such as SiO$_2$. Alternatively, the insulating layer 91 may be a reflective film to prevent light leakage from any part that is not covered with the external electrode 74, and may include a DBR (Distributed Bragg Reflector) for example. The insulating layer 91 has an opening, and an electrical connection is formed in the opening. A first electrode 80 and a second electrode 70 may be formed together with the electrical connection.

Figure 42:
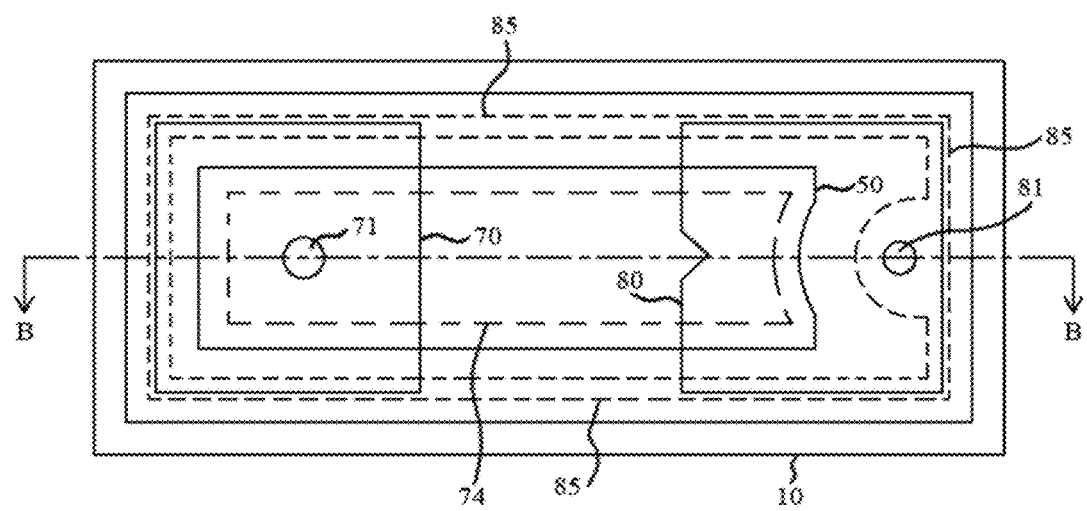
FIG. 42 is a schematic view for describing another exemplary embodiment of a semiconductor light emitting device according to the present disclosure.
Figure 43:
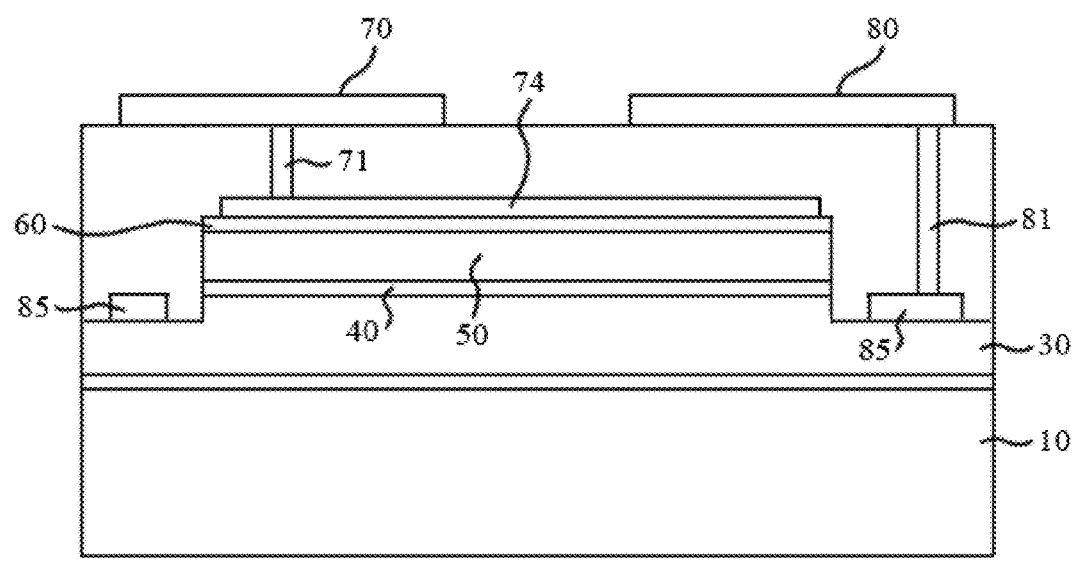
FIG. 43 illustrates a cross-sectional view taken along B-B line in FIG. 42.

FIG. 42 is a schematic view for describing another exemplary embodiment of a semiconductor light emitting device according to the present disclosure, and FIG. 43 illustrates a cross-sectional view taken along B-B line in FIG. 42. In this exemplary embodiment, an internal electrode 74 is a reflective electrode formed on a second semiconductor layer 50, and an external electrode 85 is formed on an etched portion of a first semiconductor layer 30 along the edges of a plurality of semiconductor layers 30, 40, 50. A mesa-etching process is carried out along the edges of the plurality of semiconductor layers 30, 40, 50, and the external electrode 85 having a closed loop shape is formed on the first semiconductor layer 30. As such, those semiconductor layers 30, 40, 50 which are light-emitting regions are formed inside the closed loop, and the internal electrode 74 is electrically connected to the second semiconductor layer 50 over a large area on the second semiconductor layer 50. This offers a balanced structure in terms of supplying electron and holes, and can be more advantageous to prevent damages by current crowding and to enhance ESD performance, rather than improving the brightness of a semiconductor light emitting device.

Figure 44:
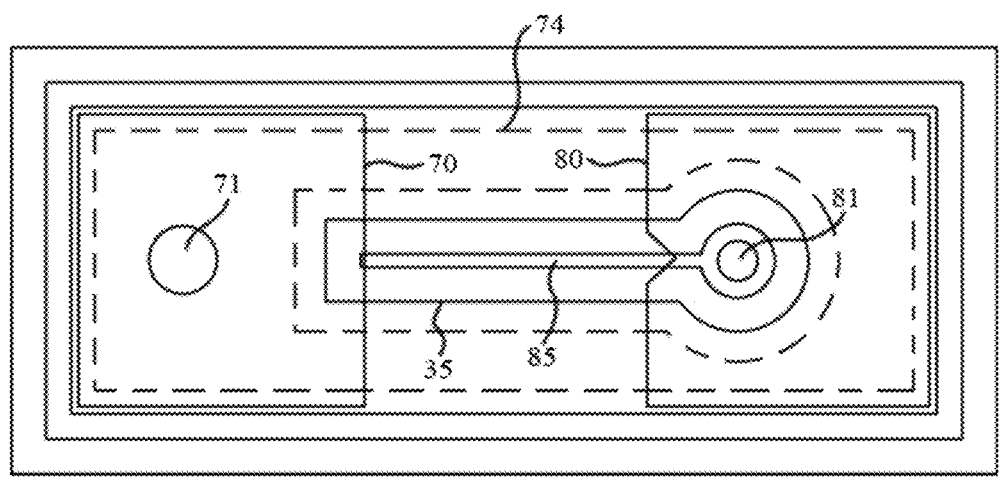
FIG. 44 is a schematic view for describing another exemplary embodiment of a semiconductor light emitting device according to the present disclosure.

FIG. 44 is a schematic view for describing another exemplary embodiment of a semiconductor light emitting device according to the present disclosure, in which an external electrode 74 having a closed loop shape is formed on a second semiconductor layer 50, and an internal electrode 85 having a finger electrode shape is formed on an etched portion of a first semiconductor layer 30. Only a first electrical connection 81 is provided inside an opening 79. The semiconductor light emitting device thus obtained has an ESD resistance and an increased reflection area without the external, first electrical connection 81.

Figure 45:
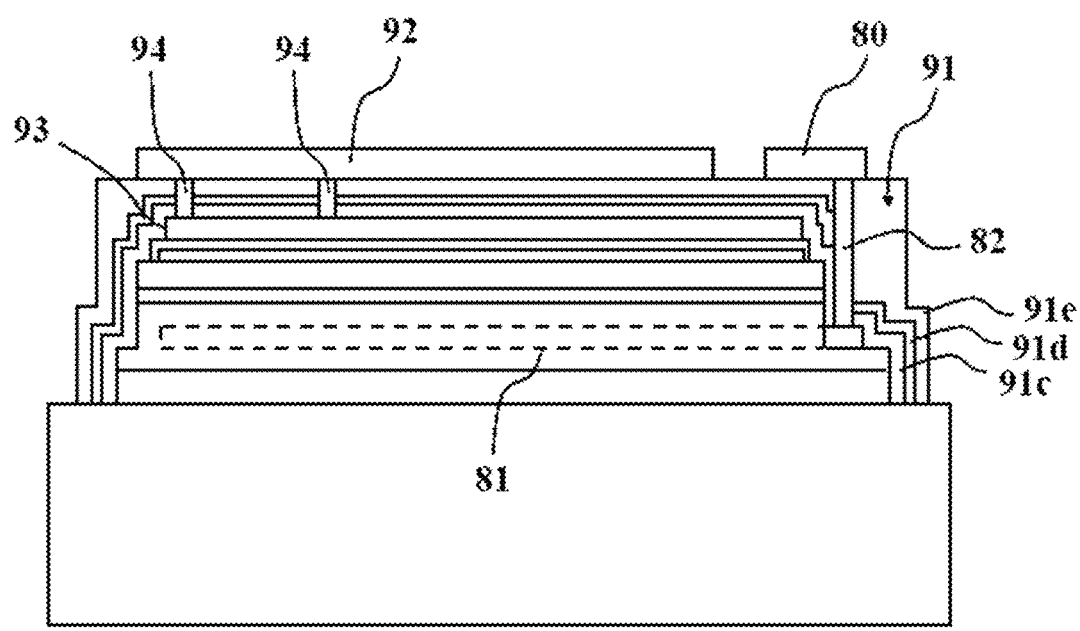
FIG. 45 is a schematic view for describing another exemplary embodiment of a semiconductor light emitting device according to the present disclosure.
Figure 46:
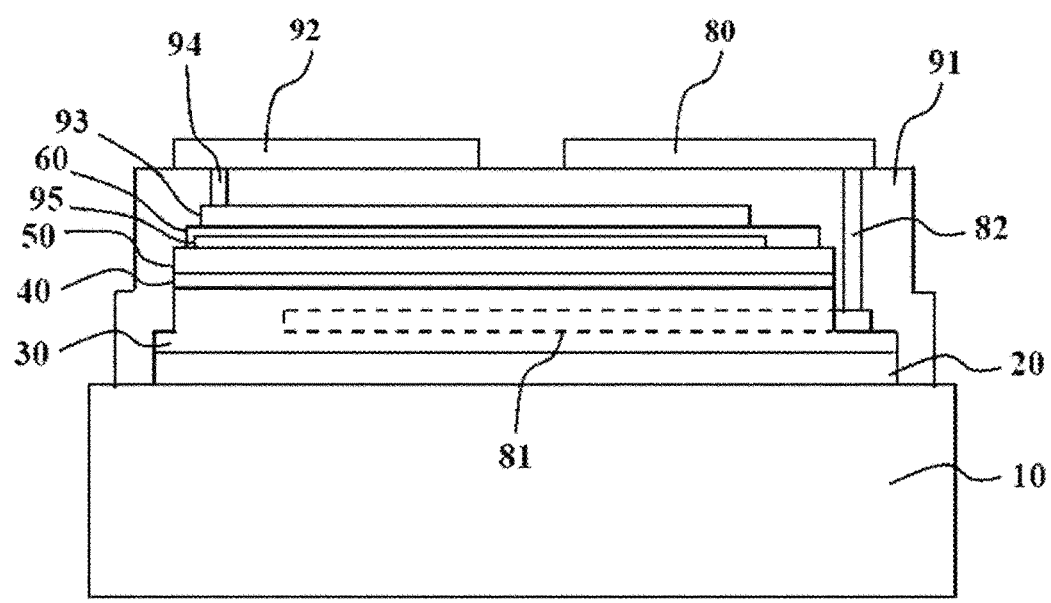
FIG. 46 is a schematic view illustrating a still further exemplary embodiment of a semiconductor light emitting device according to the present disclosure.

FIG. 45 is a schematic view for describing another exemplary embodiment of a semiconductor light emitting device according to the present disclosure, in which the semiconductor light emitting device includes a substrate, a plurality of semiconductor layers, a finger electrode, a non-conductive reflective film, an electrode and an electrical connection 94 (See FIGS. 45 and 46). The following will describe a Group III-nitride semiconductor light emitting device as an example.

The substrate 10, which may eventually be removed, is typically made of sapphire, SiC, Si, GaN or the like. The first semiconductor layer 30 and the second semiconductor layer 50 can exchange their positions each other, and these semiconductor layers are typically made of GaN in the case of Group III-nitride semiconductor light emitting devices (See FIG. 46).

The plurality of semiconductor layers 30, 40, 50 includes a buffer layer 20 a first semiconductor layer 30 (e.g. Si-doped GaN) having a first conductivity type, a second semiconductor layer 50 (e.g. Mg-doped GaN) having a second conductivity type different from the first conductivity type, and an active layer 40 (e.g. InGaN/(In)/GaN multiple quantum well structure) which is interposed between the first semiconductor layer 30 and the second semiconductor layer 50 and generates light by electron-hole recombination. Each of the plurality of semiconductor layers 30, 40, 50 may have a multilayered structure, and the buffer layer 20 may optionally be omitted.

The second semiconductor layer 50 and the active layer 40 undergo an etching process to form an n-contact area. A first finger electrode 81 is then formed in the n-contact area.

A current spreading electrode 60 (e.g. ITO or Ni/Au; See FIG. 46) is preferably formed between the second semiconductor layer 50 and the non-conductive reflective film 91. After the first semiconductor layer 30, the active layer 40, the second semiconductor layer 50 and the current spreading electrode 60 are formed on the substrate 10, they undergo a mesa-etching process to form an n-contact area as described above. The mesa-etching process may be carried out before or after the current spreading electrode 60 is formed. Optionally, the current spreading electrode 60 may be omitted.

A second finger electrode 93 is stretched on the current spreading electrode 60. As an alternative, a plurality of first finger electrodes 81 and a plurality of second finger electrodes 93 may be alternately stacked. The first finger electrode 81 and the second finger electrode 93 each can include multiple metal layers, and further a reflective layer having a high reflectance and a contact layer demonstrating a high-performance electrical contact with the first semiconductor layer 30 or with the current spreading electrode 60.

The non-conductive reflective film 91 is arranged to cover the current spreading electrode 60, the first finger electrode 81 and the second finger electrode 93, and serves to reflect light from the active layer 40 towards the substrate 10. In this exemplary embodiment, the non-conductive reflective film 91 is made of an insulating material to reduce light absorption by a metallic reflective film, and it is preferably a multilayered structure including a DBR (Distributed Bragg Reflector), an ODR (Omni-Directional Reflector) or the like.

In this exemplary embodiment, a first electrode 80 and a second electrode 92 are provided on the non-conductive reflective film 91. As an alternative, a metallic reflective film may be provided on the second semiconductor layer 50, and the second electrode may be provided on the metallic reflective film. Furthermore, the first electrode 80 may be in electrical communication with a mesa-etched exposed portion of the first semiconductor layer 30.

The light absorption barrier 95 can be made up of $SiO_2$, $TiO_2$ or the like, and arranged in correspondence to the second finger electrode 95 between the second semiconductor layer 50 and the current spreading electrode 60. It may only serve to reflect a portion or all of the light generated from the active layer 40, or to prevent the current from flowing down directly from the second finger electrode 95.

The non-conductive reflective film 91 has a multilayered structure including, for example, a dielectric film 91c, a DBR 91d, and a clad layer 91e. The presence of the dielectric film 91c contributes improved step coverage and stable manufacturing of a DBR, and light reflection can also benefit therefrom. The dielectric film 91c is preferably made of $SiO_2$. The DBR 91d is formed on the dielectric film 91c and may be composed of a stack of alternating $SiO_2/TiO_2$, $SiO_2/Ta_2O_2$, or $SiO_2/HfO$ pairs, in which the $SiO_2/TiO_2$ demonstrates a high blue-light reflection efficiency, while $SiO_2/Ta_2O_2$ or $SiO_2/HfO$ demonstrates a high UV-ray reflection efficiency. The clad layer 91e can also be made of a metal oxide such as $Al_2O_3$, a dielectric film 91c such as $SiO_2$ or SiON, or other material such as MaF or CaF.

FIG. 46 is a schematic view illustrating a still further exemplary embodiment of a semiconductor light emitting device according to the present disclosure. In particular, it shows one example of an electrode part including a lower electrode, an upper electrode and an electrical connecting part for connecting the electrodes via an opening. At least one of an n-side electrode 80 (one example of the upper electrode in a first electrode part) and a p-side electrode 92 (one example of the upper electrode in a second electrode part), or preferentially both are soldering layers either made of Sn or containing Sn.

Figure 47:
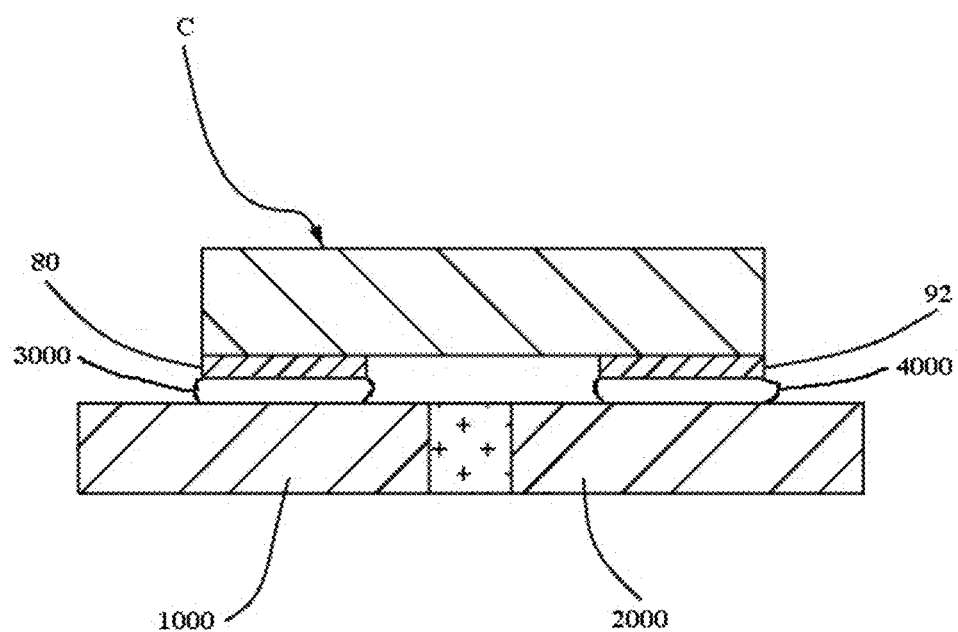
FIG. 47 is a schematic view illustrating an example of a state where the semiconductor light emitting device proposed in FIG. 46 is fixed to an external electrode.

FIG. 47 is a schematic view illustrating an example of a state where the semiconductor light emitting device proposed in FIG. 46 is fixed to an external electrode. Here, an n-side electrode 80 and a p-side electrode 92 of the semiconductor light emitting device or of a chip C of the semiconductor light emitting device shown in FIG. 46 are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C. The external electrodes 1000, 2000 are provided with a solder material 3000, 4000, respectively, and thus the n-side electrode 80 and the p-side electrode 92 are fixed to the external electrodes 1000, 2000 by soldering. As such, in the embodiment proposed in FIG. 47, the n-side and p-side electrodes are fixed to the external electrodes 1000, 2000 by soldering.

Meanwhile, the semiconductor light emitting device can be broken during eutectic bonding. This embodiment is intended to provide a solution for bonding processes in general including eutectic bonding by using a solder (a Sn solder, a Pb solder or the like). However, considering that a semiconductor light emitting device is manufactured using Au for top layers of the n-side and p-side electrodes 80, 90, Au or Ag may optionally be used in consideration of conductivity, with Au being usually chosen over oxidation-sensitive Ag. The inventors surprisingly discovered that when Au is used for a soldering layer of the electrode 80 or 92 of the semiconductor light emitting device to be soldered with a solder material 3000, 4000 provided in the external electrode 1000, 2000, bonding strength during soldering is not uniform. However, this problem was solved by using a Sn-based soldering layer.

Figure 48:
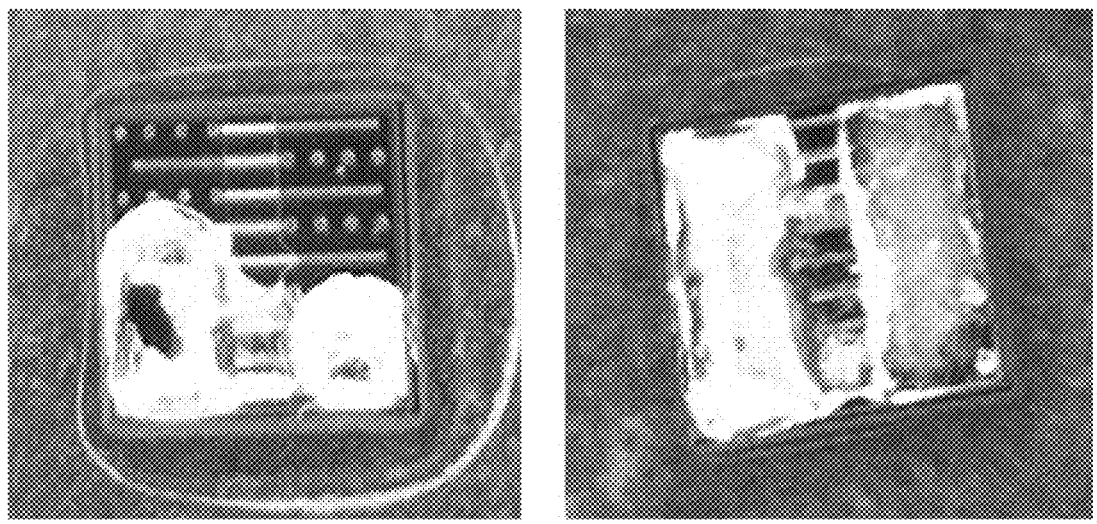
FIG. 48 shows photos of liquid tin spread on gold and tin at their own respective degrees.

FIG. 48 shows photos of liquid tin spread on gold and tin at their own respective degrees, in which the photo on the left hand side shows liquid tin spread on gold, and the photo on the right hand side shows liquid tin spread on tin. As can be seen in both photos, the degree of spread between Sn and Sn is greater than the degree of spread between Sn and Au. For an experiment, the reflow temperature (temperature for melting a solder) was set at 275° C., the reflow time was set at no more than 3 seconds, and an amount of a solder material was ⅓ of the area of a bump (electrode)).

While there is no particular limitation on the thickness of the soldering layers 80*a* and 92*a*, it is preferential to have a thickness of at least 5000 Å, more preferentially at least 1 μm, for secure joint with the solder material 3000, 4000. For example, the soldering layers 80*a* and 92*a* may have a thickness of 1.8 μm, 2.4 μm.

Figure 55:
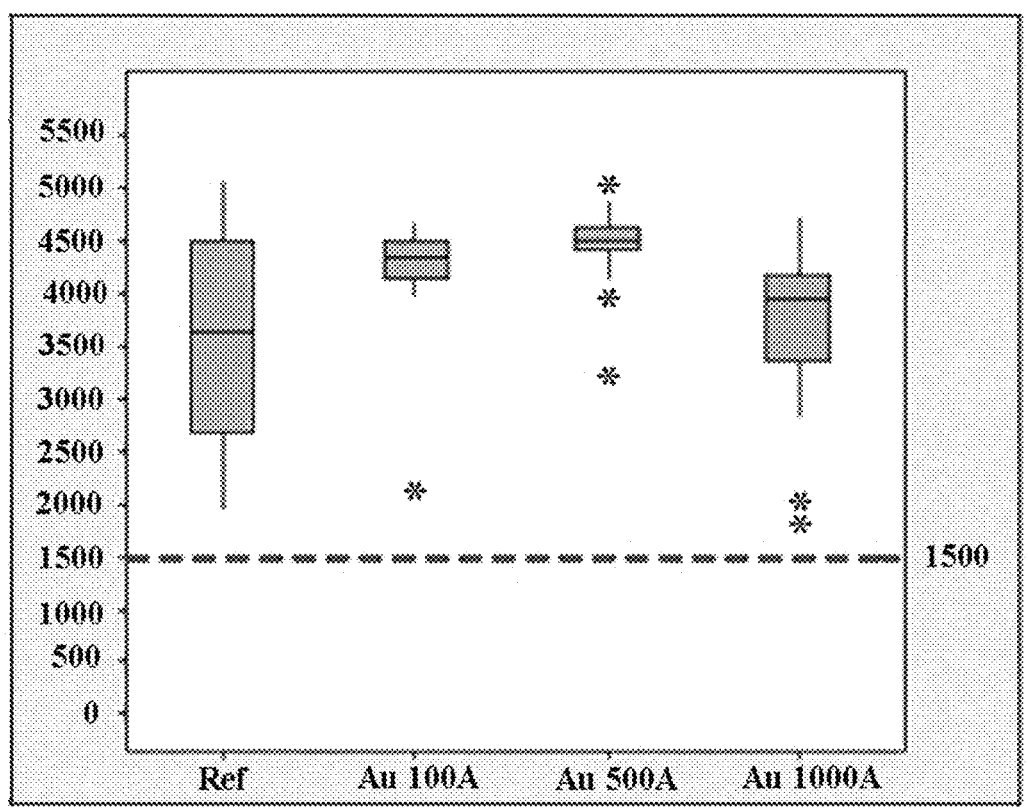
FIG. 55 is a graph showing the change in coupling force as a function of the thickness of an anti-oxidation layer.

FIG. 55 shows the change in bonding strength of soldering. A chip bonded by soldering and then pressed was subjected to a DST (Die Shear Test) for measuring the bonding strength. In the test, the bonding strength value of an Au soldering layer free of Sn was used as a reference value Ref, and a change in the bonding strength (vertical axis) as a function of thickness of Au (horizontal axis) which is a thin anti-oxidation layer formed on the Sn soldering layer was tested. The bonding strength increased as Au thickness increased from 100 Å to approximately 500 Å, and then it got decreased when the Au thickness became greater than 1000 Å. Therefore, as compared to the case where the soldering layer is made of Au only, the bonding strength of the Sn soldering layer with the overlaid Au as an antioxidation layer which is suitably not too thick was greater. In particular, when the thickness of the Au as an antioxidation layer is 100 Å, the bonding strength may become slightly lower than the 500 Å thick Au. However, its change is very moderate, and most of the bonding strengths are equal to or greater than the Ref. Again, it is discovered from the data in FIG. 55, as compared to the Ref of the soldering layer made of Au only, the bonding strength of the soldering layer made of Sn only or containing Sn without any anti-oxidation layer is greater. Thus, it is understood that Au is not much favorable material to the bonding strength, even if Au is well compatible with Sn, the main component of the solder in this embodiment.

With the soldering layer made of the same material as the main component of the solder, a larger area can be formed for the solder, as illustrated in FIG. 48, and the resulting increased spreadability allows for an improved bonding strength even when an amount of the solder is reduced. When a reduced amount of the solder is used, the possibility of the fracture occurring in the semiconductor light emitting device due to thermal expansion can be lowered.

When at least one of the n-side electrode 80 and the p-side electrode 92 is provided with the (thick) soldering layer 80*a*, 92*a*, a smaller amount of the solder material 3000, 4000 may be used, and the solder material 3000, 4000 may not burst much from between the n-side electrode 80 and the p-side electrode 92, or from the sides of the semiconductor light emitting device during soldering. From these perspectives, it would be preferential to make the soldering layer 80*a*, 90*a* thicker, but not too thick up to the point where thermal resistance can be increased. Therefore, a suitable range that is acceptable in the semiconductor process is between 1 and 5 μm. While the soldering layer 80*a*, 92*a* may contain Sn as a single ingredient, it may as well contain other additional materials besides Sn as an active ingredient, which are considered to be necessary in consideration of the solder material 3000, 4000. Example of the solder material 3000, 4000 may include Sn, PbSn, PbSnAg, PbInAb, PbAg, SnPbAg, PbIn, CdZn and so on. In terms of a melting point, a solder material having a melting point between 250 and 300° C. may be used.

In FIG. 46, the n-side electrode 80 and the p-side electrode 92 are formed on the non-conductive reflective film 91 in a manner that they cover at least 50% of the area of the non-conductive reflective film 91 in order to increase the soldering efficiency. Needless to say, the n-side electrode 80 and the p-side electrode 92 of this structure may be used as the top layer structure of the electrode including conductive reflective films 901, 902 and 903.

Figure 49:
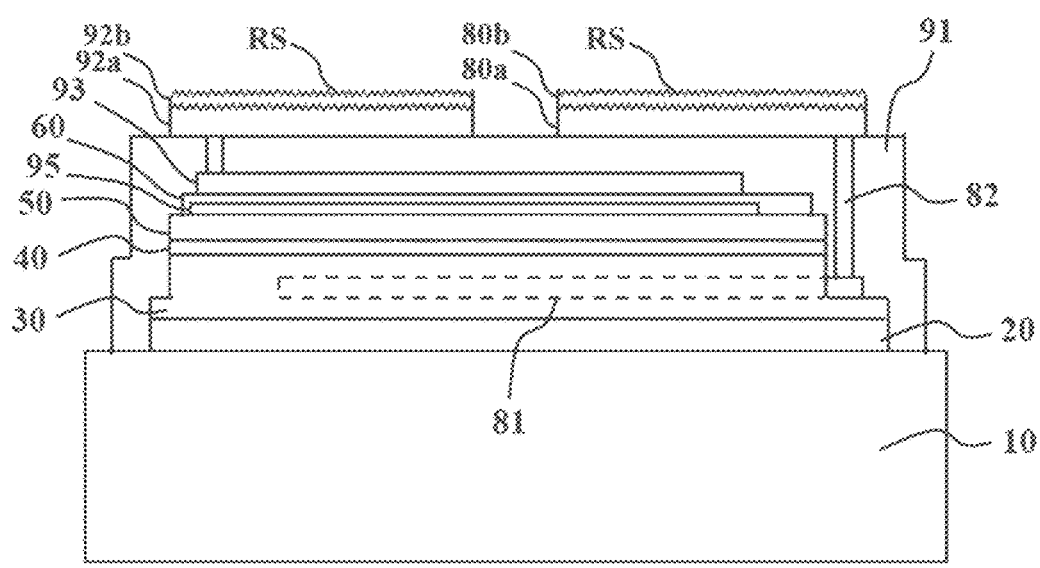
FIG. 49 is a schematic view illustrating a still further exemplary embodiment of a semiconductor light emitting device according to the present disclosure.

FIG. 49 is a schematic view illustrating a still further exemplary embodiment of a semiconductor light emitting device according to the present disclosure, in which soldering layers 80 and 92 have a rough surface RS instead of a flat surface. During soldering, the RS will have an increased contact area with the solder material 3000, 4000 and promote fast energy transfer to the soldering layers 80 and 92. The RS may be obtained during the formation of the soldering layers 80 and 92 without a separate process. In this embodiment, the soldering layers 80 and 92 are formed by E-beam evaporation.

Figure 50:
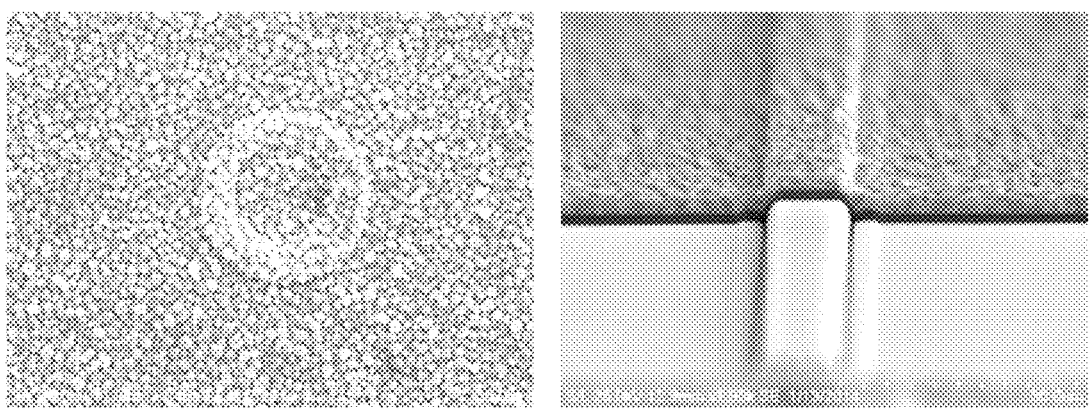
FIG. 50 shows photos of rough surfaces formed on the electrode according to the present disclosure.

FIG. 50 shows photos of rough surfaces formed on the electrode according to the present disclosure, in which the photo on the left hand side was taken from the top, and the photo on the right hand side was taken from the side. These photos show surfaces when the deposition thickness was about 4 μm, and each projection has a size of 15-25 μm. Roughness may be modified by adjusting deposition conditions such as deposition rate (e.g. 10 Å/sec).

Figure 51:
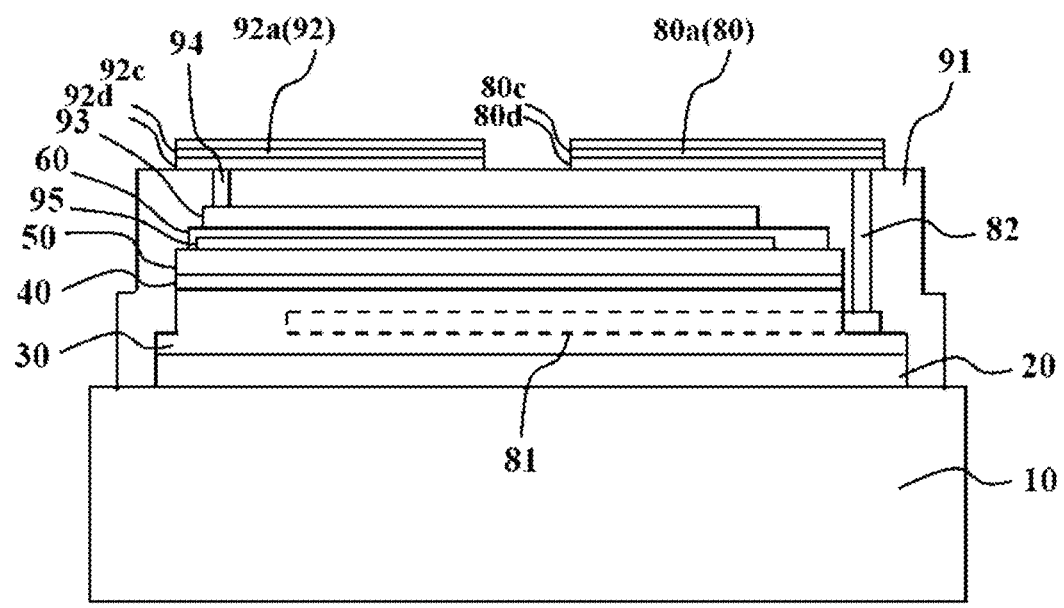
FIG. 51 is a schematic view illustrating a still further exemplary embodiment of a semiconductor light emitting device according to the present disclosure.

FIG. 51 is a schematic view illustrating a still further exemplary embodiment of a semiconductor light emitting device according to the present disclosure, in which at least one of the n-side electrode 80 and the p-side electrode 92 has a diffusion barrier 80*c*, 92*c* below a solder layer 80*a*, 92*a* in order to prevent a solder material 3000, 4000 from permeating into a plurality of semiconductor layers 30, 40, 50. This diffusion barrier 80*c*, 92*c* may be made of Ti, Ni, Cr, W, TiW or the like.

If necessary, at least one of the n-side electrode 80 and the p-side electrode 92 may have an additional layer 80*d*, 92*d*. On the non-conductive reflective film 91, the n-side electrode 80 and the p-side electrode 92 may be formed simultaneously with electrical connecting parts 82 and 94, and the additional layers 80*d* and 92*d* may be formed as light reflection layers such that light generated in the active layer 40 is reflected from the top of the non-conductive reflective film 91 and the electrical connecting parts 82 and 94. Here, the additional layers 80*d* and 92*d* may be made of Al, Ag or the like. Moreover, the additional layers 80*d* and 92*d*, which are the lowermost layers of the n-side electrode 80 and the p-side electrodes 92, may have a contact layer such as Cr or Ti, so as to have an increased contact force. Alternatively, both the light reflection layer and the contact layer may be provided.

The soldering layers 80*a* and 92*a*, the diffusion barriers 80*c* and 92*c* and the additional layers 80*d* and 92*d* may have the same area in their stacked structure as in FIG. 51, they may also be stacked with different areas. That is, after the diffusion barriers 80*c* and 92*c* and the additional layers 80*d* and 92*d* are formed all over the surface, the soldering layers 80*a* and 92*a* may be partially formed thereon. The diffusion barriers 80*c* and 92*c* and/or the additional layers 80*d* and 92*d* (in case the additional layers are light reflection layers) may be designed to have a certain minimum thickness such that the non-conductive reflective film 91 and/or the plurality of semiconductor layers 30, 40, 50 are prevented from breaking during soldering. However, some Al and Ag light reflection layers tend to spread out if they are too thick. To be able to protect the non-conductive reflective film 91 and/or the plurality of semiconductor layers 30, 40, 50 from breakage, the light reflection layers and the diffusion barriers 80*c*, 92*c* are therefore stacked alternately and repeatedly one on top of the other. For instance, they can be alternately and repeatedly stacked (Al (5000 Å)-Ni (3000 Å)-Al (5000 Å)-Ni (3000 Å)), each layer at a thickness of at least 1 µm. Breakage can be prevented better by increasing the thickness of each layer in the stack to 2 µm or more.

Figure 52:
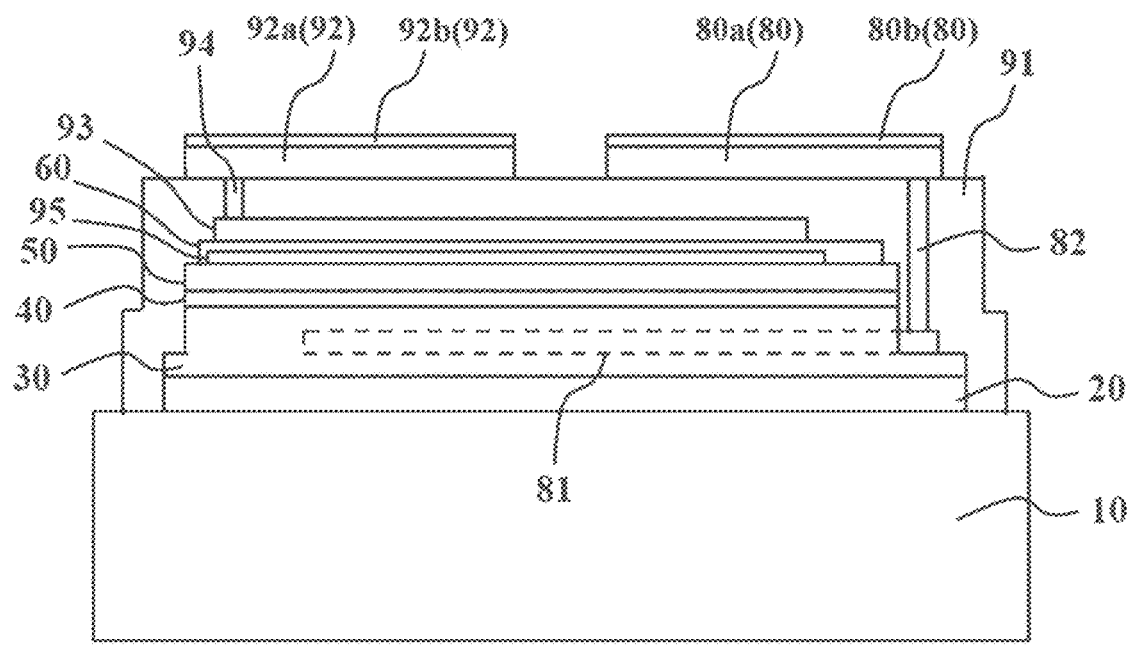
FIG. 52 is a schematic view illustrating a modified form of the semiconductor light emitting device proposed in FIG. 46.
Figure 53:
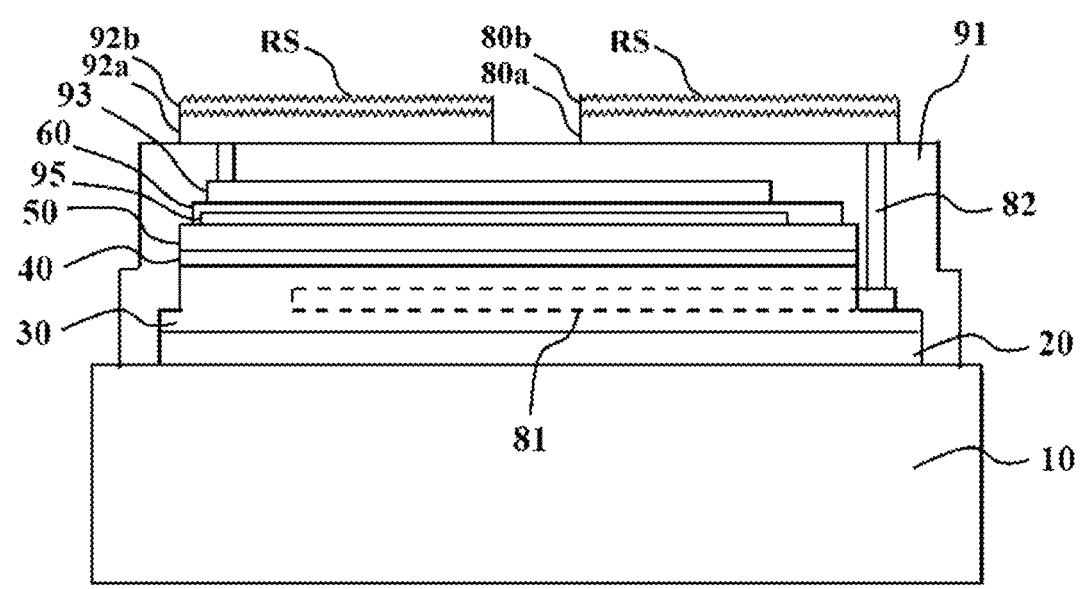
FIG. 53 is a schematic view illustrating a modified form of the semiconductor light emitting device proposed in FIG. 49.
Figure 54:
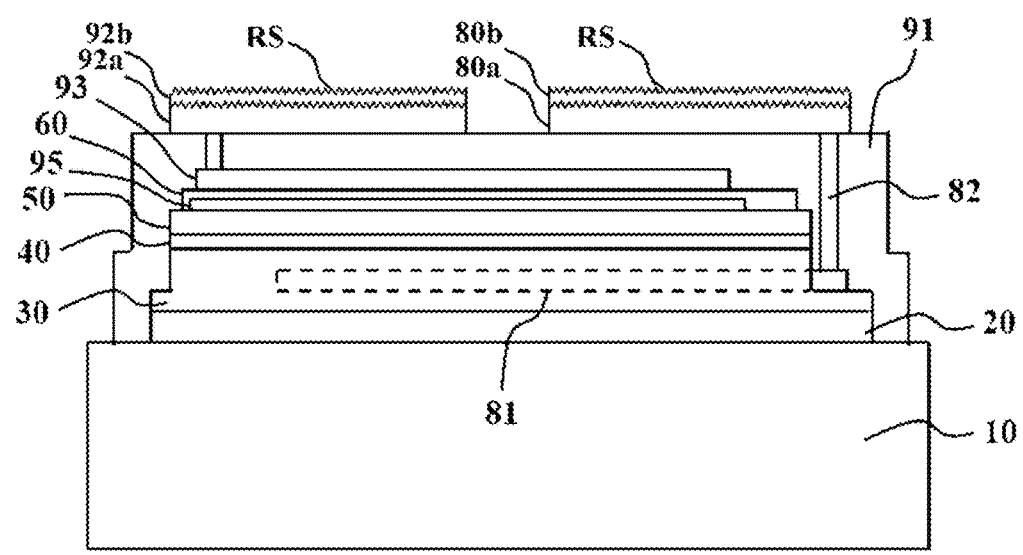
FIG. 54 is a schematic view illustrating a modified form of the semiconductor light emitting device proposed in FIG. 51.

FIG. 52 is a schematic view illustrating a modified form of the semiconductor light emitting device proposed in FIG. 46, FIG. 53 is a schematic view illustrating a modified form of the semiconductor light emitting device proposed in FIG. 49, and FIG. 54 is a schematic view illustrating a modified form of the semiconductor light emitting device proposed in FIG. 51. If one prepares the top layer of an electrode of a semiconductor light emitting device using Sn and then tries to solder it on site where it is attached the an external electrode 1000, 2000, impurities produced from oxidation for example may be present on Sn, causing problems in soldering and electrical conductivity. To resolve this, one may complete the manufacture of a semiconductor light emitting device first, coat a corresponding metal such as Sn or Au with a solder material while bringing the completely manufactured device into contact with the external electrode 1000, 2000, and solder them immediately on the spot. As an alternative way, as can be seen in FIGS. 52, 53, 54, a thin anti-oxidation layer 80b, 92b may be applied onto the Sn-based soldering layer 80a, 92a, and thereby preventing oxidation of Sn.

The anti-oxidation layer 80b, 92b may be made of a highly antioxidant and highly conductive metal such as Au or Pt. However, since soldering is carried out between the solder material 3000, 4000 and the soldering layer 80a, 92a, the anti-oxidation layer 80b, 92b should be sufficiently thick (but not too thick) enough to prevent oxidation of the soldering layer 80a, 92a. This may vary depending on a metal used. For example, when 1 µm-thick Au is used and serves as a soldering layer, the aforementioned problem may still occur. Therefore, the anti-oxidation layer 80b, 92b preferentially has a thickness of 5000 Å or less.

Referring back to FIG. 55, the change in bonding strength with the thickness of the anti-oxidation layer 80b, 92b is graphically shown. In the DST (die shear test) used, the coupling force of an Au soldering layer free of Sn was obtained and used as a reference value Ref. Then a Sn soldering layer 80a, 92b made of Sn only, and Sn soldering layers with an overlaid thin anti-oxidation layer 80b, 92b made of Au of different thicknesses were tested to find out how the coupling force changes as a function of the thickness of Au. It turned out that the bonding strength keeps increasing until Au thickness reaches 500 Å, and then it gets decreased when Au thickness exceeds this level. Therefore, the bonding strength of the soldering layers which are made of Sn only or contain Sn falls between Ref and the bonding strength of 100 Å Au-overlaid Sn soldering layer. That is, a Sn soldering layer or a Sn-based soldering layer showed an increased bonding strength as compared with the Au soldering layer. The best bonding strength was found in 500 Å Au-overlaid Sn soldering layer, but then the bonding strength has decreased as the thickness of Au increases. Based on this experiment, and in consideration of the material (e.g. Au, Pt or the like) of the anti-oxidation layer and the solder material used, it is more preferential that the anti-oxidation layer 80b, 92b would have a thickness of 1000 Å or less.

Referring back to FIG. 47, FIG. 47 is a schematic view illustrating an example of a state where the semiconductor light emitting device is fixed to an external electrode. In particular, the n-side electrode 80 and the p-side electrode 92 of the semiconductor light emitting device C are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C.

Figure 56:
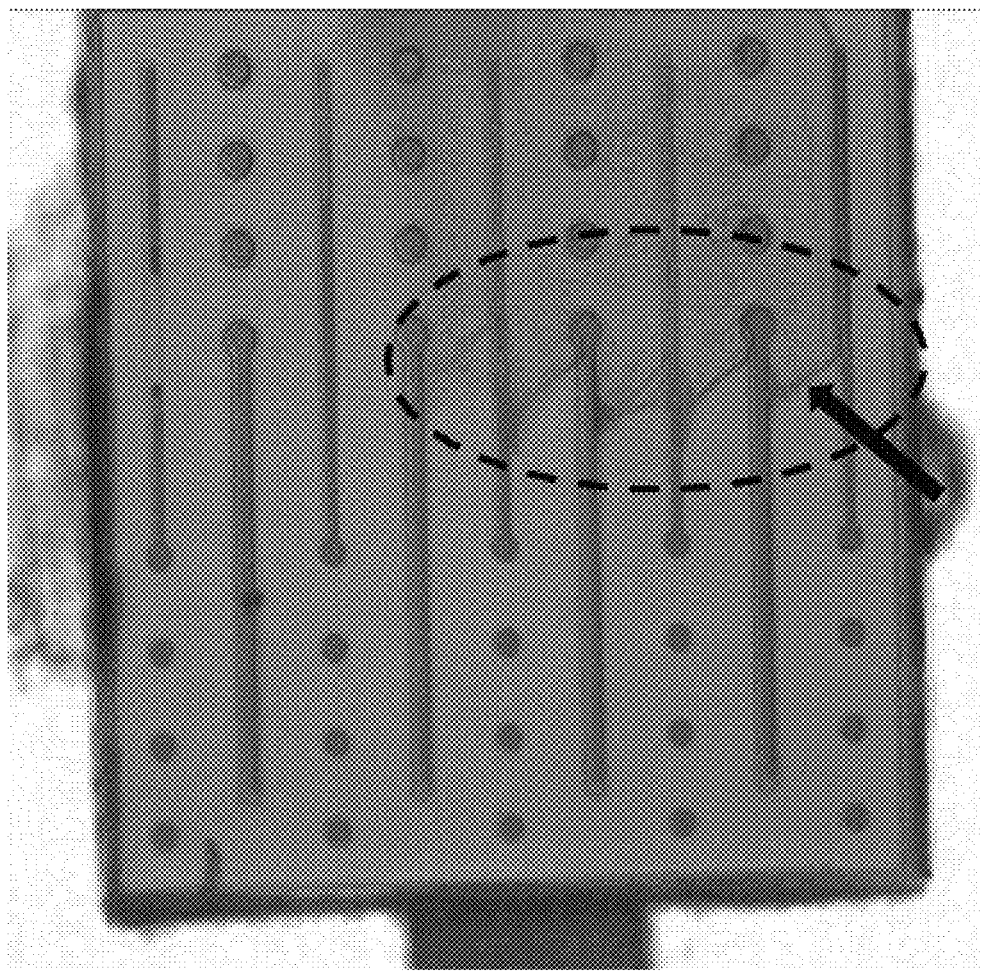
FIG. 56 is a photo showing cracks occurred in the semiconductor light emitting device bonded to an external electrode.

The electrode 80, 92 and the external electrode 1000, 2000 may be bonded together in various ways known in the art, including bonding using paste or ACF (anisotropic conductive film), eutectic bonding (e.g. AuSn, AnCu, CuSn), soldering, etc. Unfortunately however, as can be seen in FIG. 56, during this fixing or bonding process the semiconductor light emitting device may possibly be cracked (indicated with an arrow) due to a thermal shock. Meanwhile, Au is generally used for the top layer of the electrode 80, 92, but as shown in the left side of FIG. 48, Au does not show a favorable spreading condition with Sn which is usually used as a solder material during soldering. As such, when the top layer of the electrode 80, 92 is made of Au, high-yield soldering may not be accomplished (For an experiment, the reflow temperature (temperature for melting a solder) was set at 275° C., the reflow time was set at no more than 3 seconds, and an amount of a solder material was ⅓ of the area of a bump (electrode)).

Figure 57:
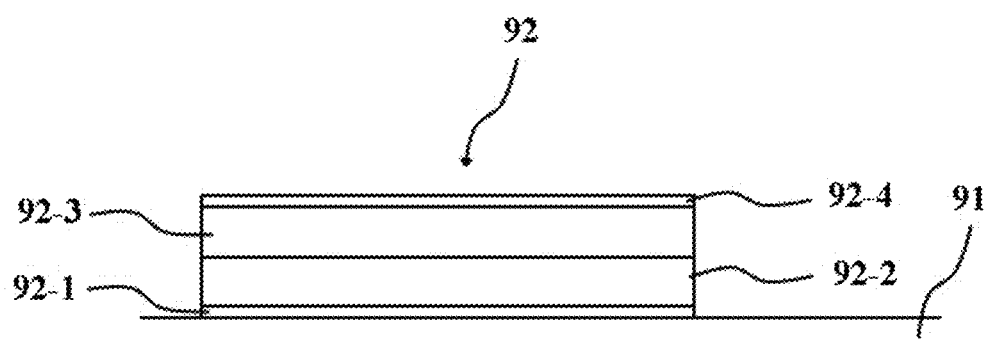
FIG. 57 is a schematic view illustrating an example of the structure of an n-side electrode and/or p-side electrode according to the present disclosure.

FIG. 57 is a schematic view illustrating an example of the structure of an n-side electrode and/or p-side electrode according to the present disclosure, in which a p-side electrode 92 (one example of the upper electrode in a second electrode part) is provided on a non-conductive reflective film 91. The p-side electrode 92 includes a lower electrode layer 92-2 and an upper electrode layer 92-3. The lower electrode layer 92-2 may be provided as a stress relief layer or a crack resistant layer for preventing cracks when a semiconductor light emitting device is fixed to an external electrode, and the upper electrode layer 92-3 may be provided as an anti-burst layer for preventing the bursting of the lower electrode 92-2. In addition, the lower electrode layer 92-2 may be provided as a reflective layer for reflecting light that has passed through the non-conductive reflective film 91. Also, the upper electrode layer 92-3 may be provided a diffusion barrier for preventing a solder material from permeating into the semiconductor light emitting device during a bonding operation such as soldering. The upper electrode layer 92-3 and the lower electrode layer 92-2 may be formed to have a combination of various functions described above.

For example, the lower electrode 92-2 may be formed of a highly reflective metal such as Al or Ag. In view of a crack resistant function, materials like Al and Ag are again useful as they have a high thermal expansion coefficient (linear thermal expansion coefficients: Al=22.2, Ag=19.5, Ni=13, Ti=8.6, unit: 10-6 m/mK). In many respects, Al is most desirable.

Likewise, the upper electrode 92-3 may be formed of a material such as Ti, Ni, Cr, W or TiW, in view of an anti-burst function and/or diffusion barrier function. Any metal having these functions may be employed without particular limitation.

Preferentially, the electrode 92 may further include a contact layer 92-1. With the contact layer 92-1, the electrode 92 may have an increased coupling force towards the non-conductive reflective film 92. The contact layer 92-1 may be formed of a metal (e.g. Cr, Ti, Ni or the like) or any suitable material as there is no specific limitation thereof, given that the contact layer thus formed has a greater coupling force than the lower electrode layer 92-2. The contact layer 92-1 is usually made thin (e.g. 20 Å-thick Cr) because light absorption by the contact layer 92-1 should be discouraged. The contact layer may be taken away if the lower electrode can have a coupling force. The contact layer 92-1 may be omitted, and the coupling force between the non-conductive reflective layer 91 and the lower electrode layer 92-3 may be increased by properly controlling deposition conditions (deposition method, deposition pressure, deposition temperature etc.) of the electrode 92. If the light reflection efficiency is taken into consideration, the contact layer should not be provided at all.

Preferentially and generally, the p-side electrode 92 includes a top layer 92-4. The top layer 92-4 is typically made of a metal having excellent adhesion, high electrical conductivity and high resistance to oxidation. Examples of the metal may include Au, Sn, AuSn, Ag, Pt, any alloy thereof or any combination thereof (e.g. Au/Sn, Au/AuSn), but are not particularly limited thereto as long as the aforementioned requirements are satisfied.

Figure 58:
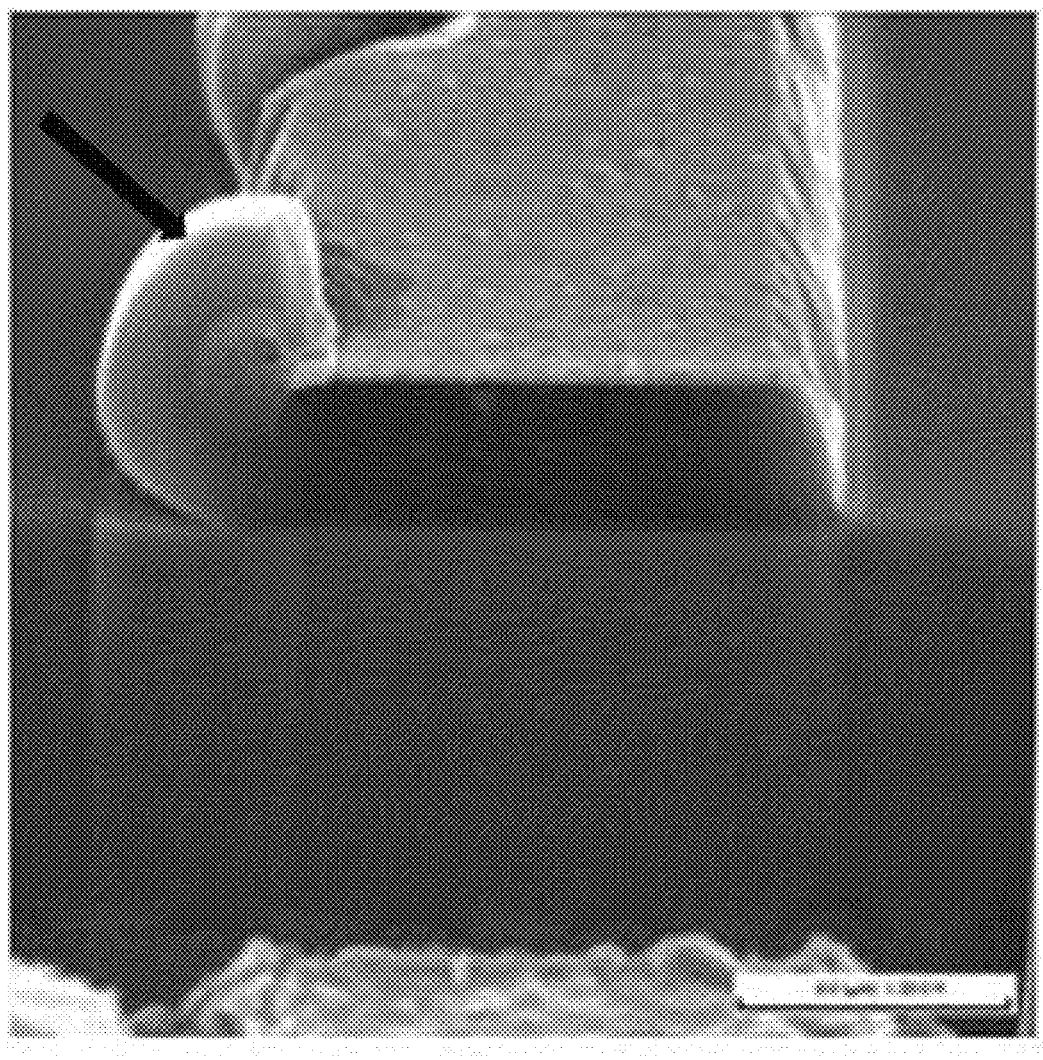
FIG. 58 is a photo showing that a lower electrode got burst after a current has been applied for an extended period of time.
Figure 62:
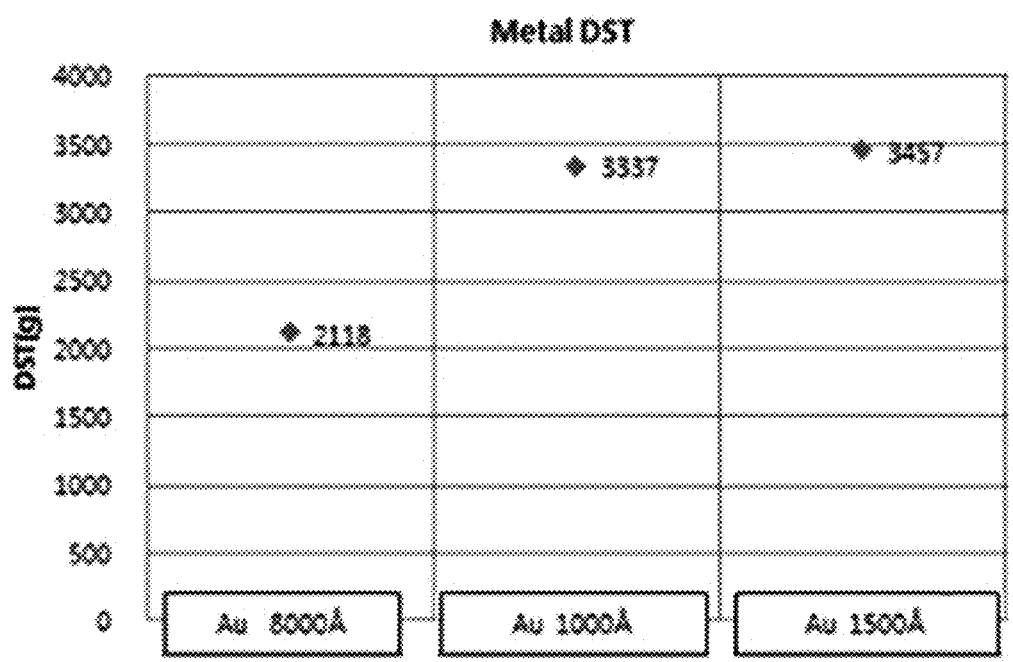
FIG. 62 is a graph showing Die Shear Test (DST) results as a function of the thickness of top layer.

In a preferential embodiment, the p-side electrode 92 has the lower electrode 92-2 which has a thickness of at least 1000 Å or preferentially at least 5000 Å and serves as a crack resistant layer (a metal layer (e.g. Al) having a high thermal expansion coefficient), and the upper electrode layer 92-3 which prevents cracking of the semiconductor light emitting device when it is bonded to an external electrode by soldering for example and has a lower thermal expansion coefficient to prevent bursting and sticking out thereof caused by a higher thermal expansion coefficient (see FIG. 58 where the Al electrode at least 1000 thick burst out during the operation of the device (indicated with an arrow)). Here, the upper electrode layer 92-3 preferentially doubles as a diffusion barrier, and Ni or Ti is particularly suitable to meet such a need. For example, 1 μm Al and 2 μm Ni may be used. While there is no specific upper limit on the thickness of the lower electrode layer 92-2, it is preferential for the lower electrode layer 92-2 to be 1 μm thick or less because the upper electrode layer 92-3 will not be able to control the lower electrode layer 92-2 easily if the lower electrode layer 92-2 is too thick. On the other hand, if the thickness is reduced to 1000 Å or less, the lower electrode layer as a crack resistant layer may be degraded. As will be described later, when the p-side electrode 92 has a plurality of lower electrode layers 92-2, a smaller thickness is allowed. The thickness of the upper electrode layer 92-3 can be selected in consideration of the thickness of the lower electrode layer 92-2, and any value above 3 μm could be excessive and unnecessary, or electrical properties of the semiconductor light emitting device would possibly be degraded because of that. When a top layer 92-4 is provided and should be fixed to an external electrode by soldering, excessively voids can be formed if the top layer 92-4 is too thick, leading to a weaker coupling force at the joint. Because of this, the top layer 92-4 preferentially has a thickness less than 5000 Å. DST results as a function of the thickness of the top layer 92-4 is provided in FIG. 62. It turned out that excellent performance was demonstrated when the thickness is in a range from 1000 Å to 1500 Å, and relatively poor performance was demonstrate when the thickness is 8000 Å. Hence, to maintain a DST value between 2500 Å and 3000 Å, it is preferential that the top layer has a thickness less than 5000 Å. On the other hand, if the top layer is provided and expected to demonstrate excellent performance, it should be at least 100 Å thick.

Figure 59:
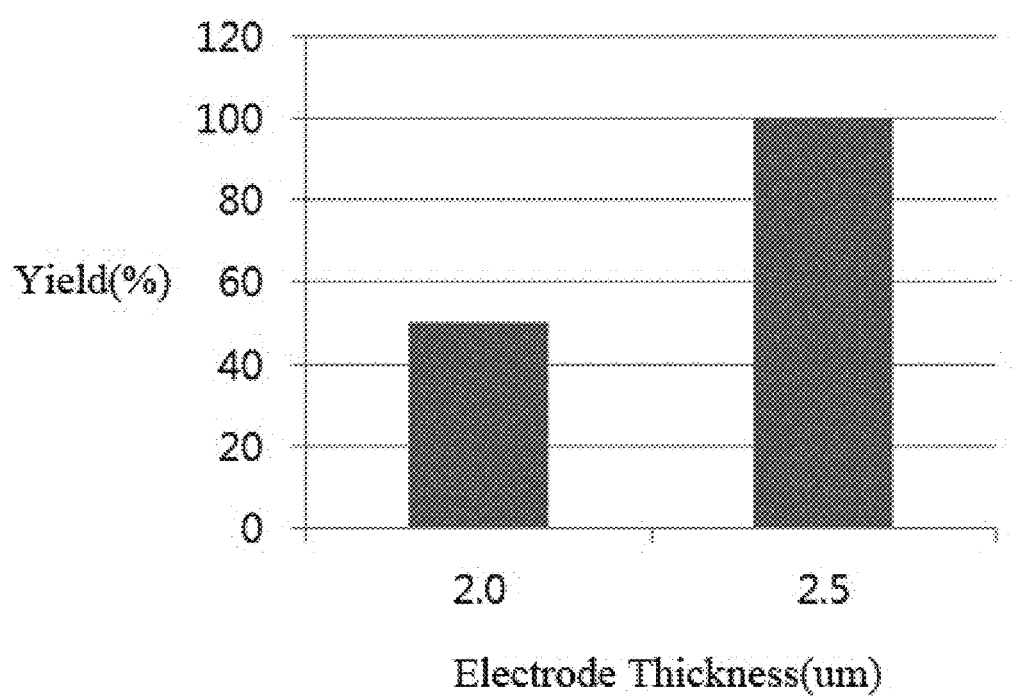
FIG. 59 graphically shows the change in the production yield with the thickness of an electrode or bump according to the present disclosure.

FIG. 59 graphically shows the change in the production yield with the thickness of an electrode or bump according to the present disclosure, for which an experiment was carried out by varying the thickness of sub-layers from the basic Cr (10 Å)-n-pair(s) Al (5000 Å)/Ni (3000 Å)-Au (8000 Å) structure, and solders (lead-free) were tested. When the electrode 80, 92 has a thickness of 2 μm, the production yield was 50%. When the electrode 80, 92 has a thickness of 2.5 μm, the production yield was approximately 100%. The pattern of electrodes used for this test was the same as the patterns of electrodes 80, 92 illustrated in FIG. 54, but other types of patterns equally hold a significant meaning as well. In terms of an area occupied by the electrode 80, 92, at least 50% of the area of the non-conductive reflective film 91 should be occupied by the electrode 80, 92 to be able to provide effective countermeasures against a thermal shock that occurs during bonding.

Figure 60:
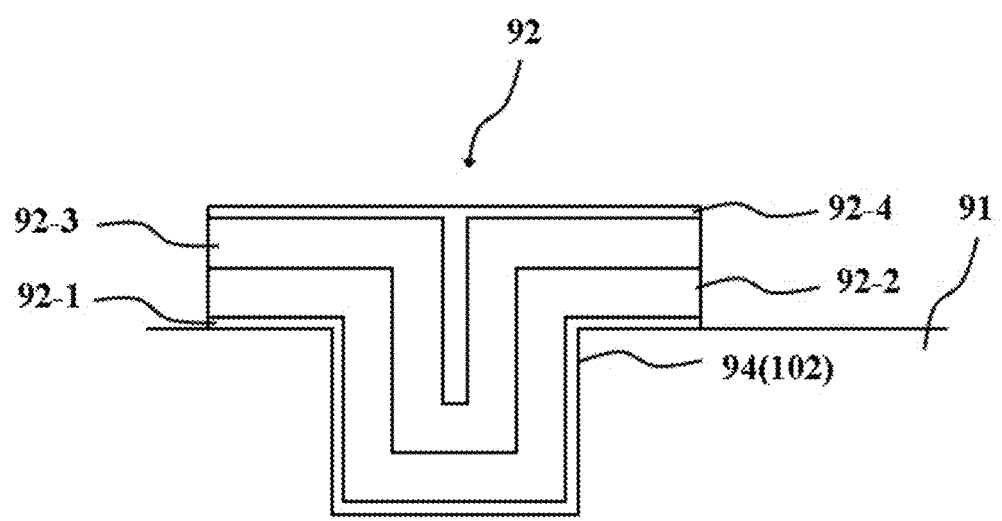
FIG. 60 is a schematic view illustrating a further example of the structure of an n-side electrode and/or p-side electrode according to the present disclosure.

FIG. 60 is a schematic view illustrating a further example of the structure of an n-side electrode and/or p-side electrode according to the present disclosure, in which an opening 102 is filled with a p-side electrode 92 to form an electrical connecting part 94 by the p-side electrode 92.

With this configuration, a lower electrode layer 92-2 may reflect light that has passed a non-conductive reflective film 91, and thus, light absorption by an electrical connecting part 94 can be reduced. For information, if a contact layer 92-1 is provided, the thickness thereof is so small that the lower electrode layer 92-2 may serve as a reflective film. Meanwhile, the electrical connecting part 94 may be formed separately from the p-side electrode 92 by deposition, plating and/or using a conductive paste.

Figure 61:
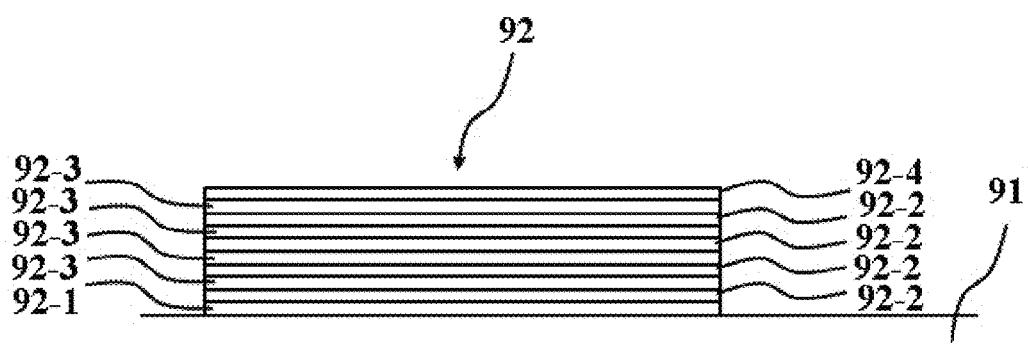
FIG. 61 is a schematic view illustrating a still further example of the structure of an n-side electrode and/or p-side electrode according to the present disclosure.

FIG. 61 is a schematic view illustrating a still further example of the structure of an n-side electrode and/or p-side electrode according to the present disclosure, in which a stack of several periods (repetitions) of alternating layers of a lower electrode layer 92-2 and an upper electrode layers 92-3 is provided. For instance, a p-side electrode 92 may include a contact layer 92-1 (20 Å-thick Cr), 4 pairs of the lower contact layers 92-2 (5000 Å-thick Al)/upper contact layers 92-3 (3000 Å-thick Ni) and a top layer 92-4 (1 μm-thick Au). Alternatively, only one of the lower electrode layer 92-2 and the upper electrode layer 92-3 may be provided in several periods (repetitions). Further, all of the lower and upper electrode layers 92-2, 92-3 do not necessarily have to be made of the same material. For instance, the lower electrode layer 92-2 may be made of a combination of Al and Ag. Also, one lower electrode 92-2 may be made of plural kinds of metals. Needless to say, there may be an additional layer besides the contact layer 92-1, the lower electrode layer 92-2, the upper electrode layer 92-3 and the top layer 92-4. Moreover, the structure shown in FIG. 60 is also applicable. Through the stack of alternating layers, one can assure that the lower electrode layer 92-2 will not stick out or burst.

Figure 63:
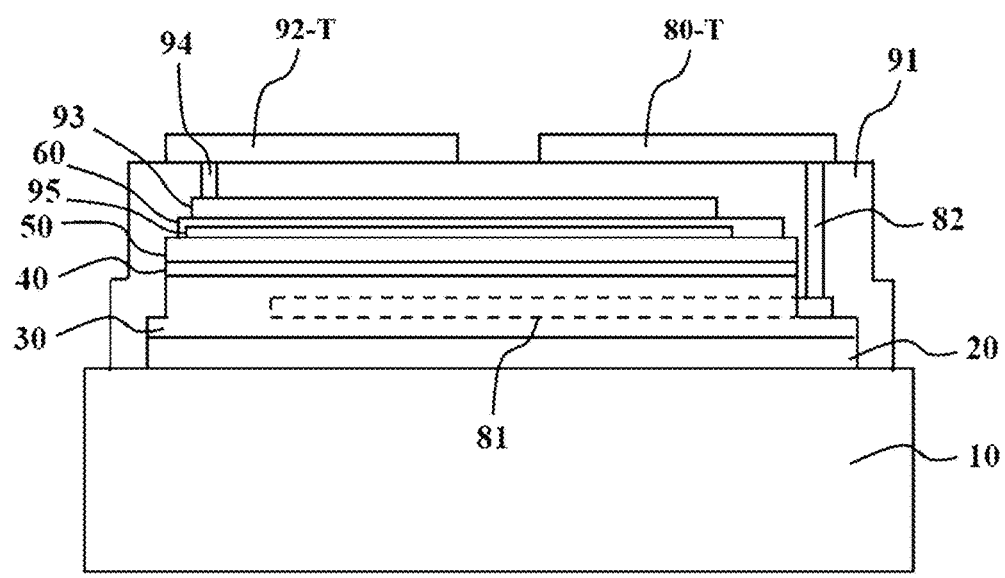
FIGS. 63 and 64 are schematic views illustrating still further exemplary embodiments of a semiconductor light emitting device according to the present disclosure.
Figure 64:
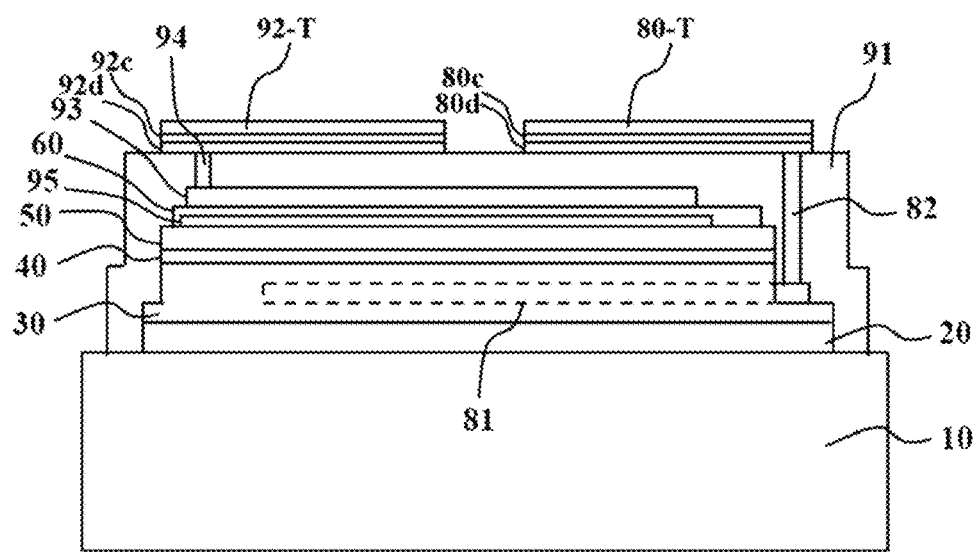

FIGS. 63 and 64 are schematic views illustrating still further exemplary embodiments of a semiconductor light emitting device according to the present disclosure, in which at least one of the first layer 80 and second layer 92 of the semiconductor light emitting device includes a heat-treated soldering layer that is substantially free of Au but contains Sn as the top layer. FIG. 63 illustrates an embodiment where a soldering layer 80-T, 92-T is the only top layer; and FIG. 64 illustrates an embodiment where a soldering layer 80-T, 92-T, an diffusion barrier 80c, 92c, and a light reflective layer 80d, 92d are all provided as the top layer. In the context of the present disclosure, the expression ' . . . contain(s) Sn' is intended to include ' . . . consist(s) only of Sn'.

In addition, the soldering layer indicates that it is bonded to an external electrode (e.g. 1000, 2000; see FIG. 47) by soldering. For example, the solder used for soldering is a lead-free solder paste which contains a flux and grains including In, Sn, Ag, Co and impurities. For example, it may contain approximately 97% of Sn and approximately 3% of Ag. In other words, Sn is the main component or ingredient.

Figure 65:
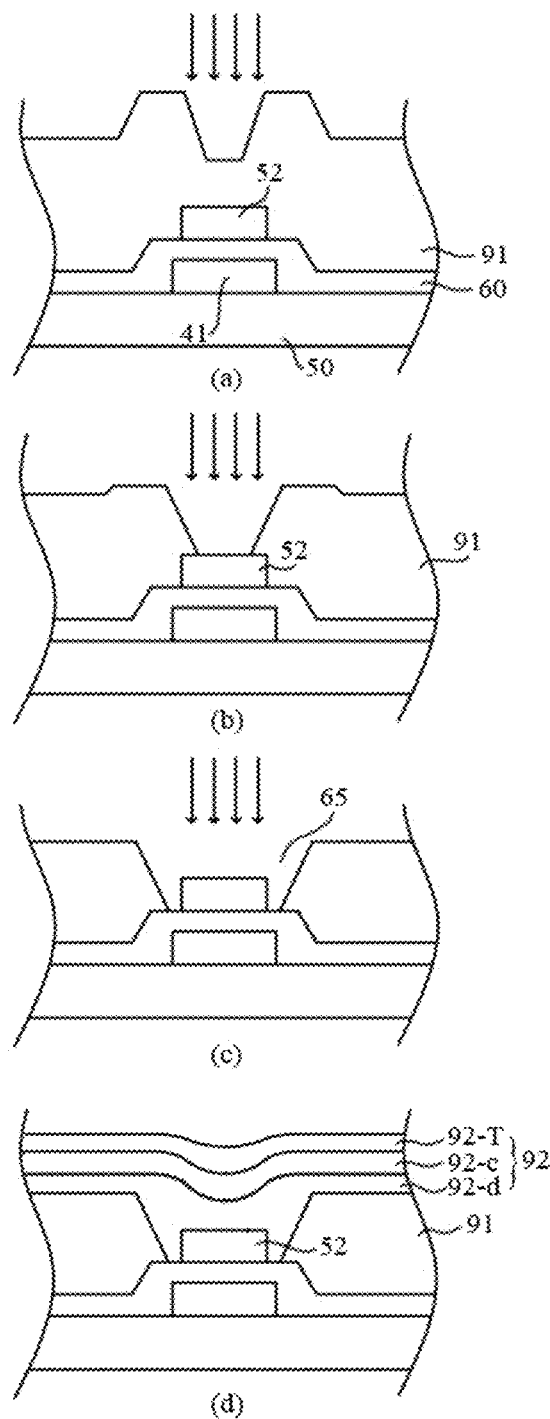
FIG. 65 shows schematic views illustrating another exemplary embodiment of a manufacturing method of a semiconductor light emitting device according to the present disclosure.

FIG. 65 shows schematic views illustrating another exemplary embodiment of a manufacturing method of a semiconductor light emitting device according to the present disclosure. A light absorbing barrier 41 is formed on a second semiconductor layer 50, and a transparent current-spreading electrode 60 (e.g. ITO) is formed on the light absorbing barrier. An ohmic contact electrode 52 serving as an electric contact improving layer is formed on the current-spreading electrode 60 opposite to the light absorbing barrier 41. Then, a non-conductive reflective film 92 is formed, covering the ohmic contact electrode 52. An opening 65 exposing the ohmic contact electrode 52 is formed by a dry and/or wet etching process, and a first electrode and a second electrode 92 are formed thereover by a deposition process. With the second electrode 92 extending to the opening 65, an electrical connecting part is established. In order to obtain a more stable connection structure between the electrical connecting part and the ohmic contact electrode 52, it is preferred to form the opening 65 in a way to expose the surrounding of the ohmic contact electrode 52 such that the electrical connecting part encompasses the ohmic contact electrode 52, as shown in FIG. 65.

The expression 'heat-treated soldering layer 80-T, 92-T mentioned above is intended to include intentional as well as non-intentional heat treatments, and it is distinguished from a process of simply exposing the soldering layer to a temperature for a deposition process. For example, in the process of forming an electrodes 80, 92, a heat treatment process may be carried out to improve interconnection between the electrical connecting part (e.g. FIG. 65, 94 in FIG. 49 and FIG. 65) and the ohmic contact electrode (e.g. 52 in FIG. 65, 93 in FIG. 49). As the first electrode 80 and/or the second electrode 92 is extended to the opening 65 formed in the non-conductive reflective film 91 to form an electrical connecting part, the soldering layer 80-T, 92-T of the first electrode 80 and/or the second electrode 92 is also thermally treated during the heat treatment process. For example, the soldering layer 80-T, 92-T is made of Sn having a melting point of 220° C. In one example, the soldering process may be carried out at a temperature between 230° C. and 267° C., more specifically at 240° C. The heat treatment temperature may be equal to or higher/lower than the melting point of Sn. For example, the heat treatment temperature may be between 100° C. and 400° C.

As will be described below, when the soldering 80-T, 92-T is made of Sn and the anti-oxidation layer overlying the soldering layer is made of Au, the reason for carrying out the heat treatment having effect on the DST strength of soldering is based on the judgement that there would be a certain level of interaction between Sn and Au caused by the heat treatment prior to soldering. Therefore, the primary concern is that the heat treatment is carried out at a temperature equal to or above the melting point of Sn. Meanwhile, any heat treatment being carried out at a temperature close to or lower than the melting point of Sn can also have a sufficient influence on the bonding strength. Hence, those treatments are not excluded from the heat treatment in the present disclosure.

The inventors have found out that when the heat treatment has been carried out and if the top layers of the first electrode 80 and the second electrode 92 for soldering are made of Au, the DST strength of soldering is greatly reduced. This will be further explained later. In this embodiment, the first electrode 80 and the second electrode 92 are substantially free of Au, and contain Sn as their top layer, and have heat-treated soldering layers 80-T, 92-T, respectively. The inventors also found out that this soldering layer 80-T, 92-T has a significantly increased DST strength of soldering as compared with those having an Au top layer with heat treatment. Moreover, this soldering layer 80-T, 92-T has a superior DST strength to those having a Sn-containing top layer without heat treatment. Again, this will be further explained later.

Figure 66:
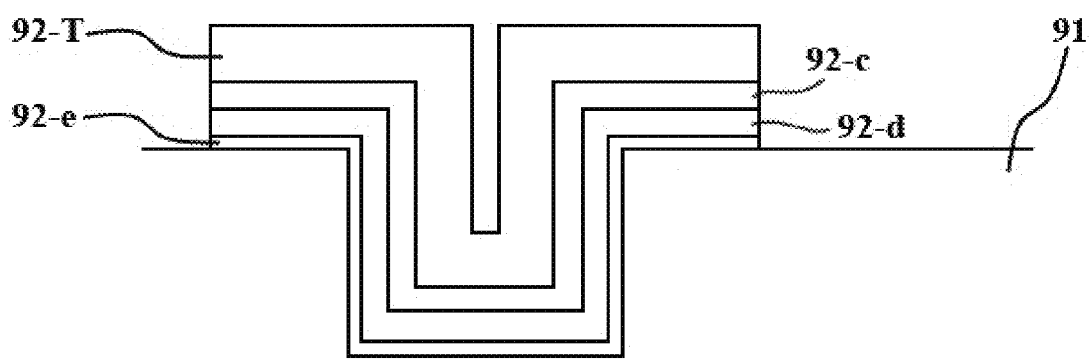
FIGS. 66 and 67 are schematic views illustrating still further exemplary embodiments of a semiconductor light emitting device according to the present disclosure.
Figure 67:
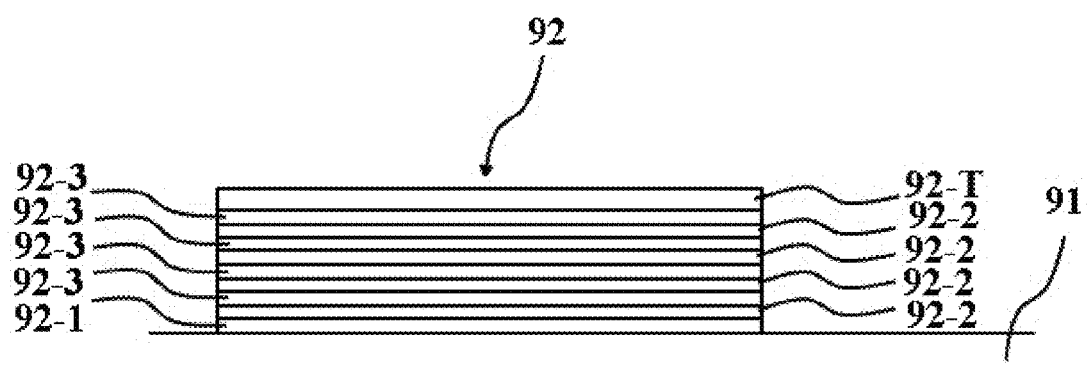

FIGS. 66 and 67 are schematic views illustrating still further exemplary embodiments of a semiconductor light emitting device according to the present disclosure. Further, the light reflective layer made of Al, Ag or the like may be arranged to be in contact with the non-conductive reflective film, it is also possible for the electrode and the electrical connecting part to additionally have a contact layer 92c as the bottom layer for improving the bonding strength (see FIG. 66). Moreover, when the light reflective layer is made thick, the light reflective layer 92-2 and the diffusion barrier 92-3 may be stacked alternately and repeatedly, so as to prevent the fracture (see FIG. 67). For example, Al/Ni may be made thick by this alternate stacking arrangement. At this time, a high-quality oxidation film such as an aluminum oxide layer or a nickel oxide layer may be formed on the side of the alternately and repeatedly stacked Al/Ni. As a solder does not easily stick or adhere to this oxidation film, the solder will be discouraged from climbing up and penetrating into the plurality of semiconductor layers.

Figure 68:
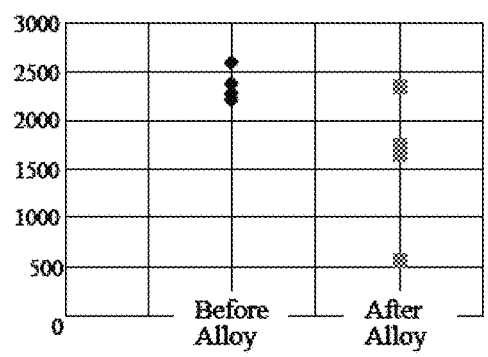
FIG. 68 shows test results on the DST strength of soldering before and after the heat treatment.
Figure 68:
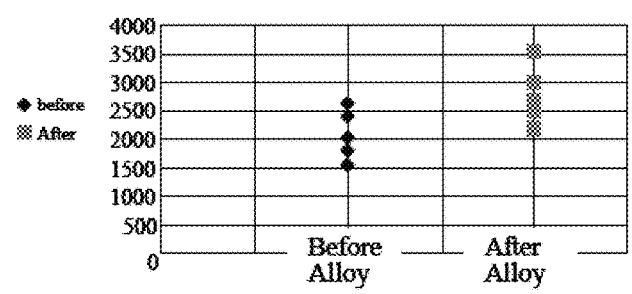

FIG. 68 shows test results on the DST strength of soldering before and after the heat treatment. In the test, Sample 1, an electrode having the soldering layer (Sn)/anti-oxidation layer (Au) structure, i.e. Sn 20000 Å/Au 500 Å, has or has not been subjected to the heat treatment at 300° C. for 5 minutes, and the DST strength of soldering was tested in both cases (see FIG. 68a). Moreover, Sample 2, an electrode having a substantially free of Au and containing Sn as the top layer, i.e. Sn 20000 Å, has or has not been subjected to the heat treatment at 300° C. for 5 minutes, and the DST strength of soldering was tested in both cases (see FIG. 68b).

First of all, in the case of Sample 1 Sn 20000 Å/Au 500 Å, the soldering strength after the heat treatment was significantly decreased. It is believed that even though a certain level of bonding strength may be obtained when the thin Au layer that was not subjected to the heat treatment serves as the anti-oxidation layer and the Sn layer serves as the soldering layer, Au, for some reasons, can have a negative effect on the soldering strength after the heat treatment was carried out. Meanwhile, in the case of Sample 2 Sn 20000 Å, the soldering strength was significantly improved even after the heat treatment was carried out. It is assumed that the absence of Au between the Sn-containing soldering layer 80-T, 92-T and the solder contributes somewhat to the improved soldering strength, and that the bonding strength between the soldering layer 80-T, 92-T and the diffusion barrier 80c, 92c made of Ni arranged under the soldering layer 80-T, 92-T must have been improved through the heat treatment.

As described hereinabove, the present disclosure provides a solution for soldering different from eutectic bonding, and discloses an electrode structure for preventing the occurrence of a defect, e.g. a crack, in the plurality of semiconductor layers of a semiconductor light emitting device. In particular, the heat treatment may be carried out depending on the process of forming the electrodes 80, 92, or simply the deposition process may be carried out to form the electrodes. In other words, the heat treatment is not absolutely necessary, yet the electrode targeted for the heat treatment needs to be designed in consideration of the influence of the heat treatment process upon the soldering strength. In either case, one can find suitable conditions for meeting the required soldering bonding condition, and it is not right to say one case is absolutely more preferred than the other case.

For example, the test result of an electrode composed of the light reflective layer (Al)/the diffusion barrier (Ni)/the soldering layer (Au) indicates that the soldering strength varies by the thickness of Au. That is, if Au is too thick, the bonding strength is decreased; if Au is too thin, Ni is more likely to oxidize. Therefore, it is necessary to find a suitable thickness for Au (see Ref in FIG. 55).

However, as shown in FIG. 55, the test result of an electrode composed of the light reflective layer (Al)/the diffusion barrier (Ni)/the soldering layer (Sn)/the anti-oxidation layer (Au) indicates that the bonding strength may be greater or less than the Ref, depending on the thickness of the anti-oxidation layer (Au). During soldering, the thin Au layer is generally mixed with the soldering layer and the solder, and Au products obtained from the interaction between Au and Sn tend to be brittle, indicating that the bonding strength is affected by the thickness of Au. Hence, when an electrode is composed of the light reflective layer (Al)/the diffusion barrier (Ni)/the soldering layer (Sn)/the anti-oxidation layer (Au), the anti-oxidation layer should not be too thick, but have an optimal or suitable thickness, for example, equal to or less than 500 Å as suggested in the embodiment of FIG. 55, such that the bonding strength may be improved as compared with the Ref. Further, it is believed that the bonding strength can still be improved as compared with the Ref when the anti-oxidation layer is not present and the top layer is made of Sn only (refer to the description of FIG. 55). Accordingly, as it will be described later, designing the anti-oxidation layer, i.e. Au, to have an optimal or suitable thickness would be more appropriate for use in the electrode structure which does not undergo the heat treatment.

Meanwhile, when the heat treatment is carried out intentionally and non-intentionally during the formation of the electrode 80, 92, Sample 1 Al/Ni/Sn 20000 Å/Au 500 Å illustrated in FIG. 68*a* experiences a substantial decrease in the bonding strength due to the heat treatment. This seems to occur because the heat treatment causes Sn in the soldering layer interacts with Au prior to the soldering process, which in turn causes a subsequent interaction among the solder-Au-the soldering layer during the soldering process, thereby affecting the distribution of brittleness of the Au products. Consequently, the bonding strength has been decreased more, as compared with the case where no heat treatment is carried out. One possible assumption regarding this phenomenon is that if the soldering process is carried out without preceding heat treatment, Au is mixed with the solder as well as with the soldering layer during the interaction of the solder-Au-the soldering layer, and a relatively high concentration section of brittle materials is not distinctive; if the heat treatment is carried out in advance, the products from the interaction between Sn and Au are formed in a region within a certain thickness from the upper face of the soldering layer, which leads to poor distribution or poor spreading of brittle materials during the soldering process, or causes the brittle materials to be deposited more towards the solder and creates a higher-concentration section, resulting in a significant decrease in the boding strength.

However, considering that the heat treatment increases the coupling force between the diffusion barrier (Ni) and the soldering layer (Sn, 80-T, 92-T), while the heat-treated Sample 1 shows a significantly decreased bonding strength, one can see that the heat-treated, Au top layer indeed has very negative effects on the soldering strength.

Therefore, if the heat treatment is supposed to be carried out, Sample 2, the Al/Ni/Sn 20000 Å electrode, illustrated in FIG. 68*b* may still have an increased bonding strength by including Sn, not Au, as the top layer, and the heat-treated soldering layer 80-T, 92-T. That is, in the case of Sample 2, it is believed that the heat treatment inhibits Au from negatively affecting the soldering, and the coupling force between the diffusion barrier and the soldering layer 80-T, 92-T is improved, thereby increasing the bonding strength.

On the other hand, when the Sn top layer becomes a soldering layer, it is necessary to inspect whether an oxide layer is formed on the surface of Sn and deteriorates the soldering strength. This oxide layer may be formed whether the heat treatment is carried out or not, and there may be more factors during the heat treatment, which oxidizes the surface of Sn. Nevertheless, the heat-treated Sn layer as shown in FIG. 68*b*, i.e. the soldering layer 80-T, 92-T, has a significantly improved soldering strength. This seems to occur because the layer quality of tin oxide is poorer than the layer qualities of other oxide layers such as an aluminum oxide layer or an nickel oxide layer, such that the tin oxide layer becomes susceptible to fracture and can be removed during soldering. That is, the tin oxide layer does not have a great impact on the soldering strength. For example, the solder material is a lead-free solder paste which contains a flux and grains including In, Sn, Ag, Co and impurities. For example, it may contain approximately 97% of Sn and approximately 3% of Ag. In other words, Sn is the main component. While soldering, the flux is evaporated and only the grains remain. The soldering process temperature can range from 230 to 267° C., and the flux serves to prevent the oxidation of metals contained in the solder paste, e.g. Ag, Sn, Co and so on, and to remove any oxide layer or impurities remaining on the surface of the soldering target (e.g. 80-T, 92-T). On one hand, one can assume that even if the tin oxide layer has small impact on the soldering strength, its influence may be insignificant as compared with the overwhelming improvement of the soldering strength due to an increased coupling force between the diffusion barrier and the soldering layer 80-T, 92-T as a result of the heat treatment. On the other hand, although this is only an assumption, one can also suppose that the heat-treated, Sn-containing soldering layer 80-T, 92-T modifies the properties of Sn (e.g. morphology) to be more suitable for coupling with the solder.

The soldering layer preferentially has a thickness of at least 1000 Å to function as a solder layer. The thickness of the soldering layer is not particularly limited, and it may be greater than 5 μm.

The differences between the presence of the anti-oxidation layer and the absence of the anti-oxidation layer, and the differences between the heat treatment and no heat treatment can be determined through the comparison of FIG. 68*a* and FIG. 68*b* that are tested under the same conditions. Referring to the data in FIG. 68, it turned out that, with the heat treatment being carried out, it is desirable to form the soldering layer 80-T, 92-T with the Au-free, Sn top layer. With no heat treatment being carried out, however, it turned out that there is not much difference in the bonding strengths between the presence of the anti-oxidation layer (Au) (the left side in FIG. 68*a*; the values along the vertical axis range roughly from 2200 to 2700) and the absence of the anti-oxidation layer (Au) (the left side of FIG. 68*b*; the values along the vertical axis range roughly from 1500 to 2700). Nevertheless, it is also true that more results showed that the presence of the anti-oxidation layer yielded greater bonding strengths. Of course, it should be noted that this is based on the assumption that the anti-oxidation layer has an optimal or suitable thickness. Moreover, it turned out that, as for the top layer, the Au-free soldering layer 80-T, 92-T containing Sn has a greater DST strength than those having a thermally untreated anti-oxidation layer with a suitably selected thickness.

When the soldering layer 80-T, 92-T is formed of Sn and the main component of the solder is Sn, as described in FIG. 48, even a small amount of the solder easily spreads across the electrode, which helps to obtain a substantially larger bonding area, thereby improving the bonding strength. In addition, this type of the solder makes it easier to design dispensing points when the solder is to be dispensed on the electrode. Since a smaller amount of the solder can be used, the plurality of semiconductor layers can be protected from possible negative influences (e.g. fracture, cracks, etc.) of thermal expansion that usually occurs when a large amount of the solder is used. Moreover, it is less likely that the solder will stick out sideways so that the spacing between the first electrode 80 and the second electrode 92 can be narrower, and the heat radiation area can be broaden accordingly.

The soldering layer 80-T, 92-T may be formed of other materials besides Sn. In particular, when the soldering layer 80-T, 92-T is formed of components of the solder, preferably the main component of the solder, the soldering strength may be improved, as compared with the case where the soldering layer made of Au free of foreign substances, or includes Au as the anti-oxidation layer. Examples of the solder may include Sn, PbSn, PbSnAg, PbInAb, PbAg, SnPbAg, PbIn, CdZn and the like. Therefore, the soldering layer 80-T, 92-T may optionally be formed of Pb, Ag, In, Ab, Cd, Zn or the like, in addition to Sn.

If this is the case, the soldering layer may undergo heat treatment prior to soldering. The definition of the heat treatment is as described above. In particular, when the heat treatment is carried out at a temperature suitable for the main component of the solder, it is desirable to form a substantially Au-free soldering layer as the top layer, using the main component of the solder, such that the bonding strength may be improved, as compared with the case where Au is used as the top layer, with or without the heat treatment being carried out.

Figure 69:
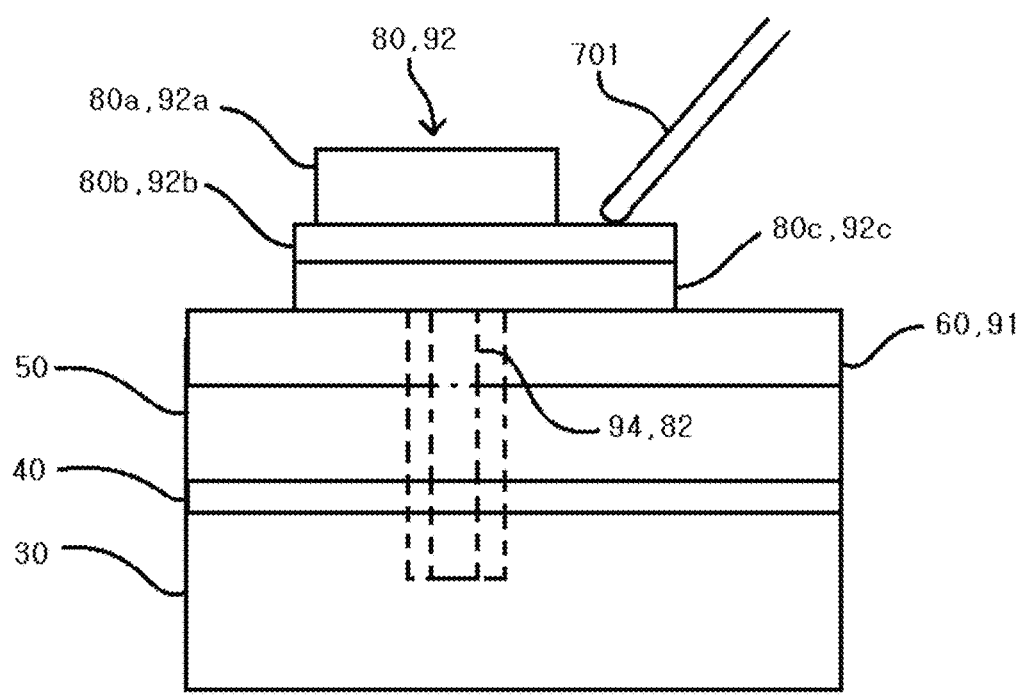
FIG. 69 is a schematic view for describing another exemplary embodiment of a semiconductor light emitting device according to the present disclosure.

FIG. 69 is a schematic view for describing another exemplary embodiment of a semiconductor light emitting device according to the present disclosure, in which the semiconductor light emitting device includes a plurality of semiconductor layers 30, 40, 50, and an electrode 80, 92. For example, these semiconductor layers 30, 40, 50 in this embodiment are the same as those semiconductor layers 30, 40, 50 described above in FIG. 45. The electrode 80, 92 supplies current (either electrons or holes) to the plurality of semiconductor layers 30, 40, 50. Moreover, the electrode 80, 92 may come in contact with the plurality of semiconductor layers 30, 40, 50. As an alternative, an intermediate layer 60, 91 may be interposed between the electrode 80, 92 and the plurality of semiconductor layers 30, 40, 50. When the intermediate layer 60, 91 is electrically conductive (e.g. a current spreading electrode), the electrode 80, 92 can be in electrical communication with the plurality of semiconductor layers 30, 40, 50 by means of the intermediate layer 60, 91. Meanwhile, when the intermediate layer 60, 91 is not electrically conductive (e.g. a non-conductive reflective film), the electrode 80, 92 can be in electrical communication with the first semiconductor layer 30 or with the second semiconductor layer 50 by means of an electrical connection 94, 82 passing through the intermediate layer 60, 91. The electrode 80, 92 includes a bonding layer 80*a*, 92*a* to be bonded with an external electrode 1000, 2000, and a probe inspection layer 80*b*, 92*b* for inspection or measurement. In this exemplary embodiment, the bonding layer 80*a*, 92*a* is formed on the probe inspection layer 80*b*, 92*b*, and a portion of the probe inspection layer 80*b*, 92*b* is exposed from the bonding layer 80*a*, 92*a*, as seen in the top view.

Referring again to FIG. 69, the electrode 80, 92 further includes lower layer(s) 80*c*, 92*c*, 80*d*, 92*d*. The lower layer(s) 80*c*, 92*c*, 80*d*, 92*d* are interposed between the intermediate layer 60, 91 and the probe inspection layer 80*b*, 92*b*, and acts as a light reflective layer, a contact layer, a stress relief layer, a bulge resistant layer or a crack resistant layer, as illustrated in FIG. 45 through FIG. 68. For example, the lower layers 80*c*, 92*c*, 80*d*, 92*d* may include a barrier layer 92*c*, 80*c* and an additional layer 92*d*, 80*d*, as illustrated in FIG. 51. The additional layer can include at least one of the light reflective layer and the contact layer. Moreover, the lower layers 80*c*, 92*c*, 80*d*, 92*d* can be composed of a stack of alternating lower contact layer/upper contact layer pairs as illustrated in FIG. 61.

Figure 70:
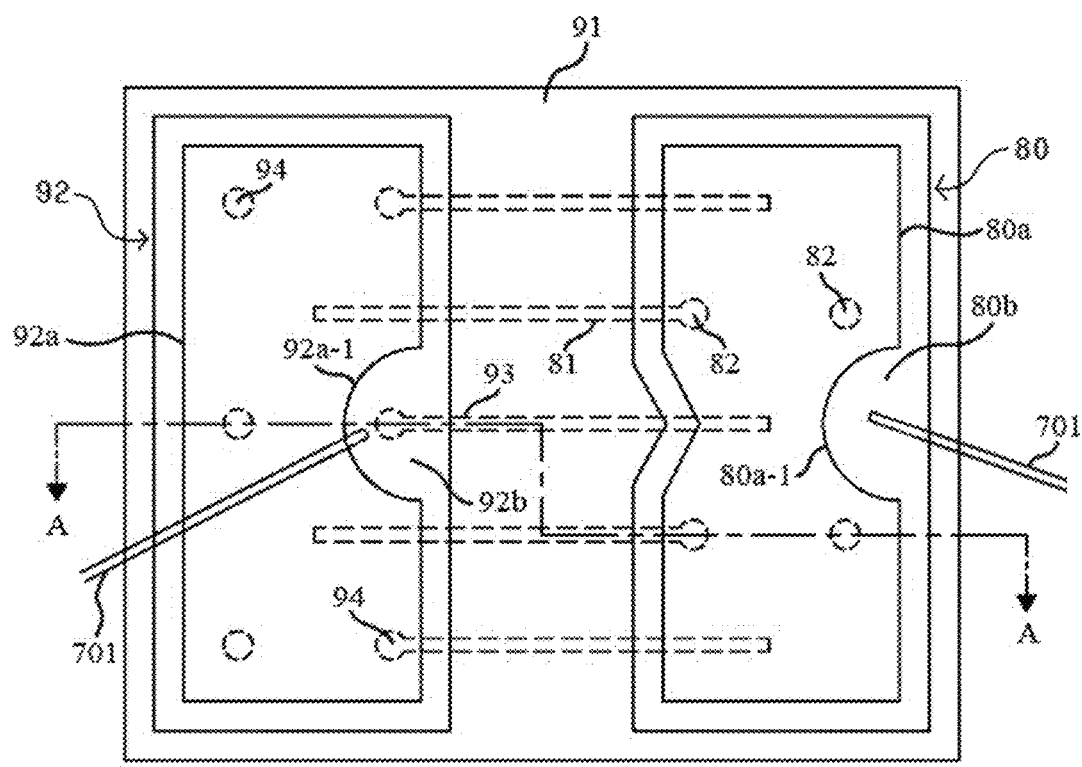
FIG. 70 is a schematic view for describing another exemplary embodiment of a semiconductor light emitting device according to the present disclosure.
Figure 71:
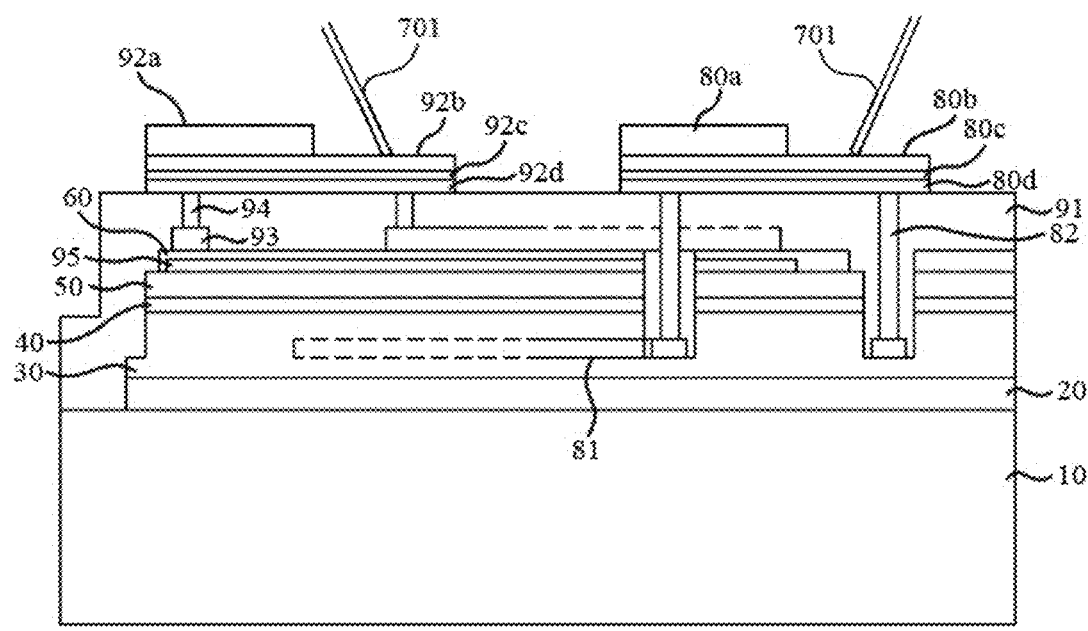
FIG. 71 illustrates a cross-sectional view taken along A-A line in FIG. 70.

The bonding layer 80*a*, 92*a* and the external electrode 1000, 2000 may be bonded together in various ways well-known in the art, including bonding with a paste or ACF (anisotropic conductive film), eutectic bonding (e.g. AuSn, AnCu, CuSn), soldering, etc. When bonding is to be performed using a solder material, the bonding layer 80*a*, 92*a* is preferably composed of a Sn-based layer to improve or enhance bonding strength with the solder material, as described previously. If this is the case, it is one option that an anti-oxidation layer or Au is not provided on the bonding layer 80*a*, 92*a*. However, it is not intended to eliminate the possibility of providing an anti-oxidation layer having a carefully controlled thickness within a range that does not degrade the bonding strength of the Sn-based bonding layer 80*a*, 92*a* in any way. In general, this Sn-based bonding layer 80*a*, 92*a* is relatively weak or soft such that the tip of the probe 701 may be smeared or stained with the material of the bonding layer 80*a*, 92*a*. If the probe 701 having been brought into contact with the bonding layer 80*a*, 92*a* is used for continued inspection or measurement of a number of semiconductor light emitting device, accurate measurement will not be easy and great deviations will occur in measurement values. Meanwhile, in this exemplary embodiment, it is the probe inspection layer 80*b*, 92*b* that the probe 701 comes in contact with. Since the probe inspection layer 80*b*, 92*b* is comparatively more rigid than the bonding layer 80*a*, 92*a* and not going to deform easily, the tip of the probe 701 will be kept from being smeared or stained with the material of the probe inspection layer 80*b*, 92*b*. Hence, with the probe 701 being in contact with the probe inspection layer 80*b*, 92*b* instead of the bonding layer 80*a*, 92*a* for continued inspection of a number of semiconductor light emitting devices, deviation in measurement values is smaller, and more reliable and stable inspection or measurement can be performed FIG. 70 is a schematic view for describing another exemplary embodiment of a semiconductor light emitting device according to the present disclosure, and FIG. 71 illustrates a cross-sectional view taken along A-A line in FIG. 70. Here, the semiconductor light emitting device is bonded to an external electrode 1000, 2000 by means of a bonding material (see FIG. 5), and a probe 701 is brought into contact with the semiconductor light emitting device for measurement of an operating voltage Vf. The semiconductor light emitting device includes a plurality of semiconductor layers 30, 40, 50, finger electrodes 81, 93, a non-conductive reflective film 91, a first electrode 80, a second electrode 92 (additional electrode), and electrical connections 82, 94. The non-conductive reflective film 91 may be the same as the one illustrated in FIG. 45. The first electrode 80 and the second electrode 92 are provided on the non-conductive reflective film 91, opposite to each other. The first finger electrode 81 stretches from below the first electrode 80 to below the second electrode 92, and the second finger electrode 93 stretches from below the second electrode 92 to below the first electrode 80. The electrical connection 82 connects the first finger electrode 81 and the first electrode 80, while another electrical connection 82 is isolated in form of an island and electrically communicates directly with the first semiconductor layer 30 without the help of the first finger electrode 81. The electrical connection 94 connects the second finger electrode 93 and the second electrode 92, while another electrical connection 94 is isolated in form of an island and electrically communicates directly with the current spreading electrode 60 without the help of the second finger electrode 93.

In this exemplary embodiment, the first electrode 80 and the second electrode 92 each include a bonding layer 80a, 92a, a probe inspection layer 80b, 92b, and lower layer(s) 80c, 92c, 80d, 92d. The lower layers 80c, 92c, 80d, 92d are composed of a first layer 80d, 92d interposed between the non-conductive reflective film 91 and the probe inspection layer 80b, 92b, and a second layer 80c, 92c interposed between the first layer 80d, 92d and the probe inspection layer 80b, 92b. Here, the second layer 80c, 92c is a barrier layer to keep a material from spreading or penetrating in between the probe inspection layer 80b, 92b and the first layer 80d, 92d, and the first layer 80d, 92d can include at least one of a contact layer for increasing bonding strength towards the non-conductive reflective film 91 and a reflective layer for reflecting light from the active layer. As described previously, the lower layers 80c, 92c, 80d, 92d may have a stack of alternating Al/Ni pairs.

When seen in the top view, the bonding layer 80a, 92a at least one of an opening and a groove 80a-1, 92a-1 is formed in the bonding layer 80a, 92a, and the probe inspection layer 80b, 92b is arranged in correspondence to the opening or groove 80a-1, 92a-1 formed in the bonding layer 80a, 92a. In this exemplary embodiment, the bonding layer 80a, 92a is provided on the probe inspection layer 80a, 92a, and the groove 80a-1, 92a-1 is formed in the bonding layer 80a, 92a to expose the probe inspection layer 80b, 92b. The probe 701 is then brought into contact with such an exposed portion of the probe inspection layer 80b, 92b through the groove 80a-1, 92a-1, so as to measure an operating voltage or electrical properties of the semiconductor light emitting device. For an increased bonding strength towards the solder material, the bonding layer 80a, 92a contains at least one of Sn, Pb, Ag, Bi, In, Sn, Cd and Cu for increasing bonding strength towards the solder material, and the probe inspection layer 80b, 92b contains at least one of Au, Pt, Ag, Ti, Ni, Al, Cu and Cr. Optionally, they can contain other suitable materials. In this exemplary embodiment, the bonding layer 80a, 92a preferably contains Sn or is composed of heat-treated Sn, to have an increased bonding strength towards the solder material.

The probe inspection layer 80b, 92b is more rigid than the bonding layer 80a, 92a, and preferably composed of a material that would less likely to or would not smear or stain the probe 701 during its contact with the probe. A preferential example thereof is Au as Au shows a highly stable electrical contact with the probe inspection layer 80b, 92b, and stable contacts with other layers as well. The second layer 80c, 92c may contain any material mentioned previously in reference to FIG. 45 through FIG. 68. Likewise, the first layer 80d, 92d acting as a contact layer and/or reflective layer may contain any material mentioned previously in reference to FIG. 45 through FIG. 68.

When the groove 80a-1, 92a-1 exposing the probe inspection layer 80b, 92b is recognized by observation equipment such as a camera, the groove 80a-1, 92a-1 can be used as an indicator for distinguishing different directions of the first and second electrodes 80, 92. Alternatively, a V-shaped notch can be formed in the electrodes to distinguish different directions of the electrodes, as shown in FIG. 70.

Figure 72:
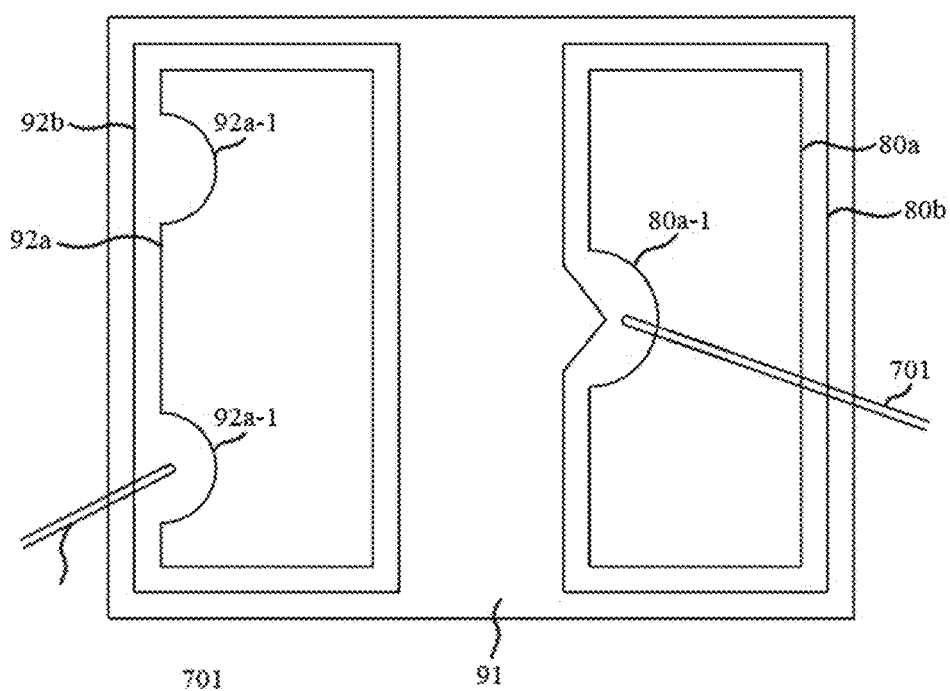
FIG. 72, FIG. 73, FIG. 74 and FIG. 75 are schematic views for describing other exemplary embodiments of a semiconductor light emitting device according to the present disclosure.

FIG. 72 through FIG. 75 are schematic views for describing other exemplary embodiments of a semiconductor light emitting device according to the present disclosure. For simplicity, finger electrodes and electrical connections are not shown in FIG. 72, FIG. 73 and FIG. 74. As shown in FIG. 72, a groove 80a-1, 92a-1 formed on the edge of the bonding layer 80a, 92a may vary widely in location and quantity. For example, two or more grooves 80a-1, 92a-1 may be formed in one bonding layer 80a, 92a to create several exposure areas in the probe inspection layer 80b, 92b. A probe 701 is then brought into contact with the exposed areas of the probe inspection layer 80b, 92b through the grooves 80a-1, 92a-1.

Figure 73:
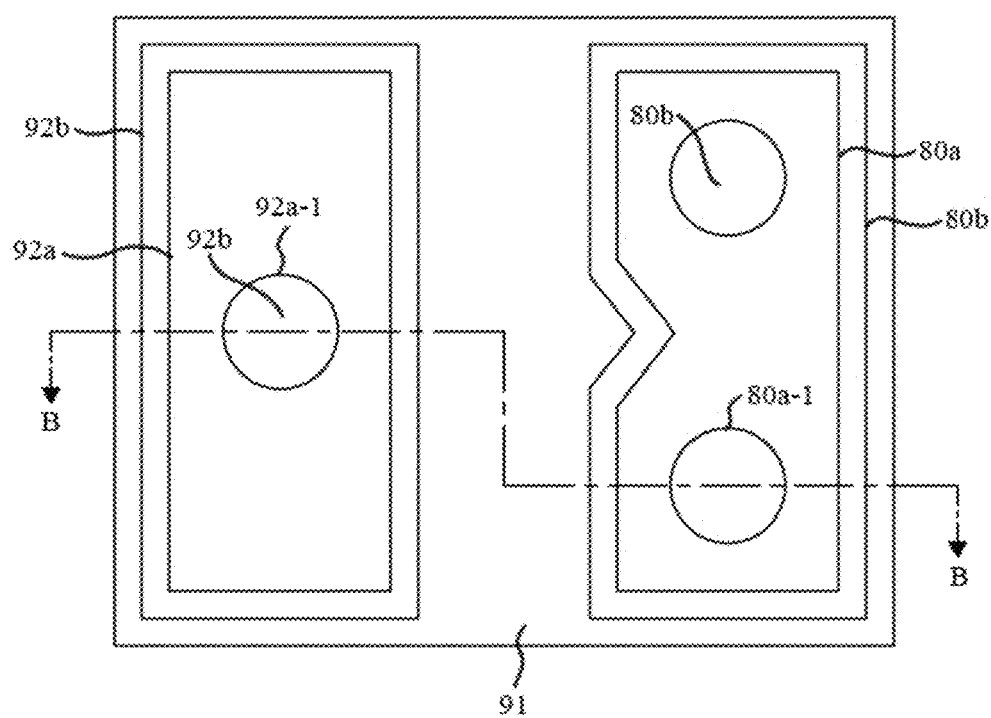

On the other hand, FIG. 73 shows that the probe inspection layer 80b, 92b is not exposed from the edge of the bonding layer 80a, 92a, but can be exposed through an opening 80a-1, 92a-1 in the bonding layer 80a, 92a. FIG. 75a illustrates a cross-sectional view taken along B-B line in FIG. 73. Here, a probe 701 is brought into contact with the exposed portion of the probe inspection layer 80b, 92b through the opening 80a-1, 92a-1 in the bonding layer 80a, 92a. The electrode includes lower layer(s) 80c, 92c, 80d, 92d, the probe inspection layer 80b, 92b on the lower layer(s) 80c, 92c, 80d, 92d, and the bonding layer 80a, 92a. Due to the opening 80a-1, 92a-1 formed in the bonding layer 80a, 92a, the bonding layer 80a, 92a has an uneven profile on its cross section, which is advantageous for enhancing the bonding strength towards a solder material during a soldering process.

Figure 74:
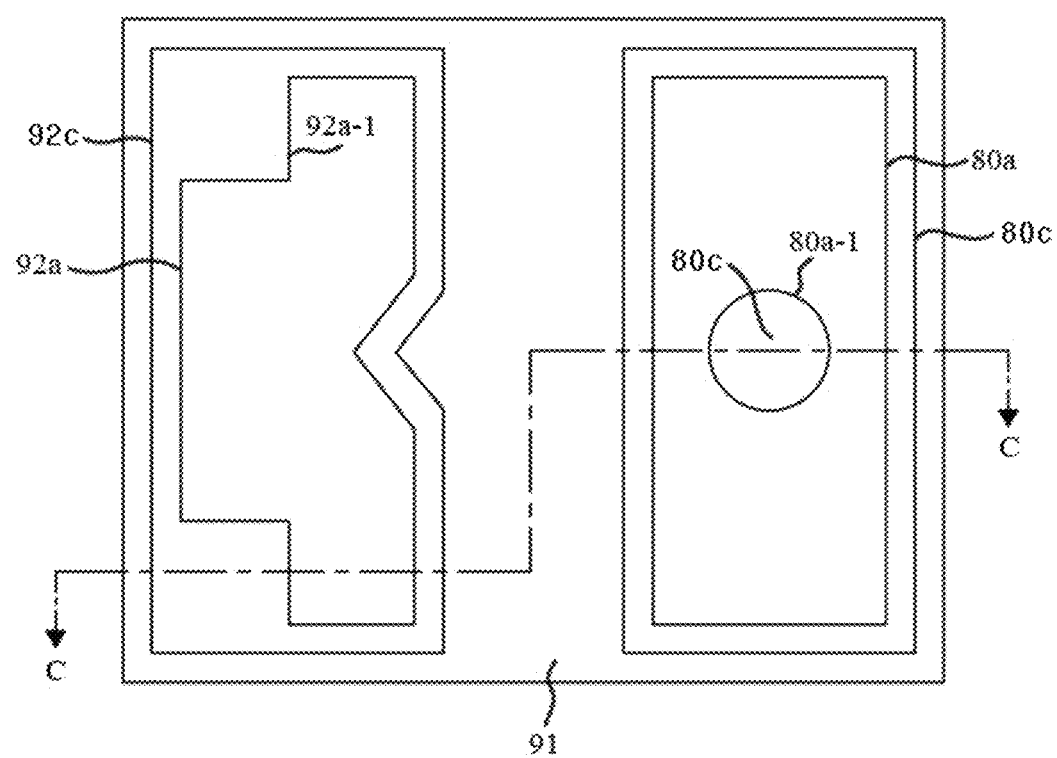
Figure 75:
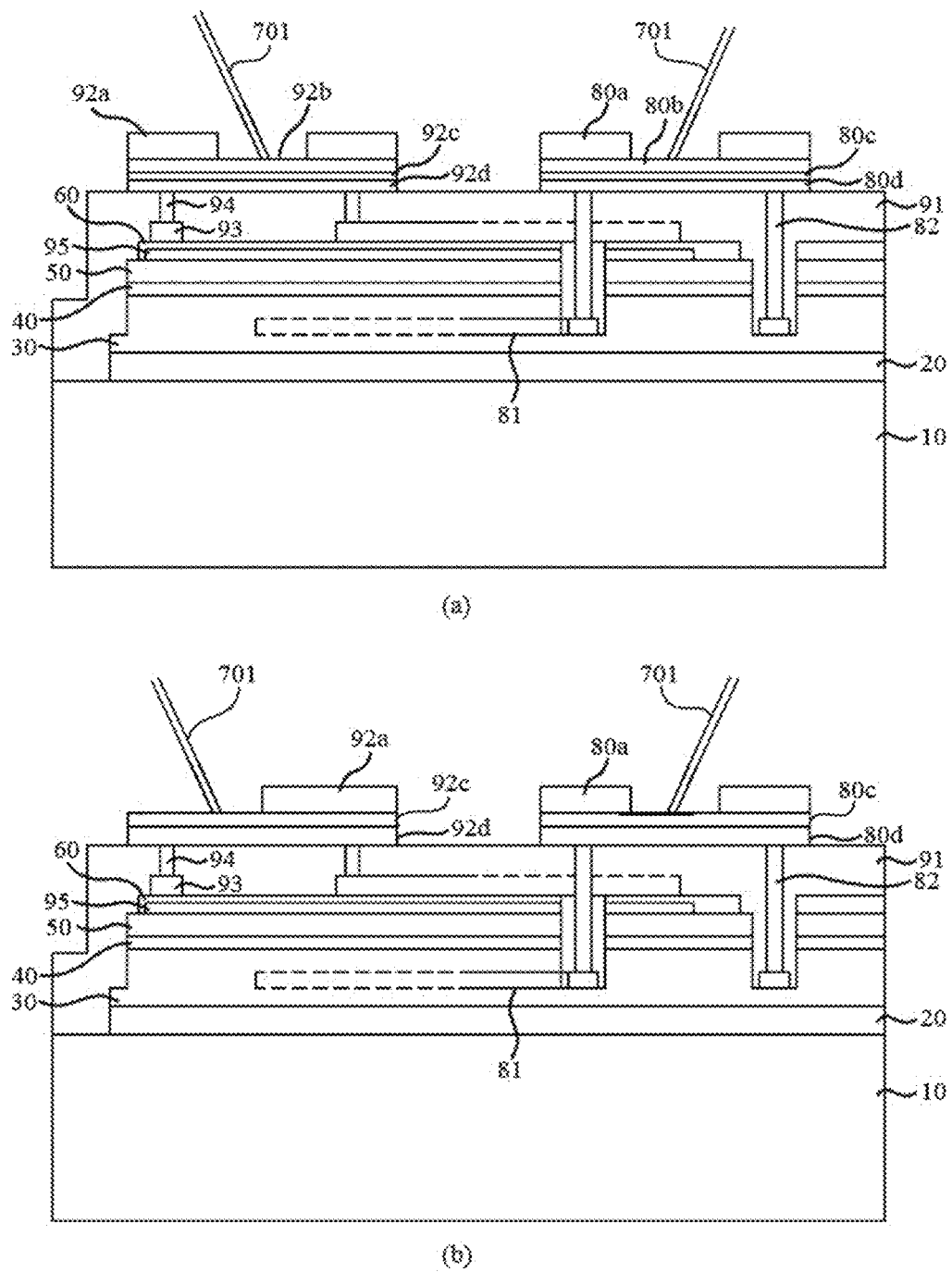

As another alternative shown in FIG. 74, the probe inspection layer 80c in the first electrode 80 may be exposed through the opening 80a-1 in the bonding layer 80a, and the probe inspection layer 92c in the second electrode 92 may be exposed by partly removing the corner of the bonding layer 92a. FIG. 75b illustrates a cross-sectional view taken along C-C line in FIG. 74. As shown, an electrode 80, 92 includes a first layer 80d, 92d (e.g. Cr, Ti or Al), a second layer 80c, 92c (e.g. Ni), and a bonding layer 80a, 92a (e.g. Sn, heat-treated Sn), and the second layer 80c, 92c is exposed through an opening or groove 80a-1, 92a-1 formed in the bonding layer 80a, 92a. A probe 701 is then brought into contact with this second layer 80c, 92c. In this case, therefore, the second layer 80c, 92c becomes a probe inspection layer 80c, 92c. The second layer 80c, 92c may also act as a barrier layer.

Figure 76:
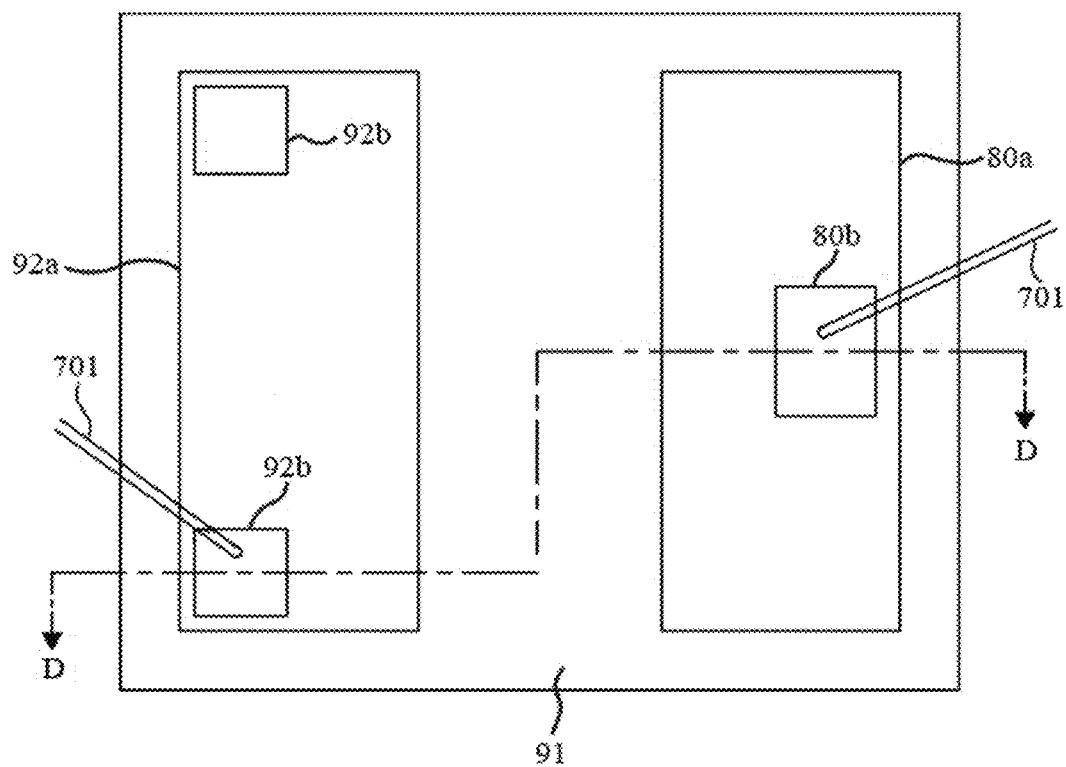
FIG. 76, FIG. 77, and FIG. 78 are schematic views for describing other exemplary embodiments of a semiconductor light emitting device according to the present disclosure.
Figure 77:
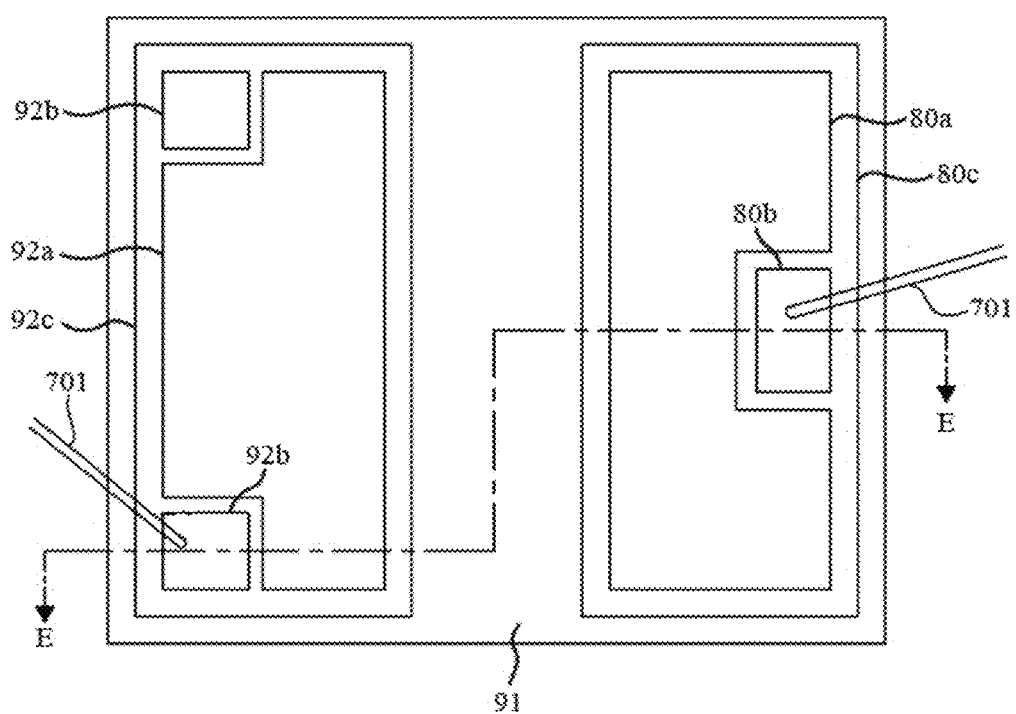
Figure 78:
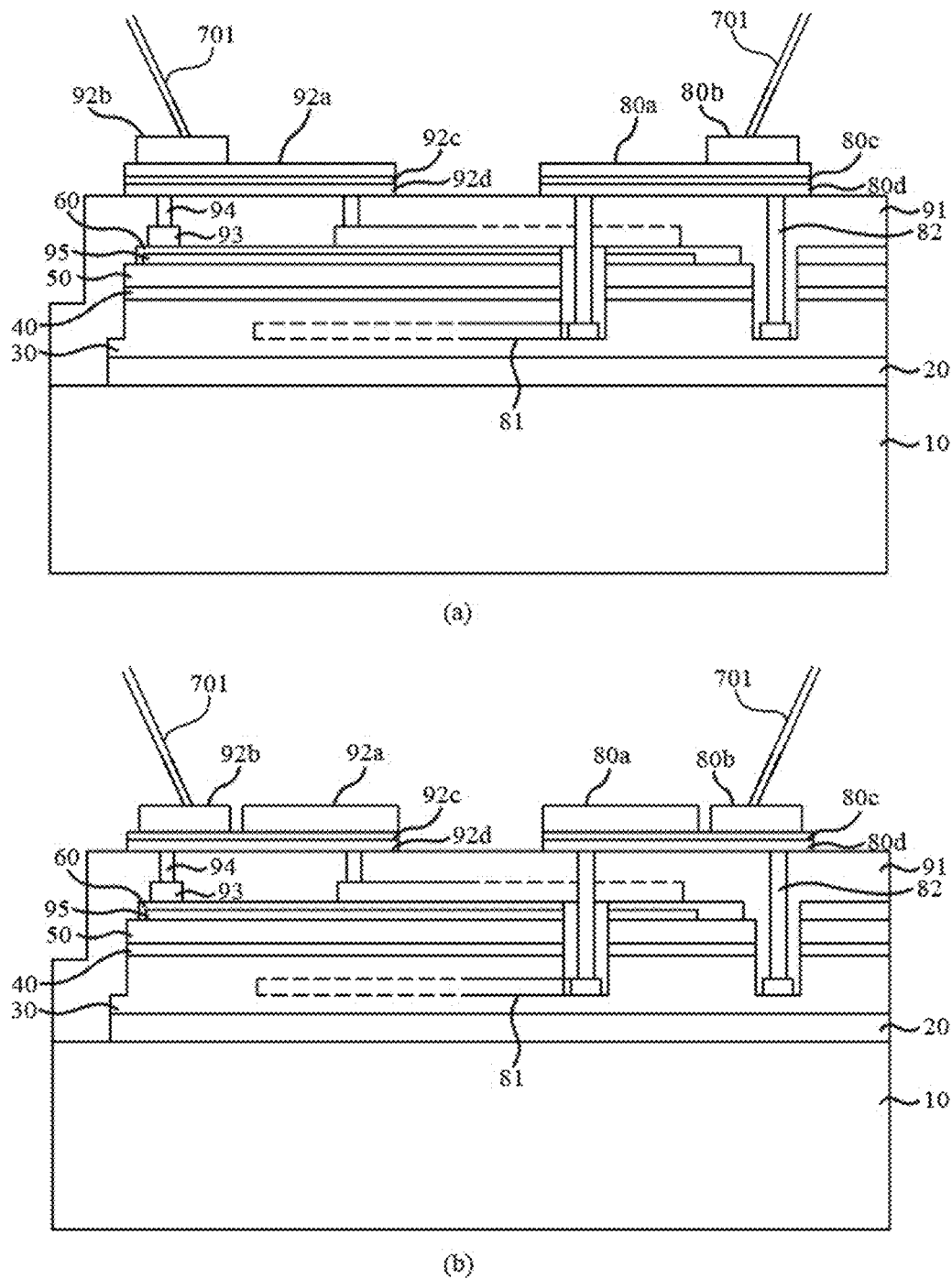

FIG. 76 through FIG. 78 are schematic views for describing other exemplary embodiments of a semiconductor light emitting device according to the present disclosure. FIG. 78a illustrates a cross-sectional view taken along D-D line in FIG. 76. Here, an electrode 80. 92 includes a bonding layer 80a, 92a, and lower layers(s) 80c, 92c, 80d, 92d between a non-conductive reflective film 91 and the bonding layer 80a, 92a. A probe inspection layer 80b, 92b is partly provided on the bonding layer 80a, 92a. The bonding layer 80a, 92a contains Sn or heat-treated Sn, and the probe inspection layer 80b, 92b may be composed of Au. In this way, the bonding strength between the bonding layer 80a, 92a and a solder material is not much affected or degraded, and the probe inspection layer 80b, 92b may be formed in reduced thickness or area.

FIG. 78 illustrates a cross-sectional view taken along E-E line in FIG. 77. As shown, the electrode 80, 92 includes the bonding layer 80a, 92a on the non-conductive reflective film 91, and the lower layer(s) 80c, 92c, 80d, 92d between the non-conductive reflective film 91 and the bonding layer 80a, 92a. At least one of the opening and groove 80a-1, 92a-1 for exposing the lower layer(s) 80c, 92c, 80d, 92d is formed in the bonding layer 80a, 92a, and the probe inspection layer 80b, 92b is formed on an exposed portion of the lower layer 80c, 92c through the at least one of the opening and groove 80a-1, 92a-1 in the bonding layer 80a, 92a. In this case, since the probe inspection layer 80b, 92 is neither interposed between the lower layer 80c, 92c and the bonding layer 80a, 92a, nor formed on the bonding layer 80a, 92, a greater number of options is available for selecting materials needed.

The following describes various exemplary embodiments of the present disclosure.

(1) A semiconductor light emitting device characterized by comprising: a plurality of semiconductor layers, which includes a first semiconductor layer having a first conductivity type, a second semiconductor layer having a second conductivity type different from the first conductivity type, and an active layer interpositioned between the first and second semiconductor layers and adapted to generate light by electron-hole recombination; a first non-conductive reflective film provided on the plurality of semiconductor layer to reflect light from the active layer, wherein the first non-conductive reflective film includes multiple layers and has a first incident angle as the Brewster angle; a second non-conductive reflective film formed on the first non-conductive reflective film to reflect light transmitted through the first non-conductive reflective film, wherein the second non-conductive reflective film includes multiple layers, with part of which being made of a different material from the first non-conductive reflective film, and has a second incident angle as the Brewster angle, different from the first incident angle; and an electrode electrically connected to one of the plurality of semiconductor layers.

(2) The semiconductor light emitting device of (1), characterized in that the second non-conductive reflective film has a higher reflectance than the first non-conductive reflective film at the first incident angle.

(3) The semiconductor light emitting device of (1), characterized in that the first non-conductive reflective film has a higher reflectance than the second non-conductive reflective film at the second incident angle.

(4) The semiconductor light emitting device of (1), characterized in that the second non-conductive film shows a higher reflectance at the Brewster angle of the first non-conductive reflective film than at other angles.

(5) The semiconductor light emitting device of (1), characterized in that the first non-conductive reflective film and the second non-conductive reflective film each comprise one of a DBR (Distributed Bragg Reflector) and an ODR (Omni-Directional Reflector).

(6) The semiconductor light emitting device of (1), characterized in that the multiple layers of the first non-conductive reflective film comprise a stack of alternating first material layer/second material layer pairs, and the multiple layers of the second non-conductive reflective film comprise a stack of alternating third material layer/fourth material layer pairs, wherein at least one of the third material layer and the fourth material layer is made of a different material from the first material layer and the second material layer.

(7) The semiconductor light emitting device of (1), characterized in that the first and second material layers comprise different materials selected from $SiO_2$, $TiO_2$, $Ta_2O_2$, HfO, ZrO and SiN, and the third and fourth material layers comprise different materials selected from $TiO_2$, $Ta_2O_5$, HfO, ZrO and SiN.

(8) The semiconductor light emitting device of (1), characterized in that the first material layer/second material layer pair comprises $SiO_2/TiO_2$ to form a first insulating reflective layer, and the third material layer/fourth material layer pair comprises $TiO_2/Ta_2O_5$ to form a second insulating reflective layer.

(9) The semiconductor light emitting device of (1), characterized by further comprising: a light transmitting conductive film interposed between the second semiconductor layer and the first non-conductive reflective film; a dielectric film interposed between the light transmitting conductive film and the first non-conductive reflective film; a clad layer formed on the second non-conductive reflective film; an additional electrode formed on the clad layer, with the additional electrode being at a distance apart from the other electrodes formed on the clad layer; a first electrical connection passing through the first non-conductive reflective film and the second non-conductive reflective film to electrically communicate the electrodes and the first semiconductor layer; and a second electrical connection passing through the first non-conductive reflective film and the second non-conductive reflective film to electrically communicate the additional electrode and the light transmitting conductive film.

(10) The semiconductor light emitting device of (1), characterized in that the first non-conductive reflective film has an effective refractive index greater than a refractive index of the dielectric film, and the second non-conductive reflective film has an effective refractive index greater than a refractive index of the clad layer.

(11) A semiconductor light emitting device characterized by comprising: a base; a plurality of semiconductor layers arranged on the base, wherein the plurality of semiconductor layers includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; an electrode electrically connected to one of the plurality of semiconductor layers for supplying electrons or holes to the semiconductor layers; a first non-conductive reflective film provided between the base and the plurality of semiconductor layers and adapted to reflect light from the active layer, wherein the first non-conductive reflective film has multiple layers; and a second non-conductive reflective film provided between the base and the first non-conductive reflective film and adapted to reflect light having passed through the first non-conductive reflective film, wherein the second non-conductive reflective film has multiple layers, with part of which being made of a different material from the first non-conductive reflective film.

(12) The semiconductor light emitting device of (11), characterized by further comprising a substrate arranged between the plurality of semiconductor layers and the first non-conductive reflective film, for allowing the plurality of semiconductor layers to grown thereon, wherein the first non-conductive reflective film forms an integrated body with the substrate, and the second non-conductive reflective film forms an integrated body with the first non-conductive reflective film.

(13) The semiconductor light emitting device of (11), characterized by further comprising a bonding layer interposed between the base and the second non-conductive reflective film.

(14) The semiconductor light emitting device of (11), characterized in that the base is a metal frame, and the bonding layer is made of a metal.

(15) The semiconductor light emitting device of (11), characterized in that the second non-conductive film shows a higher reflectance at the Brewster angle of the first non-conductive reflective film than at other angles.

(16) The semiconductor light emitting device of (11), characterized in that the first non-conductive reflective film and the second non-conductive reflective film each comprise one of a DBR (Distributed Bragg Reflector) and an ODR (Omni-Directional Reflector).

(17) The semiconductor light emitting device of (11), characterized in that the multiple layers of the first non-conductive reflective film comprise a stack of alternating first material layer/second material layer pairs, and the multiple layers of the second non-conductive reflective film comprise a stack of alternating third material layer/fourth material layer pairs, wherein at least one of the third material layer and the fourth material layer is made of a different material from the first material layer and the second material layer.

(18) The semiconductor light emitting device of (11), characterized in that the first and second material layers comprise different materials selected from $SiO_2$, $TiO_2$, $Ta_2O_2$, HfO, ZrO and SiN, and the third and fourth material layers comprise different materials selected from $TiO_2$, $Ta_2O_5$, HfO, ZrO and SiN.

(19) The semiconductor light emitting device of (11), characterized in that the first material layer/second material layer pair comprises $SiO_2/TiO_2$ to form a first insulating reflective layer, and the third material layer/fourth material layer pair comprises $TiO_2/Ta_2O_5$ to form a second insulating reflective layer.

(20) The semiconductor light emitting device of (11), characterized by further comprising an additional electrode for supplying holes or electrons, wherein the electrode (a second electrode or a p-side electrode) is wire bonded to the base, and the additional electrode (a first electrode or an n-side electrode) is wire bonded to an additional base.

(21) The semiconductor light emitting device of (11), characterized by further comprising: a substrate arranged opposite to the first non-conductive reflective film with respect to the plurality of semiconductor layers; an additional electrode adapted to pass through the substrate, wherein the additional electrode supplies, to the first semiconductor layer, electrons if the electrode supplied holes, or holes if the electrode supplied electrons; an additional base (a second base) electrically isolated from the base, wherein the electrode (the second electrode) is provided between the base and the second non-conductive reflective film, with the electrode forming an integrated body with the second non-conductive reflective film and being bonded to the base, and passes through the first and second non-conductive reflective films to be in electrical communication with the second semiconductor layer; and the additional electrode is wire bonded to the additional base (the second base).

(22) A semiconductor light emitting device subjected to a strike from an ejection needle during handling, characterized by comprising: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; a first electrode, which is electrically connected to the first semiconductor layer and supplies electrons or holes to the first semiconductor layer; a second electrode, which is electrically connected to the second semiconductor layer and supplies, to the second semiconductor layer, holes if the first electrode supplied electrons, or electrons if the first electrode supplied holes; and an extendable electrode being stretched above the plurality of semiconductor layers and electrically connected to the second electrode, wherein the extendable electrode is designed to bypass to avoid an impact area subjected to a strike from the ejection needle.

(23) The semiconductor light emitting device of (22), characterized in that the impact area, as seen in a top view, is located at the center of the semiconductor light emitting device and has a larger area than a longitudinal cross-section of the ejection needle.

(24) The semiconductor light emitting device of (22), characterized in that the extendable electrode comprises: a first finger configured to stretch on the second semiconductor layer; a second finger configured to stretch on the second semiconductor layer; and a third finger configured to avoid the impact area, wherein the third finger connects the first finger and the second finger.

(25) The semiconductor light emitting device of (22), characterized in that the extendable electrode, as seen in a top view, has an annular shape, and comprises an annular finger configured to accommodate the impact area therein; and a linear finger stretching out from the annular finger.

(26) The semiconductor light emitting device of (22), characterized in that the extendable electrode comprises a first finger configured to climb up from lateral faces onto edges of the plurality of semiconductor layers; and a second finger configured to bypass from the first finger to avoid the impact area.

(27) The semiconductor light emitting device of (22), characterized in that the extendable electrode, as seen in a top view, has a quadrangular shape, and the impact area is located at the point of intersection of two diagonal lines of the quadrangle, and the semiconductor light emitting device further comprises an insulating reflective film provided on the plurality of semiconductor layers to reflect light from the active layer and configured to cover the extendable electrode.

(28) The semiconductor light emitting device of (22), characterized by further comprising an additional extendable electrode on an etched exposed portion of the first semiconductor layer, with the additional extendable electrode stretching from below the first electrode to below the second electrode, wherein the first electrode and the second electrode are arranged opposite to each other on the insulating reflective film; and the extendable electrode comprises an annular finger interposed between the second semiconductor layer and the insulating reflective film and adapted to surround the impact area, a first linear finger stretching from the annular finger down below the first electrode, and a second linear finger stretching from the annular finger down below the second electrode.

(29) The semiconductor light emitting device of (22), characterized by further comprising a plurality of light-emitting cells, with each cell including a plurality of semiconductor layers, wherein the plurality of light-emitting cells includes a central light-emitting cell in which the impact area is located; and at least one peripheral light-emitting cell located about the central light-emitting cell.

(30) The semiconductor light emitting device of (22), characterized in that the extendable electrode comprises a first finger configured to climb up from lateral faces onto edges of the plurality of semiconductor layers of the central light-emitting cell; and a second finger configured to stretch from the first finger to avoid the impact area.

(31) The semiconductor light emitting device of (22), characterized by further comprising a center connecting electrode adapted to electrically connect a first semiconductor layer of the central light-emitting cell and a second semiconductor layer of the peripheral light-emitting cell opposite to the first finger, wherein the at least one peripheral light-emitting cell is configured to surround the central light-emitting cell, the first finger is electrically connected to a first semiconductor layer of the peripheral light-emitting cell on the side of the first finger, and the second finger is electrically connected to a second semiconductor layer of the central light-emitting cell.

(32) The semiconductor light emitting device of (22), characterized by comprising a plurality of light-emitting cells, each of which including a plurality of semiconductor layers, wherein the impact area is located in between and across two light-emitting cells, and the extendable electrode comprises: a first finger electrically connected to a plurality of semiconductor layers of one of the two light-emitting cells; a second finger electrically connected to a plurality of semiconductor layers of the other of the two light-emitting cells; and a third finger interposed between the two light-emitting cells to connect the first finger and the second finger and configured to avoid the impact area.

(33) A semiconductor light emitting device characterized by comprising: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; an external electrode, which is adapted to be in electrical communication with one of the first and second semiconductor layers and has an opening through which the plurality of semiconductor layers is exposed, thereby forming a closed loop; an internal electrode, which is formed inside the opening and adapted to be in electrical communication with the other of the first and second semiconductor layers; an insulating layer adapted to cover the external electrode and the internal electrode; a first electrode, which is provided on the insulating layer and supplies electrons to the first semiconductor layer through one of the external and internal electrodes; and a second electrode, which is provided on the insulating layer and supplies holes to the second semiconductor layer through the other of the external and internal electrodes, wherein at least one of the external and internal electrodes is a reflective electrode to reflect light from the active layer.

(34) The semiconductor light emitting device of (33), characterized by further comprising an electrical connection adapted to transfer current having the same polarity as the internal electrode from outside the external electrode.

(35) The semiconductor light emitting device of (33), characterized in that the external electrode is a reflective electrode provided on the second semiconductor layer, and the internal electrode inside an opening of the external electrode is configured to stretch from below the first electrode to below the second electrode, on an etched portion of the first semiconductor layer.

(36) The semiconductor light emitting device of (33), characterized in that the internal electrode is a reflective electrode provided on the second semiconductor layer, and the external electrode is provided on a portion of the first semiconductor layer that is etched along edges of the plurality of semiconductor layers.

(37) The semiconductor light emitting device of (33), characterized by further comprising: a first electrical connection adapted to pass through the insulating layer to electrically connect the first electrode and the internal electrode; and a second electrical connection adapted to pass through the insulating layer to electrically connect the second electrode and the external electrode.

(38) The semiconductor light emitting device of (33), characterized in that the external electrode is a reflective electrode provided on the second semiconductor layer, the internal electrode inside an opening of the external electrode is configured to stretch from below the first electrode to below the second electrode, on an exposed portion of the first semiconductor layer, and the semiconductor light emitting device further comprises an internal, first electrical connection adapted to pass through the insulating layer to electrically connect the first electrode and the internal electrode; a second electrical connection adapted to pass through the insulating layer to electrically connect the second electrode and the external electrode; and an external, first electrical connection adapted to pass through the insulating layer from outside the external electrode to electrically connect the first electrode and the first semiconductor layer.

(39) The semiconductor light emitting device of (33), characterized in that the first electrode and the second electrode are provided on the insulating layer opposite to each other, the plurality of semiconductor layers includes a plurality of corners, and the external, first electrical connection is provided on each of two corners adjacent to the first electrode.

(40) The semiconductor light emitting device of (33), characterized in that the internal electrode comprises a finger configured to stretch from below the first electrode to below the second electrode; and a contact arranged on one end of the finger, with the contact being connected with the internal, first electrical connection.

(41) The semiconductor light emitting device of (33), characterized in that the external electrode covers the opening, the external, first electrical connection, and the second semiconductor layer except for the margin from the edges of the plurality of semiconductor layers.

(42) The semiconductor light emitting device of (33), characterized in that the insulating layer is a reflective film.

(43) A semiconductor light emitting device adapted to be bonded to an external electrode and inspected by a probe, characterized by comprising: a plurality of semiconductor layers, which includes a first semiconductor layer having a first conductivity type, a second semiconductor layer having a second conductivity type different from the first conductivity type, and an active layer interposed between the first semiconductor layer and the second semiconductor layer and adapted to generate light by electron-hole recombination; and an electrode adapted to supply electrons or holes to the plurality of semiconductor layers, wherein the electrode includes a bonding layer to be bonded to the external electrode, and a probe inspection layer with at least a portion thereof being exposed from the bonding layer as seen in a top view.

(44) The semiconductor light emitting device of (43), characterized in that the probe contact layer is made of a more rigid material than the bonding layer.

(45) The semiconductor light emitting device of (43), characterized by further comprising a non-conductive reflective film provided on the plurality of semiconductor layers to reflect light from the active layer, wherein the bonding layer is arranged on the non-conductive reflective film, and the probe contact layer is interposed between the non-conductive reflective film and the bonding layer.

(46) The semiconductor light emitting device of (43), characterized in that the bonding layer, as seen in a top view, has at least one of an opening and a groove formed therein, and the probe contact layer is located in correspondence to the opening or groove formed in the bonding layer.

(47) The semiconductor light emitting device of (43), characterized in that the bonding layer contains at least one of Sn, Pb, Ag, Bi, In, Sb, Cd and Cu, and the probe inspection layer contains at least one of Au, Pt, Ag, Ti, Ni, Al, Cu and Cr.

(48) The semiconductor light emitting device of (43), characterized by further comprising: a non-conductive reflective film which is provided on the plurality of semiconductor layers to reflect light from the active layer, wherein the electrode includes a lower layer between the non-conductive reflective film and the bonding layer, and the probe inspection layer is arranged between the bonding layer and the lower layer, with the bonding layer having at least one of an opening and a groove to expose the probe inspection layer therethrough.

(49) The semiconductor light emitting device of (43), characterized in that the lower layer comprises: a first layer including at least one of a contact layer and a light reflective layer to be arranged between the non-conductive reflective layer and the probe inspection layer; and a second layer interposed between the first layer and the probe inspection layer and adapted to act as a barrier layer between the first layer and the probe inspection layer.

(50) The semiconductor light emitting device of (43), characterized by further comprising a non-conductive reflective film provided on the plurality of semiconductor layers to reflect light from the active layer, wherein the electrode includes a lower layer between the non-conductive reflective film and the bonding layer, with the bonding layer having at least one of an opening and a groove to expose the lower layer therethrough, and the probe inspection layer is formed on an exposed portion of the lower layer through at least one of the opening and groove of the bonding layer.

(51) The semiconductor light emitting device of (43), characterized by further comprising a non-conductive reflective film provided on the plurality of semiconductor layers to reflect light from the active layer, wherein the electrode includes a lower layer between the non-conductive reflective film and the bonding layer, and the probe inspection layer is partly formed on the bonding layer.

(52) The semiconductor light emitting device of (43), characterized by further comprising: a non-conductive reflective film provided on the plurality of semiconductor layers to reflect light from the active layer; an additional electrode provided on the non-conductive reflective film on which the electrode is also arranged, wherein the additional electrode, similar to the electrode, is adapted to supply electrons or holes and includes a bonding layer and a probe inspection layer; and a second electrical connection adapted to pass through the non-conductive reflective film to electrically connect the additional electrode and the second semiconductor layer.

An exemplary semiconductor light emitting device according to the present disclosure employs a non-conductive film or a non-conductive reflective film in place of a metallic reflective film, such that light loss due to light absorption by the metallic reflective film can be reduced.

Another exemplary semiconductor light emitting device according to the present disclosure employs two non-conductive reflective films having different Brewster angles from each other, such that light leakage can be reduced and brightness of the semiconductor light emitting device can be enhanced.

Another exemplary semiconductor light emitting device according to the present disclosure features a reduced light loss due to absorption, and suits for high-current operations.

Another exemplary semiconductor light emitting device according to the present disclosure is designed in such a way that microscale structures (e.g. a finger electrode) therein may be protected from an impact induced by an ejection needle.

Another exemplary semiconductor light emitting device according to the present disclosure is built to be more resistant to current crowding or ESD-induced damages.

Another exemplary semiconductor light emitting device according to the present disclosure has an electrode structure featuring an enhanced bonding strength towards an external electrode and an improved electrical contact stability.

What is claimed is:

1. A semiconductor light emitting device comprising:
a plurality of semiconductor layers, which includes a first semiconductor layer having a first conductivity type, a second semiconductor layer having a second conductivity type different from the first conductivity type, and an active layer interpositioned between the first and second semiconductor layers and adapted to generate light by electron-hole recombination;
a first non-conductive reflective film formed on the plurality of semiconductor layer to reflect light from the active layer, wherein the first non-conductive reflective film includes multiple layers and has a first incident angle as the Brewster angle;
a second non-conductive reflective film formed on the first non-conductive reflective film to reflect light transmitted through the first non-conductive reflective film, wherein the second non-conductive reflective film includes multiple layers, with part of the second non-conductive reflective film made of a different material from the first non-conductive reflective film, and the second non-conductive reflective film has a second incident angle as the Brewster angle, the second incident angle different from the first incident angle; and
an electrode electrically connected to one of the plurality of semiconductor layers;
wherein the second non-conductive film has a higher reflectance at the Brewster angle of the first non-conductive reflective film than at other angles.

2. The semiconductor light emitting device according to claim 1, wherein the first non-conductive reflective film and the second non-conductive reflective film each comprise one of a DBR (Distributed Bragg Reflector) and an ODR (Omni-Directional Reflector).

3. The semiconductor light emitting device according to claim 1, wherein the multiple layers of the first non-conductive reflective film comprise a stack of alternating first material layer/second material layer pairs, and
the multiple layers of the second non-conductive reflective film comprise a stack of alternating third material layer/fourth material layer pairs, wherein at least one of the third material layer and the fourth material layer is made of a different material from the first material layer and the second material layer.

4. The semiconductor light emitting device according to claim 3, wherein the first and second material layers comprise different materials selected from $SiO_2$, $TiO_2$, $Ta_2O_2$, HfO, ZrO and SiN, and the third and fourth material layers comprise different materials selected from $TiO_2$, $Ta_2O_5$, HfO, ZrO and SiN.

5. The semiconductor light emitting device according to claim 3, wherein the first material layer/second material layer pair comprises $SiO_2/TiO_2$ to form a first insulating reflective layer, and the third material layer/fourth material layer pair comprises $TiO_2/Ta_2O_5$ to form a second insulating reflective layer.

* * * * *